US012755697B2

(12) United States Patent
Okamoto et al.

(10) Patent No.: US 12,755,697 B2
(45) Date of Patent: Oct. 6, 2026

(54) SEMICONDUCTOR DEVICE AND METHOD FOR DRIVING SEMICONDUCTOR DEVICE

(71) Applicant: Semiconductor Energy Laboratory Co., Ltd., Atsugi (JP)

(72) Inventors: Yuki Okamoto, Ebina (JP); Tatsuya Onuki, Atsugi (JP); Hidetomo Kobayashi, Isehara (JP); Munehiro Kozuma, Atsugi (JP); Takanori Matsuzaki, Atsugi (JP); Susumu Kawashima, Atsugi (JP); Yutaka Okazaki, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 19/021,338

(22) Filed: Jan. 15, 2025

(65) Prior Publication Data

US 2025/0157404 A1 May 15, 2025

Related U.S. Application Data

(63) Continuation of application No. 18/569,779, filed as application No. PCT/IB2022/055813 on Jun. 23, 2022, now Pat. No. 12,223,904.

(30) Foreign Application Priority Data

Jun. 30, 2021 (JP) ................................ 2021-109460
Jul. 20, 2021 (JP) ................................ 2021-119945
Nov. 30, 2021 (JP) ................................ 2021-194338

(51) Int. Cl.
*G09G 3/3233* (2016.01)
*H10D 84/83* (2025.01)
(Continued)

(52) U.S. Cl.
CPC ........... *G09G 3/3233* (2013.01); *H10D 84/83* (2025.01); *H10D 86/423* (2025.01); *H10D 86/60* (2025.01);
(Continued)

(58) Field of Classification Search
CPC ...... G09G 3/32; G09G 3/3233; G09G 3/3258; H10D 30/6734
See application file for complete search history.

(56) References Cited

U.S. PATENT DOCUMENTS 7,173,582 B2 2/2007 Nishitoba et al.
7,399,991 B2 7/2008 Seo et al.
(Continued)

FOREIGN PATENT DOCUMENTS

CN 101908309 A 12/2010
CN 103035188 A 4/2013
(Continued)

OTHER PUBLICATIONS

International Search Report (Application No. PCT/IB2022/055813) Dated Sep. 27, 2022.
(Continued)

*Primary Examiner* — Kevin M Nguyen
(74) *Attorney, Agent, or Firm* — Eric J. Robinson; Robinson Intellectual Property Law Office, P.C.

(57) ABSTRACT

The invention of the application is the invention regarding a semiconductor device and a method for driving the semiconductor device. The semiconductor device includes first and second transistors, first to fifth switches, first to third capacitors, and a display element. The first transistor (M2) comprises a back gate, a gate of the first transistor is electrically connected to the first switch (M1), the second switch (M3) and the first capacitor (C1) are positioned between the gate of the first transistor and a source of the
(Continued)

first transistor, the back gate of the first transistor is electrically connected to the third switch (M4), the second capacitor (C2) is positioned between the back gate of the first transistor and the source of the first transistor, the source of the first transistor is electrically connected to the fourth switch (M6) and a drain of the second transistor (M5), a gate of the second transistor is electrically connected to the fifth switch (M7), the third capacitor (C3) is positioned between the gate of the second transistor and a source of the second transistor, and the source of the second transistor is electrically connected to the display element (61).

17 Claims, 54 Drawing Sheets

(51) Int. Cl.
*H10D 86/40* (2025.01)
*H10D 86/60* (2025.01)

(52) U.S. Cl.
CPC ............... *G09G 2300/0426* (2013.01); *G09G 2300/0852* (2013.01); *G09G 2330/021* (2013.01)

(56) References Cited

U.S. PATENT DOCUMENTS

| | | | | |
|---|---|---|---|---|
| 7,663,149 | B2 | 2/2010 | Seo et al. | |
| 9,230,996 | B2 | 1/2016 | Miyake et al. | |
| 9,536,904 | B2 | 1/2017 | Miyake et al. | |
| 9,786,690 | B2 | 10/2017 | Miyake et al. | |
| 9,853,068 | B2 | 12/2017 | Miyake | |
| 10,453,873 | B2 | 10/2019 | Miyake | |
| 10,777,124 | B1 * | 9/2020 | Chen | G09G 3/3233 |
| 11,417,273 | B2 | 8/2022 | Toyotaka et al. | |
| 11,664,391 | B2 | 5/2023 | Miyake | |
| 12,223,904 | B2 | 2/2025 | Okamoto et al. | |
| 2005/0174307 | A1 | 8/2005 | Nishitoba et al. | |
| 2010/0309174 | A1 | 12/2010 | Tomida et al. | |
| 2011/0148847 | A1 | 6/2011 | Ikeda | |
| 2013/0083000 | A1 | 4/2013 | Toyomura et al. | |
| 2015/0171156 | A1 | 6/2015 | Miyake | |
| 2016/0171930 | A1 | 6/2016 | Song et al. | |
| 2020/0118494 | A1 * | 4/2020 | Park | G09G 3/3258 |
| 2020/0135091 | A1 | 4/2020 | Kim | |
| 2020/0294449 | A1 | 9/2020 | Wang et al. | |
| 2020/0320930 | A1 | 10/2020 | Toyotaka et al. | |
| 2021/0011347 | A1 | 1/2021 | Kawashima et al. | |
| 2021/0151539 | A1 | 5/2021 | Yun et al. | |
| 2021/0217891 | A1 * | 7/2021 | Kobayashi | H10B 12/0335 |
| 2021/0407381 | A1 | 12/2021 | Park et al. | |
| 2023/0261010 | A1 | 8/2023 | Miyake | |

FOREIGN PATENT DOCUMENTS

| | | | |
|---|---|---|---|
| CN | 110100275 | A | 8/2019 |
| CN | 111199705 | A | 5/2020 |
| CN | 111406280 | A | 7/2020 |
| CN | 111916027 | A | 11/2020 |
| DE | 102014225248 | | 7/2015 |
| JP | 2002-324673 | A | 11/2002 |
| JP | 2004-069816 | A | 3/2004 |
| JP | 2010-281914 | A | 12/2010 |
| JP | 2013-076811 | A | 4/2013 |
| JP | 2015-132816 | A | 7/2015 |
| KR | 2015-0068909 | A | 6/2015 |
| KR | 2016-0070642 | A | 6/2016 |
| KR | 2020-0048652 | A | 5/2020 |
| KR | 2020-0096237 | A | 8/2020 |
| TW | 201528240 | | 7/2015 |
| TW | 201901649 | | 1/2019 |
| WO | WO-2004/013834 | | 2/2004 |
| WO | WO-2015/097595 | | 7/2015 |
| WO | WO-2019/111137 | | 6/2019 |
| WO | WO-2020/186396 | | 9/2020 |

OTHER PUBLICATIONS

Written Opinion (Application No. PCT/IB2022/055813) Dated Sep. 27, 2022.

Taiwanese Office Action (Application No. 111123728) Dated Mar. 9, 2026.

* cited by examiner

FIG. 38A
Intermediate state
New crystalline phase
| Amorphous | Crystalline | Crystal |
|---|---|---|
| ・completely amorphous | ・CAAC<br>・nc<br>・CAC<br>excluding single crystal and poly crystal | ・single crystal<br>・poly crystal |
FIG. 38B
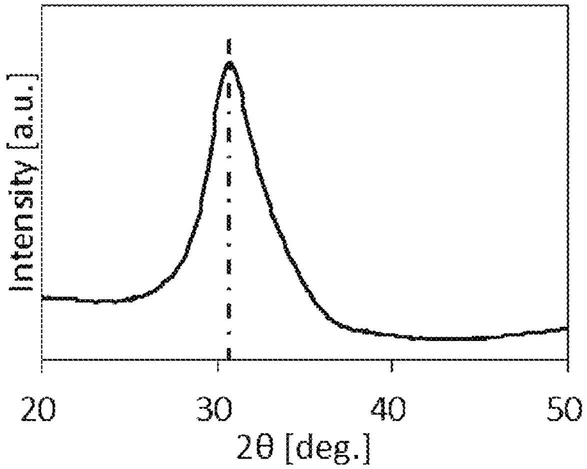
FIG. 38C
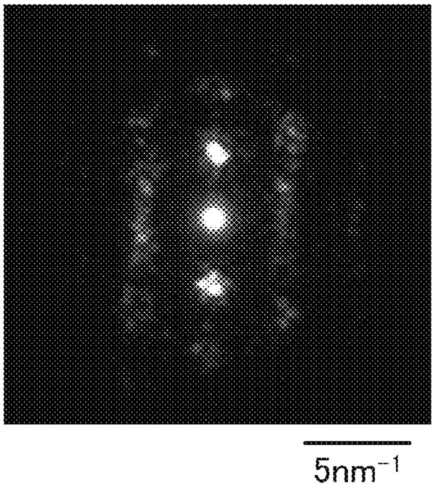

FIG. 43

P01 Form trench (depression portion) shape. (Back gate trench etching)

P02 Deposit back gate metal (BGE) and planarize it by CMP (Chemical Mechanical Polishing).

P03 Deposit back gate insulating film.

P04 Deposit active layer (IGZO) and S/D metal and form island shape.

P05 Deposit insulating film and planarize it by CMP.

P06 Form trench shape. (Top gate trench etching)

P07 Deposit top gate insulating film (GI).

P08 Deposit top gate metal (TGE) and planarize it by CMP.

P09 Deposit passivation film (protective film), deposit interlayer insulating film, form via (contact), and form wiring.

871

SEMICONDUCTOR DEVICE AND METHOD FOR DRIVING SEMICONDUCTOR DEVICE

TECHNICAL FIELD

One embodiment of the present invention relates to a semiconductor device and a method for driving the semiconductor device.

Note that one embodiment of the present invention is not limited to the above technical field. Examples of the technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof.

In this specification and the like, a semiconductor device refers to a device that utilizes semiconductor characteristics, and means a circuit including a semiconductor element (e.g., a transistor, a diode, or a photodiode) or a device including the circuit, for example. The semiconductor device also means all devices that can function by utilizing semiconductor characteristics. For example, an integrated circuit, a chip including an integrated circuit, and an electronic component including a chip in a package are examples of the semiconductor device. Moreover, for example, a memory device, a display apparatus, a light-emitting apparatus, a lighting device, an electronic device, and the like themselves may be semiconductor devices and may each include a semiconductor device.

BACKGROUND ART

For example, display apparatuses applicable for XR such as VR (virtual reality) or AR (augmented reality) have been required. Specifically, such display apparatuses have been desired to have a high resolution, high color reproducibility, and the like, for example, so as to offer enhanced realistic feeling and an enhanced sense of immersion, for example.

Examples of devices applicable to such display apparatuses include a liquid crystal display apparatus and a light-emitting apparatus including a light-emitting element such as organic EL (Electro Luminescence) element or a light-emitting diode (LED).

For example, the basic structure of an organic EL element is a structure where a layer containing a light-emitting organic compound is provided between a pair of electrodes. By voltage application to this element, light emission can be obtained from the light-emitting organic compound. A display apparatus using such an organic EL element does not need a backlight that is necessary for a liquid crystal display apparatus or the like, for example; thus, a thin, lightweight, high-contrast, and low-power-consumption display apparatus can be achieved. Since the response speed of the organic EL element is high, a display apparatus suitable for displaying a fast-moving image can be achieved. Patent Document 1, for example, discloses an example of a display apparatus using an organic EL element.

Patent Document 2 discloses a circuit structure of a pixel circuit for controlling the emission luminance of an organic EL element, in which a threshold voltage variation between transistors is corrected in each pixel to increase the display quality of a display apparatus.

REFERENCES

Patent Documents

[Patent Document 1] Japanese Published Patent Application No. 2002-324673

[Patent Document 2] Japanese Published Patent Application No. 2015-132816

SUMMARY OF THE INVENTION

Problems to be Solved by the Invention

Meanwhile, a high voltage is sometimes needed for driving an organic EL element, depending on the structure of the organic EL element. Driving such an organic EL element requires a power source for generating a high voltage. A current flowing through an organic EL element is controlled by a driving transistor, for example. Since the driving transistor is provided in each pixel, in the case where the threshold voltage of each driving transistor varies, the display quality of a display apparatus including the organic EL element is lowered in some cases. As a means for increasing the display quality of the display apparatus, a correction period for correcting the threshold voltage variation of the transistor included in each pixel is provided in the driving period of the display apparatus, for example.

An object of one embodiment of the present invention is to provide a downsized semiconductor device or display apparatus. Another object of one embodiment of the present invention is to provide a semiconductor device or display apparatus with high display quality. Another object of one embodiment of the present invention is to provide a semiconductor device or display apparatus in which high color reproducibility is achieved. Another object of one embodiment of the present invention is to provide a high-resolution semiconductor device or display apparatus. Another object of one embodiment of the present invention is to provide a highly reliable semiconductor device or display apparatus. Another object of one embodiment of the present invention is to provide a semiconductor device or display apparatus with reduced power consumption. Another object of one embodiment of the present invention is to provide a novel semiconductor device or display apparatus.

Note that the description of these objects does not preclude the existence of other objects. One embodiment of the present invention does not have to achieve all of these objects. Note that objects other than these can be derived from the description of the specification, the drawings, the claims, and the like.

Means for Solving the Problems (1)

One embodiment of the present invention is a semiconductor device including first and second transistors, first to fifth switches, first to third capacitors, and a display element. The first transistor includes a back gate, a gate of the first transistor is electrically connected to the first switch, the second switch and the first capacitor are positioned between the gate of the first transistor and a source of the first transistor, the back gate of the first transistor is electrically connected to the third switch, the second capacitor is positioned between the back gate of the first transistor and the source of the first transistor, the source of the first transistor is electrically connected to the fourth switch and a drain of the second transistor, a gate of the second transistor is electrically connected to the fifth switch, the third capacitor is positioned between the gate of the second transistor and a source of the second transistor, and the source of the second transistor is electrically connected to the display element.

(2)

In (1) described above, the first switch may be configured to establish or break electrical continuity between a first wiring and the gate of the first transistor, the second switch may be configured to establish or break electrical continuity between the gate of the first transistor and the source of the first transistor, the third switch may be configured to establish or break electrical continuity between a second wiring and the back gate of the first transistor, the fourth switch may be configured to establish or break electrical continuity between a third wiring and the source of the first transistor, and the fifth switch may be configured to establish or break electrical continuity between a fourth wiring and the gate of the second transistor.

(3)

In (1) or (2) described above, each of the first to fifth switches may be a transistor.

(4)

In any one of (1) to (3) described above, at least one of the first transistor and the second transistor is preferably a transistor including a metal oxide in a semiconductor layer where a channel is formed.

(5)

Furthermore, in (4) described above, the metal oxide preferably contains at least one of indium and zinc.

(6)

In any one of (1) to (5) described above, as the display element, an organic EL element having a tandem structure can be used, for example.

(7)

One embodiment of the present invention is a method for driving a semiconductor device including first and second transistors, first to fifth switches, first to third capacitors, and a display element. The first transistor includes a back gate, a gate of the first transistor is electrically connected to the first switch, the second switch and the first capacitor are positioned between the gate of the first transistor and a source of the first transistor, the back gate of the first transistor is electrically connected to the third switch, the second capacitor is positioned between the back gate of the first transistor and the source of the first transistor, the source of the first transistor is electrically connected to the fourth switch and a drain of the second transistor, a gate of the second transistor is electrically connected to the fifth switch, the third capacitor is positioned between the gate of the second transistor and a source of the second transistor, and the source of the second transistor is electrically connected to the display element. The method includes first to fourth processings. In the first processing, a first potential is supplied to the source of the first transistor through the fourth switch and supplied to the gate of the first transistor through the second switch and a second potential higher than the first potential is supplied to the back gate of the first transistor through the third switch. In the second processing, a third potential is supplied to the gate of the first transistor through the first switch and the first potential is supplied to the source of the first transistor through the fourth switch. In the third processing, a potential that brings the second transistor into a conduction state is supplied to the gate of the second transistor through the fifth switch. In the fourth processing, a potential that brings the second transistor into a non-conduction state is supplied to the gate of the second transistor through the fifth switch. The first processing starts after the fourth processing starts. The third processing starts after the fourth processing is finished. The first processing is finished before the third processing starts. The second processing starts after the first processing is finished. The fourth processing starts after the second processing is finished and after the third processing is finished.

(8)

In (7) described above, the first switch may be configured to establish or break electrical continuity between a first wiring and the gate of the first transistor, the second switch may be configured to establish or break electrical continuity between the gate of the first transistor and the source of the first transistor, the third switch may be configured to establish or break electrical continuity between a second wiring and the back gate of the first transistor, the fourth switch may be configured to establish or break electrical continuity between a third wiring and the source of the first transistor, and the fifth switch may be configured to establish or break electrical continuity between a fourth wiring and the gate of the second transistor.

(9)

In (7) or (8) described above, each of the first to fifth switches may be a transistor.

(10)

In any one of (7) to (9) described above, at least one of the first transistor and the second transistor is preferably a transistor including a metal oxide in a semiconductor layer where a channel is formed.

(11)

In (10) described above, the metal oxide preferably contains at least one of indium and zinc.

(12)

In any one of (7) to (11) described above, as the display element, an organic EL element having a tandem structure can be used, for example.

(13)

One embodiment of the present invention is a method for driving a semiconductor device including a transistor, a switch, and a signal line. A source of the transistor is electrically connected to one terminal of the switch. The method includes first to fourth processings. In the first processing, a first potential is supplied to the source of the transistor and a gate of the transistor. In the second processing, the first potential is supplied to the source of the transistor and a potential of the signal line is supplied to the gate of the transistor. In the third processing, the switch is brought into a conduction state. In the fourth processing, the switch is brought into a non-conduction state. The potential of the signal line and the first potential are compared after the fourth processing starts. In the case where the potential of the signal line and the first potential are the same potential, processing of starting the first processing, finishing the first processing before the third processing starts, and starting the second processing after the first processing is finished, is performed. In the case where the potential of the signal line and the first potential are not the same potential, processing of starting the second processing is performed. The third processing starts after the fourth processing is finished. The fourth processing starts after the second processing is finished and after the third processing is finished.

(14)

One embodiment of the present invention is a method for driving a semiconductor device including a transistor, a switch, and a signal line. A source of the transistor is electrically connected to one terminal of the switch. The method includes first to fourth processings. In the first processing, a first potential is supplied to the source of the transistor and a gate of the transistor and a potential that is the same as the first potential is supplied to the signal line. In the second processing, the first potential is supplied to the source of the transistor and the potential of the signal line is supplied to the gate of the transistor. In the third processing, the switch is brought into a conduction state. In the fourth processing, the switch is brought into a non-conduction state. The first processing starts after the fourth processing starts. The first processing is finished before the third processing starts. The second processing starts after the first processing is finished. The third processing starts after the fourth processing is finished. The fourth processing starts after the second processing is finished and after the third processing is finished.

(15)

One embodiment of the present invention is a method for driving a semiconductor device including a transistor, a switch, and a signal line. A source of the transistor is electrically connected to one terminal of the switch. The method includes first to fourth processings. In the first processing, a first potential is supplied to the source of the transistor and a gate of the transistor and the signal line is brought into a floating state. In the second processing, the first potential is supplied to the source of the transistor and a potential of the signal line is supplied to the gate of the transistor. In the third processing, the switch is brought into a conduction state. In the fourth processing, the switch is brought into a non-conduction state. The first processing starts after the fourth processing starts. The first processing is finished before the third processing starts. The second processing starts after the first processing is finished. The third processing starts after the fourth processing is finished. The fourth processing starts after the second processing is finished and after the third processing is finished.

Effect of the Invention

With one embodiment of the present invention, a downsized semiconductor device or display apparatus can be provided. With one embodiment of the present invention, a semiconductor device or display apparatus with high display quality can be provided. With one embodiment of the present invention, a semiconductor device or display apparatus in which high color reproducibility is achieved can be provided. With one embodiment of the present invention, a high-resolution semiconductor device or display apparatus can be provided. With one embodiment of the present invention, a highly reliable semiconductor device or display apparatus can be provided. With one embodiment of the present invention, a semiconductor device or display apparatus with reduced power consumption can be provided. With one embodiment of the present invention, a novel semiconductor device or display apparatus can be provided.

Note that the description of these effects does not preclude the existence of other effects. One embodiment of the present invention does not need to have all of these effects. Note that effects other than these can be derived from the description of the specification, the drawings, the claims, and the like.

BRIEF DESCRIPTION OF THE DRAWINGS

FIG. 38A is a diagram illustrating classification of crystal structures. FIG. 38B is a graph showing an XRD spectrum of a CAAC-IGZO film. FIG. 38C is an image showing a nanobeam electron diffraction pattern of the CAAC-IGZO film.

FIG. 43 is a diagram illustrating a process flow of a transistor.

MODE FOR CARRYING OUT THE INVENTION

Figure 1:
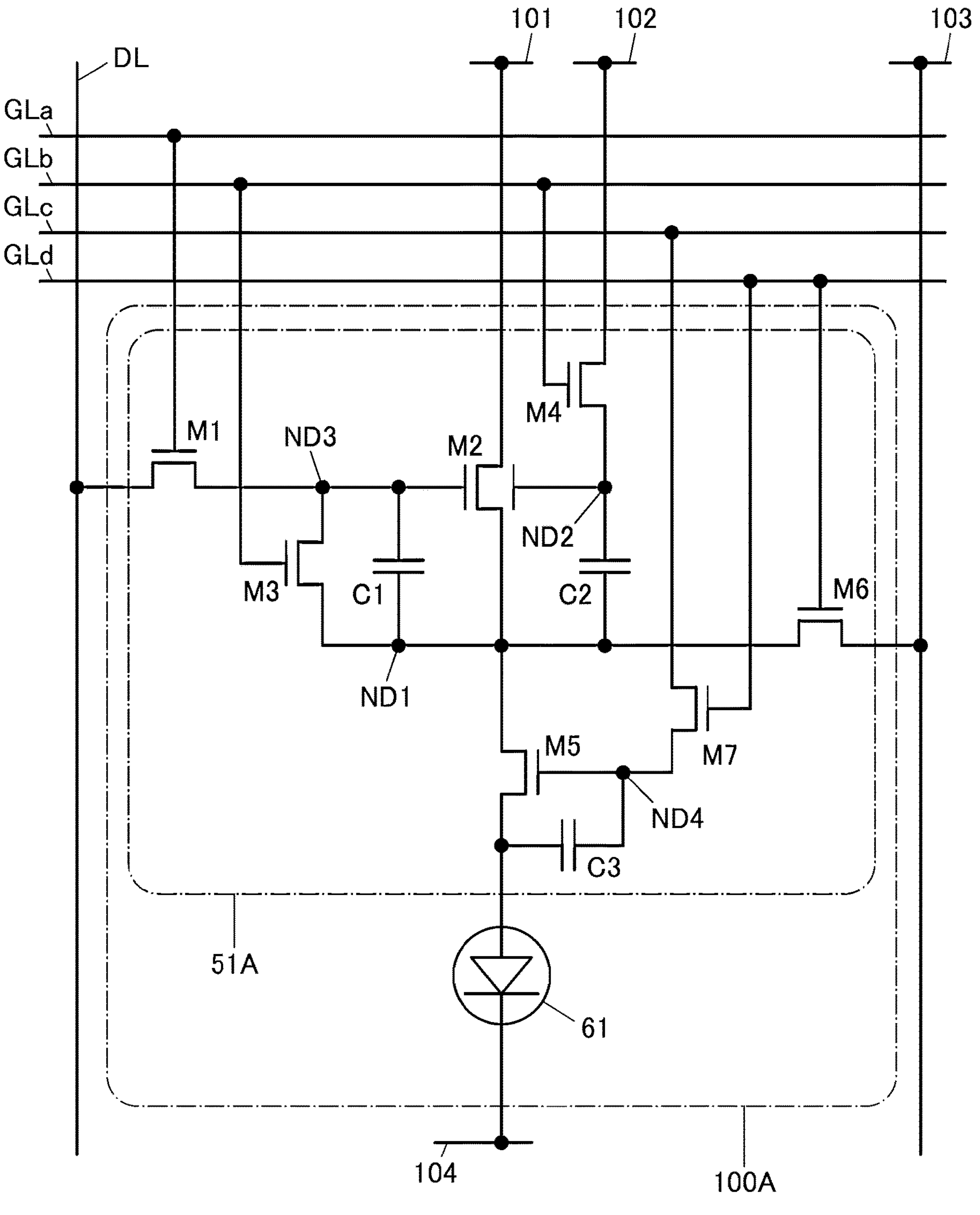
FIG. 1 is a diagram illustrating a semiconductor device.

Embodiments are described below with reference to the drawings. Note that the embodiments can be implemented in many different modes, and it is readily understood by those skilled in the art that modes and details thereof can be changed in various ways without departing from the spirit and scope thereof. Thus, the present invention should not be interpreted as being limited to the following description of the embodiments.

In the case where there is description "X and Y are connected" in this specification and the like, the case where X and Y are electrically connected, the case where X and Y are functionally connected, and the case where X and Y are directly connected are regarded as being disclosed in this specification and the like. Accordingly, without being limited to a predetermined connection relationship, e.g., a connection relationship shown in drawings or texts, a connection relationship other than one shown in drawings or texts is regarded as being disclosed in the drawings or the texts. Each of X and Y denotes an object (e.g., a device, an element, a circuit, a wiring, an electrode, a terminal, a conductive film, or a layer).

For example, in the case where X and Y are electrically connected, one or more elements that allow electrical connection between X and Y (e.g., a switch, a transistor, a capacitor, an inductor, a resistor, a diode, a display device, a light-emitting device, or a load) can be connected between X and Y.

For example, in the case where X and Y are functionally connected, one or more circuits that allow functional connection between X and Y (e.g., a logic circuit (e.g., an inverter, a NAND circuit, a NOR circuit, or the like); a signal converter circuit (e.g., a digital-analog converter circuit, an analog-digital converter circuit, a gamma correction circuit, or the like); a potential level converter circuit (e.g., a power supply circuit (e.g., a step-up circuit, a step-down circuit, or the like), a level shifter circuit for changing the potential level of a signal, or the like); a voltage source; a current source; a switching circuit; an amplifier circuit (e.g., a circuit that can increase signal amplitude, the amount of current, or the like, an operational amplifier, a differential amplifier circuit, a source follower circuit, a buffer circuit, or the like); a signal generation circuit; a memory circuit; a control circuit; or the like) can be connected between X and Y. For instance, even if another circuit is interposed between X and Y, X and Y are regarded as being functionally connected when a signal output from X is transmitted to Y.

Note that an explicit description that X and Y are electrically connected includes the case where X and Y are electrically connected (i.e., the case where X and Y are connected with another element or another circuit interposed therebetween) and the case where X and Y are directly connected (i.e., the case where X and Y are connected without another element or another circuit interposed therebetween).

It can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order". Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order". Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit structure is defined by an expression similar to the above examples, a source (or a first terminal or the like) and a drain (or a second terminal or the like) of a transistor can be distinguished from each other to specify the technical scope. Note that these expressions are examples and the expression is not limited to these expressions. Here, X and Y each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film has functions of both components: the wiring and the electrode. Thus, electrical connection in this specification and the like includes, in its category, such a case where one conductive film has functions of a plurality of components.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" is not limited to only a circuit element that has a pair of electrodes and a dielectric between the electrodes. A "capacitor" includes, for example, parasitic capacitance generated between wirings, gate capacitance generated between a gate and one of a source and a drain of a transistor, and the like. The term "capacitor", "parasitic capacitance", "gate capacitance", or the like can be replaced with the term "capacitance" and the like, for example. Conversely, the term "capacitance" can be replaced with the term "capacitor", "parasitic capacitance", "gate capacitance", or the like, for example. The term "a pair of electrodes" of a "capacitor" can be replaced with "a pair of conductors", "a pair of conductive regions", "a pair of regions", or the like, for example. Note that the electrostatic capacitance value can be higher than or equal to 0.05 fF and lower than or equal to 10 pF, for example. As another example, the electrostatic capacitance value may be higher than or equal to 1 pF and lower than or equal to 10 μF.

In this specification and the like, a transistor includes three terminals called a gate, a source, and a drain. The gate is a control terminal for controlling the amount of current flowing between the source and the drain. Two terminals functioning as the source and the drain are input/output terminals of the transistor. One of the two input/output terminals serves as the source and the other serves as the drain depending on the conductivity type (n-channel type or p-channel type) of the transistor and the levels of potentials supplied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in the description of the connection relationship of a transistor. Depending on the structure, a transistor may include a back gate in addition to the above three terminals. In that case, in this specification and the like, one of the gate and the back gate of the transistor may be referred to as a first gate and the other of the gate and the back gate of the transistor may be referred to as a second gate. Moreover, the terms "gate" and "back gate" can be replaced with each other in one transistor in some cases. In the case where a transistor includes three or more gates, the gates may be referred to as a first gate, a second gate, and a third gate, for example, in this specification and the like.

In this specification and the like, a "node" can be referred to as a "terminal", a "wiring", an "electrode", a "conductive layer", a "conductor", an "impurity region", or the like depending on the circuit structure, the device structure, or the like, for example. Furthermore, a "terminal", a "wiring", or the like can be referred to as a "node", for example.

Ordinal numbers such as "first", "second", and "third" in this specification and the like are used to avoid confusion among components. Thus, the ordinal numbers do not limit the number of components. In addition, the ordinal numbers do not limit the order of components. For example, a "first" component in one embodiment in this specification and the like can be referred to as a "second" component in other embodiments, the scope of claims, or the like. Furthermore, for example, a "first" component in one embodiment in this specification and the like can be omitted in other embodiments, the scope of claims, or the like.

In this specification and the like, for example, terms for describing arrangement, such as "over", "under", "above", and "below" are sometimes used for convenience to describe the positional relationship between components with reference to drawings. The positional relationship between components is changed as appropriate in accordance with a direction in which each component is described. Thus, the terms for describing arrangement in this specification and the like are not limited to those and can be replaced with another term as appropriate depending on the situation. For example, the expression "an insulator positioned over (on) a top surface of a conductor" can be replaced with the expression "an insulator positioned under (on) a bottom surface of a conductor" when the direction of a drawing illustrating these components is rotated by 180°.

The term "over" or "under" does not necessarily mean that a component is placed directly over or directly under and directly in contact with another component. For example, the expression "electrode B over insulating layer A" does not necessarily mean that the electrode B is formed over and in direct contact with the insulating layer A, and does not exclude the case where another component is provided between the insulating layer A and the electrode B.

Furthermore, the term "overlap", for example, in this specification and the like does not limit a state such as the stacking order of components. For example, the expression "electrode B overlapping with insulating layer A" does not necessarily mean the state where the electrode B is formed over the insulating layer A. The expression "electrode B overlapping with insulating layer A", for example, does not exclude the state where the electrode B is formed under the insulating layer A and the state where the electrode B is formed on the right side (or the left side) of the insulating layer A.

The term "adjacent" or "proximity" in this specification and the like does not necessarily mean that a component is directly in contact with another component. For example, the expression "electrode B adjacent to insulating layer A" does not necessarily mean that the electrode B is formed in direct contact with the insulating layer A and does not exclude the case where another component is provided between the insulating layer A and the electrode B.

In this specification and the like, the term "film", "layer", or the like can be, for example, interchanged with each other depending on the situation, in some cases. For example, the term "conductive layer" can be changed into the term "conductive film" in some cases. For another example, the term "insulating film" can be changed into the term "insulating layer" in some cases. Alternatively, for example, the term "film", "layer", or the like is not used and can be interchanged with another term depending on the situation, in some cases. For example, the term "conductive layer" or "conductive film" can be changed into the term "conductor" in some cases. Furthermore, the term "conductor" can be changed into the term "conductive layer" or "conductive film" in some cases. For example, the term "insulating layer" or "insulating film" can be changed into the term "insulator" in some cases. Furthermore, the term "insulator" can be changed into the term "insulating layer" or "insulating film" in some cases.

In addition, in this specification and the like, for example, the term such as "electrode", "wiring", or "terminal" does not limit the function of a component. For example, an "electrode" is used as part of a wiring in some cases, and vice versa. Furthermore, the term "electrode" or "wiring" also includes, for example, the case where a plurality of "electrodes" or "wirings" are formed in an integrated manner. For example, a “terminal” is used as part of a “wiring” or an “electrode” in some cases, and vice versa. Furthermore, the term “terminal” also includes the case where a plurality of “electrodes”, “wirings”, “terminals”, or the like are formed in an integrated manner, for example. Therefore, for example, an “electrode” can be part of a “wiring” or a “terminal”. Furthermore, a “terminal” can be part of a “wiring” or an “electrode”. Moreover, the term “electrode”, “wiring”, “terminal”, or the like is sometimes replaced with the term “region”, for example.

In addition, in this specification and the like, for example, the terms such as “wiring”, “signal line”, and “power supply line” can be interchanged with each other depending on the situation, in some cases. For example, the term “wiring” can be changed into the term “signal line” in some cases. For another example, the term “wiring” can be changed into the term “power supply line” or the like in some cases. Conversely, for example, the term “signal line”, “power supply line”, or the like can be changed into the term “wiring” in some cases. Furthermore, for example, the term “power supply line” or the like can be changed into the term “signal line” or the like in some cases. Conversely, for example, the term “signal line” or the like can be changed into the term “power supply line” or the like in some cases. Moreover, the term “potential” that is applied to a wiring can be changed into the term “signal” or the like depending on the situation, for example. Conversely, for example, the term “signal” or the like can be changed into the term “potential” in some cases.

In this specification and the like, a “switch” includes a plurality of terminals and has a function of switching (selecting) electrical continuity and discontinuity between the terminals. For example, in the case where a switch includes two terminals and electrical continuity is established between the two terminals, the switch is in a “conduction state” or an “on state”. In the case where electrical continuity is not established between the two terminals, the switch is in a “non-conduction state” or an “off state”. Note that switching to one of a conduction state and a non-conduction state or maintaining one of a conduction state and a non-conduction state is sometimes referred to as “controlling a conduction state”.

That is, a switch has a function of controlling whether to make a current flow therethrough or not. Alternatively, a switch has a function of selecting and changing a current path. For example, an electrical switch or a mechanical switch can be used as the switch. That is, a switch can be any element capable of controlling a current, and is not limited to a particular element.

Examples of a switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case where a transistor is used as a switch, a “conduction state” or “on state” of the transistor refers to a state where a source electrode and a drain electrode of the transistor can be regarded as being electrically short-circuited. Furthermore, a “non-conduction state” or “off state” of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch using a MEMS (micro electro mechanical systems) technology. Such a switch includes an electrode that can be moved mechanically, and selects a conduction or non-conduction state with the movement of the electrode.

In this specification and the like, “parallel” indicates a state where two straight lines are placed at an angle greater than or equal to −10° and less than or equal to 10°. Thus, the case where the angle is greater than or equal to −5° and less than or equal to 5° is also included. In addition, “approximately parallel” or “substantially parallel” indicates a state where two straight lines are placed at an angle greater than or equal to −30° and less than or equal to 30°. Moreover, “perpendicular” indicates a state where two straight lines are placed at an angle greater than or equal to 80° and less than or equal to 100°. Thus, the case where the angle is greater than or equal to 85° and less than or equal to 95° is also included. Furthermore, “approximately perpendicular” or “substantially perpendicular” indicates a state where two straight lines are placed at an angle greater than or equal to 60° and less than or equal to 120°.

Note that in this specification and the like, the terms “identical”, “the same”, “equal”, “uniform”, and the like (including synonyms thereof) used in describing calculation values and measurement values contain an error of +20% unless otherwise specified.

Embodiments described in this specification are described with reference to the drawings. Note that the embodiments can be implemented in many different modes. Therefore, it will be readily understood by those skilled in the art that the modes and details can be changed in various ways without departing from the spirit and scope thereof. Therefore, the present invention should not be interpreted as being limited to the description in the embodiments. As for the drawings illustrating the embodiments, in the structures of the invention, the same reference numerals are used in common for the same portions or portions having similar functions in different drawings, and repeated description thereof is omitted in some cases. Furthermore, the same hatch pattern is used for the portions having similar functions throughout the drawings, and the portions are not especially denoted by reference numerals in some cases. Moreover, some components are omitted in a perspective view, a top view, and the like for easy understanding of the drawings in some cases.

In addition, in the drawings and the like in this specification, the size, the layer thickness, or the region is exaggerated for clarity in some cases. Therefore, the drawings are not necessarily limited to the drawings with the illustrated size, aspect ratio, and the like, for example. Note that the drawings schematically illustrate ideal examples, and embodiments of the present invention are not limited to shapes, values, and the like illustrated in the drawings, for example. For example, variation in signal, voltage, or current due to noise or variation in signal, voltage, or current due to difference in timing can be included.

In the drawings and the like in this specification, arrows indicating the X direction, the Y direction, and the Z direction are illustrated in some cases. In this specification and the like, the “X direction” is a direction along the X-axis, and the forward direction and the reverse direction are not distinguished in some cases, unless otherwise specified. The same applies to the “Y direction” and the “Z direction”. The X direction, the Y direction, and the Z direction are directions intersecting with each other. More specifically, the X direction, the Y direction, and the Z direction are directions orthogonal to each other. In this specification and the like, one of the X direction, the Y direction, and the Z direction is referred to as a “first direction” in some cases. Another one of the directions is referred to as a "second direction" in some cases. The remaining one of the directions is referred to as a "third direction" in some cases.

In this specification and the like, when a plurality of components are denoted by the same reference numerals, and in particular need to be distinguished from each other, an identification sign such as "A", "b", "_1", "[n]", or "[m, n]" is sometimes added to the reference numerals, for example.

Embodiment 1

A semiconductor device 100A of one embodiment of the present invention will be described. The semiconductor device 100A of one embodiment of the present invention can be used in a pixel of a display apparatus, for example.

<Structure Example>

FIG. 1 illustrates a circuit structure example of the semiconductor device 100A. The semiconductor device 100A includes a pixel circuit 51A and a light-emitting element 61. The pixel circuit 51A includes a transistor M1 to a transistor M7 and a capacitor C1 to a capacitor C3. In this embodiment and the like, unless otherwise specified, the transistor M1 to the transistor M7 are enhancement (normally-off) n-channel field-effect transistors. Thus, the threshold voltages (also referred to as "Vth") of the transistor M1 to the transistor M7 are each higher than 0 V. Note that the threshold voltages of the transistor M1 to the transistor M7 may be different from one another. For example, the threshold voltage of the transistor M2 may be referred to as Vth2. The threshold voltage of the transistor M5 may be referred to as Vth5. The threshold voltage of the transistor M7 may be referred to as Vth7.

A gate of the transistor M1 is electrically connected to a wiring GLa. One of a source and a drain of the transistor M1 is electrically connected to a wiring DL. The other of the source and the drain of the transistor M1 is electrically connected to a gate of the transistor M2. The transistor M1 has a function of establishing or breaking electrical continuity between the gate of the transistor M2 and the wiring DL The gate of the transistor M2 is electrically connected to one terminal of the capacitor C1. One of a source and a drain of the transistor M2 is electrically connected to a wiring 101. The other of the source and the drain of the transistor M2 is electrically connected to the other terminal of the capacitor C1. Moreover, the transistor M2 may include a back gate. The back gate of the transistor M2 is electrically connected to one terminal of the capacitor C2. The other terminal of the capacitor C2 is electrically connected to the other of the source and the drain of the transistor M2.

A gate of the transistor M3 is electrically connected to a wiring GLb. One of a source and a drain of the transistor M3 is electrically connected to the one terminal of the capacitor C1. The other of the source and the drain of the transistor M3 is electrically connected to the other terminal of the capacitor C1. The transistor M3 has a function of establishing or breaking electrical continuity between the gate of the transistor M2 and the other of the source and the drain of the transistor M2.

A gate of the transistor M4 is electrically connected to the wiring GLb. One of a source and a drain of the transistor M4 is electrically connected to a wiring 102. The other of the source and the drain of the transistor M4 is electrically connected to the one terminal of the capacitor C2. The transistor M4 has a function of establishing or breaking electrical continuity between the wiring 102 and the one terminal of the capacitor C2.

A gate of the transistor M5 is electrically connected to one terminal of the capacitor C3. One of a source and a drain of the transistor M5 is electrically connected to the other of the source and the drain of the transistor M2. The other of the source and the drain of the transistor M5 is electrically connected to the other terminal of the capacitor C3 and one terminal (e.g., an anode terminal) of the light-emitting element 61. The other terminal (e.g., a cathode terminal) of the light-emitting element 61 is electrically connected to a wiring 104.

A gate of the transistor M6 is electrically connected to a wiring GLd. One of a source and a drain of the transistor M6 is electrically connected to the other of the source and the drain of the transistor M2. The other of the source and the drain of the transistor M6 is electrically connected to a wiring 103. The transistor M6 has a function of establishing or breaking electrical continuity between the other of the source and the drain of the transistor M2 and the wiring 103.

A gate of the transistor M7 is electrically connected to the wiring GLd. One of a source and a drain of the transistor M7 is electrically connected to the wiring GLc. The other of the source and the drain of the transistor M7 is electrically connected to the gate of the transistor M5. The transistor M7 has a function of establishing or breaking electrical continuity between the gate of the transistor M5 and the wiring GLc.

A region where the other terminal of the capacitor C1, the other terminal of the capacitor C2, the other of the source and the drain of the transistor M2, the other of the source and the drain of the transistor M3, the one of the source and the drain of the transistor M5, and the one of the source and the drain of the transistor M6 are electrically connected to one another is referred to as a node ND1.

A region where the one terminal of the capacitor C2, the back gate of the transistor M2, and the other of the source and the drain of the transistor M4 are electrically connected to one another is referred to as a node ND2.

A region where the other of the source and the drain of the transistor M1, the one of the source and the drain of the transistor M3, the one terminal of the capacitor C1, and the gate of the transistor M2 are electrically connected to one another is referred to as a node ND3.

A region where the gate of the transistor M5, the one terminal of the capacitor C3, and the other of the source and the drain of the transistor M7 are electrically connected to one another is referred to as a node ND4.

The capacitor C1 has, for example, a function of retaining a potential difference between the other of the source and the drain of the transistor M2 and the gate of the transistor M2 at the time when the node ND3 is in a floating state. The capacitor C2 has, for example, a function of retaining a potential difference between the other of the source and the drain of the transistor M2 and the back gate of the transistor M2 at the time when the node ND2 is in a floating state. The capacitor C3 has, for example, a function of retaining a potential difference between the other of the source and the drain of the transistor M5 and the gate of the transistor M5 at the time when the node ND4 is in a floating state.

A transistor containing any of various semiconductors can be used in the pixel circuit 51A of one embodiment of the present invention. For example, a transistor containing a single crystal semiconductor, a polycrystalline semiconductor, a microcrystalline semiconductor, or an amorphous semiconductor in a channel formation region can be used.

Note that a semiconductor contained in the transistor is not limited to a single element semiconductor whose main component is a single element (e.g., silicon (Si) or germanium (Ge)). For example, a compound semiconductor (e.g., silicon germanium (SiGe) or gallium arsenide (GaAs)), an oxide semiconductor, or the like can be used as the semiconductor contained in the transistor.

In this embodiment and the like, an example is described in which the semiconductor device 100A is formed using n-channel transistors; however, one embodiment of the present invention is not limited thereto. As some or all of the transistors included in the semiconductor device 100A, p-channel transistors may be used.

Any of transistors having a variety of structures can be used in the pixel circuit 51A of one embodiment of the present invention. For example, any of transistors having a variety of structures such as a planar type, a FIN-type, a TRI-GATE type, a top-gate type, a bottom-gate type, and a dual-gate type (a structure in which gates are placed above and below a channel) can be used. A MOS transistor, a junction transistor, a bipolar transistor, or the like can be used, for example, as the transistor of one embodiment of the present invention.

As each of the transistors included in the pixel circuit 51A, an OS transistor (a transistor containing an oxide semiconductor in a semiconductor layer where a channel is formed) may be used, for example. An oxide semiconductor has a band gap of 2 eV or more and thus has an extremely low off-state current.

The off-state current value per micrometer of channel width of the OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor (a transistor containing silicon in a semiconductor layer where a channel is formed) at room temperature is higher than or equal to 1 fA ($1\times10^{-15}$ A) and lower than or equal to 1 pA ($1\times10^{-12}$ A). Thus, the off-state current of the OS transistor is lower than the off-state current of the Si transistor by approximately ten orders of magnitude.

When the OS transistor is used as each of the transistors included in the pixel circuit 51A, charge written to the nodes in the pixel circuit 51A can be retained for a long period. For example, owing to the pixel circuit 51A, in the case of displaying a still image for which rewriting every frame is not required, displaying an image can be kept even when the operation of a peripheral driver circuit is stopped. Such a driving method in which the operation of a peripheral driver circuit is stopped during displaying a still image is also referred to as "idling stop driving". The power consumption of a display apparatus can be reduced by performing idling stop driving.

The off-state current of the OS transistor hardly increases even in a high-temperature environment. Specifically, the off-state current of the OS transistor hardly increases even at an environment temperature higher than or equal to room temperature and lower than or equal to 200° C. Furthermore, the on-state current of the OS transistor is unlikely to decrease even in a high-temperature environment. A semiconductor device including the OS transistor can operate stably and have high reliability even in a high-temperature environment.

Moreover, the OS transistor has a high source-drain breakdown voltage. The use of the OS transistor as each of the transistors included in the pixel circuit 51A makes the operation stable even in the case where a potential difference between a potential supplied to the wiring 101 (also referred to as an anode potential) and a potential supplied to the wiring 104 (also referred to as a cathode potential) is large. Owing to the OS transistors, the semiconductor device can have high reliability. It is particularly preferable to use the OS transistor as one or both of the transistor M2 and the transistor M5.

The semiconductor layer of the OS transistor preferably contains at least one of indium and zinc. The semiconductor layer of the OS transistor preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as "IGZO") for the semiconductor layer. Alternatively, an oxide containing indium (In), aluminum (Al), and zinc (Zn) (also referred to as "IAZO") may be used for the semiconductor layer. Alternatively, an oxide containing indium (In), aluminum (Al), gallium (Ga), and zinc (Zn) (also referred to as "IAGZO") may be used for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=1:3:2 or a composition in the neighborhood thereof, In:M:Zn=1:3:4 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of +30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The pixel circuits 51A may include a plurality of kinds of transistors formed using different semiconductor materials. For example, the pixel circuit 51A may include a transistor containing low-temperature polysilicon (LTPS) in its semiconductor layer (hereinafter also referred to as an LTPS transistor) and an OS transistor. The LTPS transistor has high field-effect mobility and favorable frequency characteristics. A structure where an LTPS transistor and an OS transistor are used in combination is referred to as LTPO in some cases.

In the case where the pixel circuit 51A includes a plurality of kinds of transistors formed using different semiconductor materials, the transistors may be provided in different layers for each kind of transistor. For example, in the case where the pixel circuit 51A include a Si transistor and an OS transistor, a layer including the Si transistor and a layer including the OS transistor may be provided to overlap with each other. This structure reduces the area occupied by the pixel circuit 51A.

Note that the transistor M2 has a function of controlling the amount of current flowing through the light-emitting element 61. That is, the transistor M2 has a function of controlling the amount of light emitted from the light-emitting element 61. Thus, in this specification and the like, the transistor M2 is referred to as a "driving transistor" in some cases.

The transistor M5 has a function of establishing or breaking electrical continuity (on state or off state) between the transistor M2 and the light-emitting element 61. When the transistor M5 is in the off state, a current does not flow through the light-emitting element 61; thus, light emission from the light-emitting element 61 is stopped (quenching). When the transistor M5 is in the on state, a current flows through the light-emitting element 61 via the transistor M5, so that the light-emitting element 61 emits light. Thus, in this specification and the like, the transistor M5 is referred to as a "light-emitting transistor" in some cases. In order to supply a current with the amount determined by the driving transistor to the light-emitting element 61, the transistor M5 needs to be surely in the on state regardless of the values of the source potential and the drain potential at the time of light emission.

Figure 2:
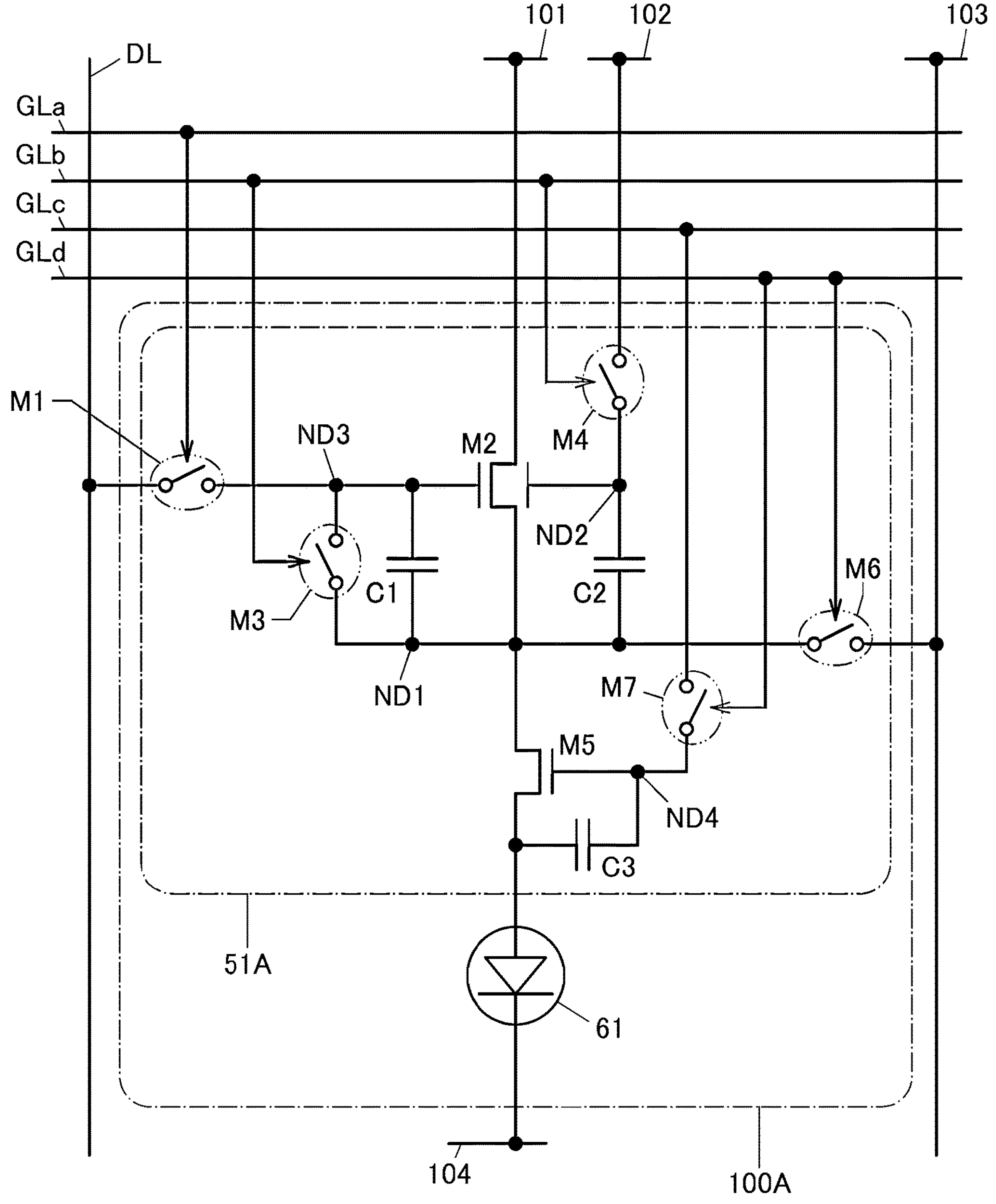
FIG. 2 is a diagram illustrating the semiconductor device.

Among the transistors included in the pixel circuit 51A, the transistor M1, the transistor M3, the transistor M4, the transistor M6, and the transistor M7 function as switches. Hence, the semiconductor device 100A can be illustrated as in FIG. 2.

Figure 3:
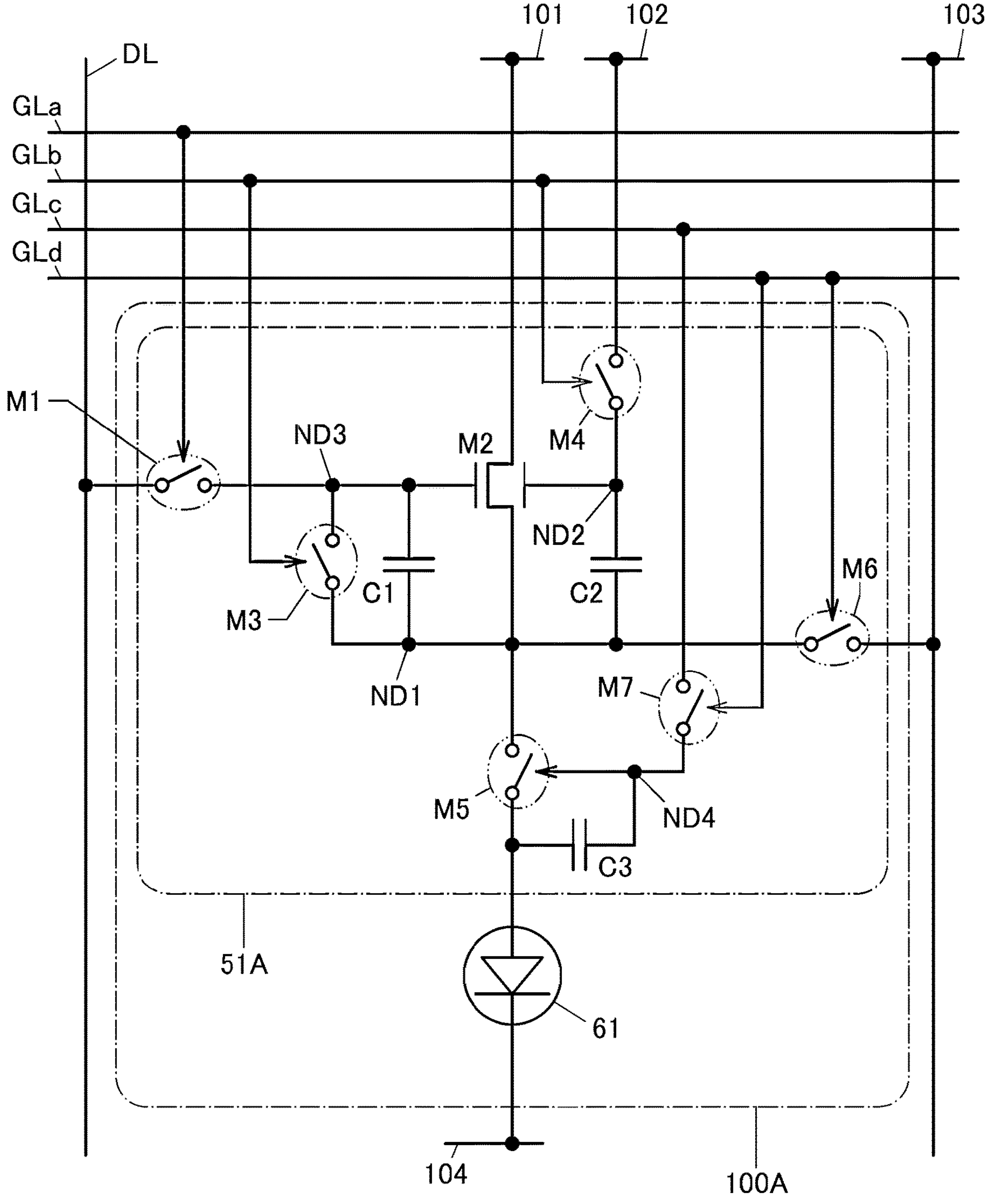
FIG. 3 is a diagram illustrating the semiconductor device.

The transistor M5 also functions as a switch. Hence, the semiconductor device 100A can also be illustrated as in FIG. 3. The transistor M1 and the transistor M3 to the transistor M7 can be replaced with elements that can function as switches.

Some or all of the transistors included in the pixel circuit 51A may each be a transistor having a back gate. By providing the back gate, an electric field generated outside the transistor is unlikely to affect a channel formation region; thus, the operation of the semiconductor device including the transistor is stabilized and the reliability of the semiconductor device can be increased. When the back gate of the transistor is supplied with the same potential as the potential supplied to the gate, the on-state resistance of the transistor is reduced. By controlling the potentials of the back gate and the gate of the transistor independently of each other, the threshold voltage of the transistor is changed.

Figure 4:
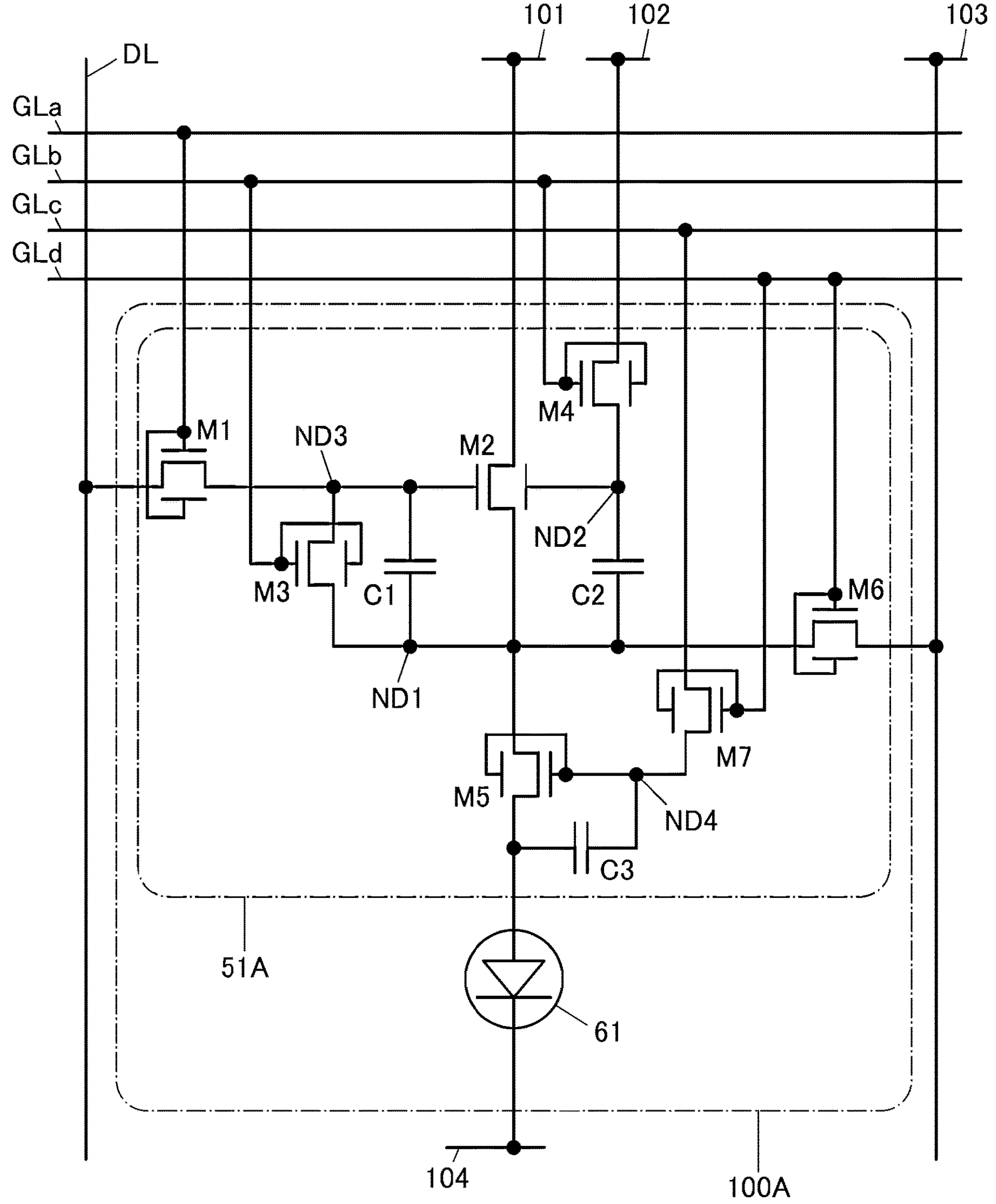
FIG. 4 is a diagram illustrating a semiconductor device.

FIG. 4 illustrates a circuit structure example of the semiconductor device 100A in which transistors having back gates are used not only as the transistor M2 but also as the transistor M1 and the transistor M3 to the transistor M7. FIG. 4 illustrates an example in which the gate and the back gate of each of the transistor M1 and the transistor M3 to the transistor M7 are electrically connected to each other. Note that not all the transistors included in the semiconductor device necessarily have back gates.

In each of the transistor M1 and the transistor M3 to the transistor M7, it is not necessary to electrically connect the gate and the back gate, and a given potential may be supplied to the back gate. Note that the potential supplied to the back gate is not limited to a fixed potential. The potentials supplied to the back gates of the transistors included in the semiconductor device may be different from one another or may be the same.

Figure 5:
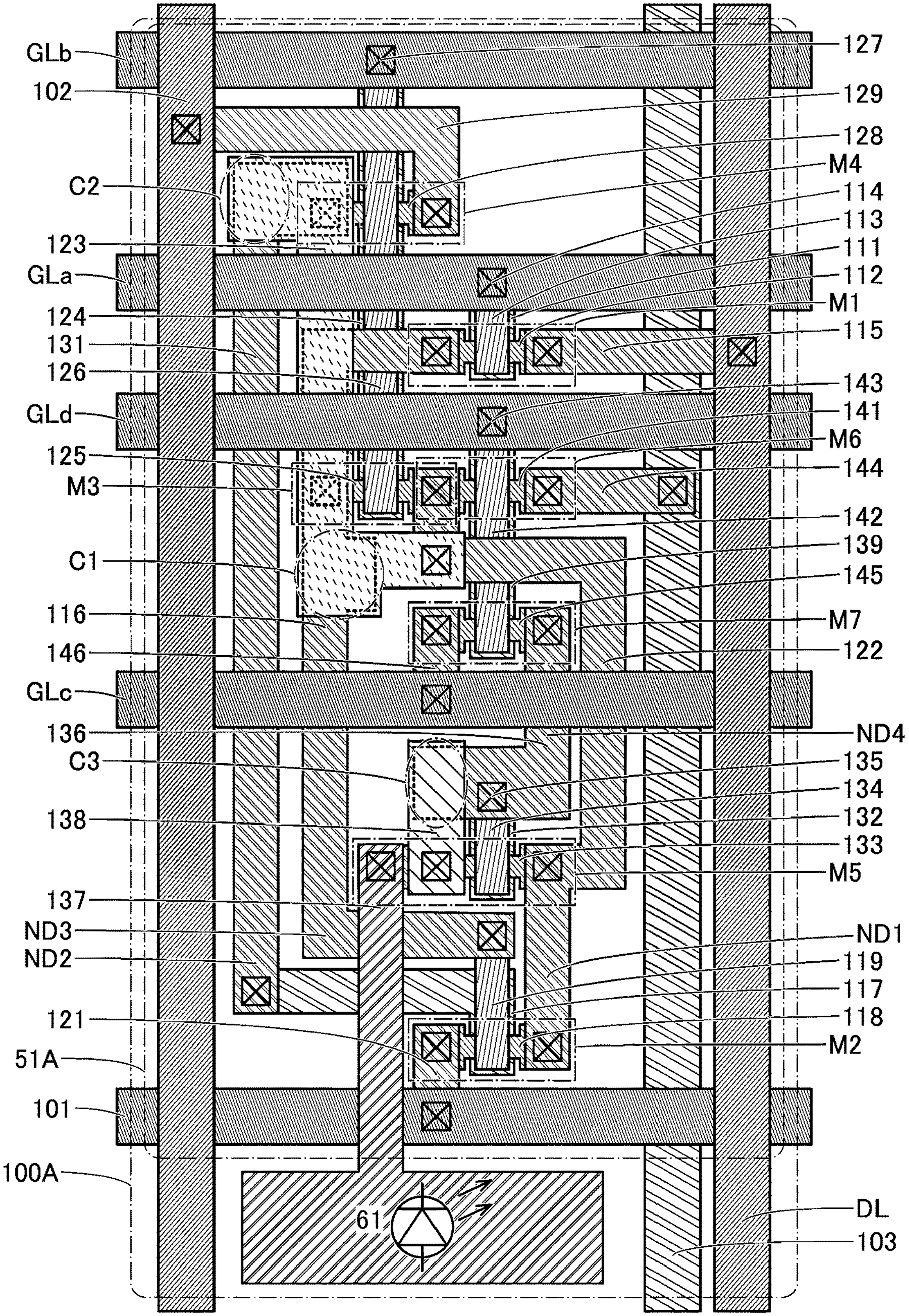
FIG. 5 is a diagram illustrating the semiconductor device.

FIG. 5 is an example of a planar layout diagram of the semiconductor device 100A illustrated in FIG. 4.

A semiconductor layer 112 of the transistor M1 is provided over a conductive layer 111. The conductive layer 111 and the semiconductor layer 112 have an overlapping region. Part of the conductive layer 111 functions as the back gate of the transistor M1. A conductor 113 functions as the gate of the transistor M1. Furthermore, the conductor 113 is electrically connected to the conductive layer 111 and the wiring GLa in a contact hole 114.

The one of the source and the drain of the transistor M1 is electrically connected to the wiring DL through a conductive layer 115. The other of the source and the drain of the transistor M1 is electrically connected to a conductive layer 116.

A semiconductor layer 118 of the transistor M2 is provided over a conductive layer 117. The conductive layer 117 and the semiconductor layer 118 have an overlapping region. Part of the conductive layer 117 functions as the back gate of the transistor M2. A conductive layer 119 functions as the gate of the transistor M2. The conductive layer 119 is electrically connected to the conductive layer 116.

The one of the source and the drain of the transistor M2 is electrically connected to the wiring 101 through a conductive layer 121. The other of the source and the drain of the transistor M2 is electrically connected to a conductive layer 122. The conductive layer 122 is electrically connected to a conductive layer 123. A region where the conductive layer 116 and the conductive layer 123 overlap each other functions as the capacitor C1.

A semiconductor layer 125 of the transistor M3 is provided over a conductive layer 124. The conductive layer 124 and the semiconductor layer 125 have an overlapping region. Part of the conductive layer 124 functions as the back gate of the transistor M3. A conductor 126 functions as the gate of the transistor M3. Furthermore, the conductor 126 is electrically connected to the conductive layer 124 and the wiring GLb in a contact hole 127.

The one of the source and the drain of the transistor M3 is electrically connected to the conductive layer 116. The other of the source and the drain of the transistor M3 is electrically connected to the conductive layer 122.

A semiconductor layer 128 of the transistor M4 is provided over the conductive layer 124. The conductive layer 124 and the semiconductor layer 128 have an overlapping region. Part of the conductive layer 124 functions as the back gate of the transistor M4. The conductor 126 functions as the gate of the transistor M4.

The one of the source and the drain of the transistor M4 is electrically connected to the wiring 102 through a conductive layer 129. The other of the source and the drain of the transistor M4 is electrically connected to a conductive layer 131. The conductive layer 131 is electrically connected to the conductive layer 117. A region where the conductive layer 131 and the conductive layer 123 overlap each other functions as the capacitor C2.

A semiconductor layer 133 of the transistor M5 is provided over a conductive layer 132. The conductive layer 132 and the semiconductor layer 133 have an overlapping region. Part of the conductive layer 132 functions as the back gate of the transistor M5. A conductor 134 functions as the gate of the transistor M5. Furthermore, the conductor 134 is electrically connected to the conductive layer 132 and a conductive layer 136 in a contact hole 135.

The one of the source and the drain of the transistor M5 is electrically connected to the conductive layer 122. The other of the source and the drain of the transistor M5 is electrically connected to a conductive layer 137. The conductive layer 137 is electrically connected to a conductive layer 138. A region where the conductive layer 136 and the conductive layer 138 overlap each other functions as the capacitor C3. The conductive layer 137 is electrically connected to the light-emitting element 61.

A semiconductor layer 141 of the transistor M6 is provided over a conductive layer 139. The conductive layer 139 and the semiconductor layer 141 have an overlapping region. Part of the conductive layer 139 functions as the back gate of the transistor M6. A conductor 142 functions as the gate of the transistor M6. Furthermore, the conductor 142 is electrically connected to the conductive layer 139 and the wiring GLd in a contact hole 143.

The one of the source and the drain of the transistor M6 is electrically connected to the conductive layer 122. The other of the source and the drain of the transistor M6 is electrically connected to the wiring 103 through a conductive layer 144.

A semiconductor layer 145 of the transistor M7 is provided over a conductive layer 139. The conductive layer 139 and the semiconductor layer 145 have an overlapping region. Part of the conductive layer 139 functions as the back gate of the transistor M7. The conductor 142 functions as the gate of the transistor M7.

The one of the source and the drain of the transistor M7 is electrically connected to the wiring GLc through a conductive layer 146. The other of the source and the drain of the transistor M7 is electrically connected to the conductive layer 136.

The conductive layer 122 functions as the node ND1. The conductive layer 131 functions as the node ND2. The conductive layer 116 functions as the node ND3. The conductive layer 136 functions as the node ND4.

Figure 6A:
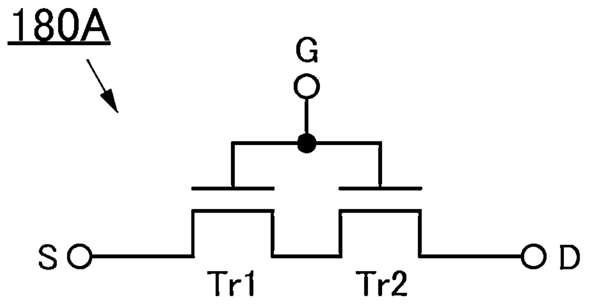
FIG. 6A to FIG. 6C are diagrams illustrating circuit symbols of transistors.

The transistors included in the pixel circuit 51A may each be a single-gate transistor having one gate between a source and a drain, or a double-gate transistor. FIG. 6A illustrates a circuit symbol example of a double-gate transistor 180A.

The transistor 180A has a structure in which a transistor Tr1 and a transistor Tr2 are connected in series. In FIG. 6A, one of a source and a drain of the transistor Tr1 is electrically connected to a terminal S, the other of the source and the drain of the transistor Tr1 is electrically connected to one of a source and a drain of the transistor Tr2, and the other of the source and the drain of the transistor Tr2 is electrically connected to a terminal D. In addition, a gate of the transistor Tr1 and a gate of the transistor Tr2 are electrically connected to each other and electrically connected to a terminal G.

The transistor 180A illustrated in FIG. 6A has a function of establishing or breaking electrical continuity between the terminal S and the terminal D by changing the potential of the terminal G. Thus, the transistor 180A that is a double-gate transistor functions as one transistor including the transistor Tr1 and the transistor Tr2. That is, it can be said that in FIG. 6A, one of a source and a drain of the transistor 180A is electrically connected to the terminal S, the other of the source and the drain of the transistor 180A is electrically connected to the terminal D, and a gate of the transistor 180A is electrically connected to the terminal G.

Figure 6B:
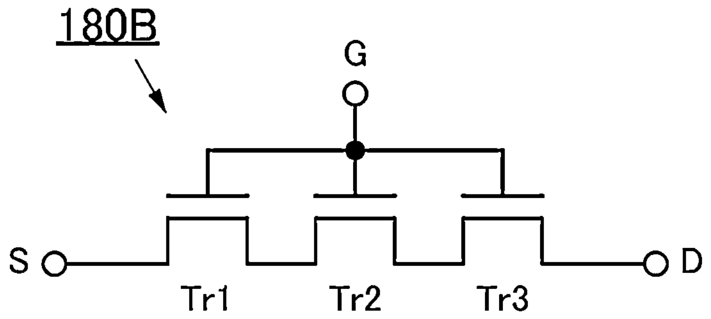

The transistors included in the pixel circuit 51A may each be a triple-gate transistor. FIG. 6B illustrates a circuit symbol example of a triple-gate transistor 180B.

The transistor 180B has a structure in which the transistor Tr1, the transistor Tr2, and a transistor Tr3 are connected in series. In FIG. 6B, the one of the source and the drain of the transistor Tr1 is electrically connected to the terminal S, the other of the source and the drain of the transistor Tr1 is electrically connected to the one of the source and the drain of the transistor Tr2, the other of the source and the drain of the transistor Tr2 is electrically connected to one of a source and a drain of the transistor Tr3, and the other of the source and the drain of the transistor Tr3 is electrically connected to the terminal D. In addition, the gate of the transistor Tr1, the gate of the transistor Tr2, and a gate of the transistor Tr3 are electrically connected to each other and electrically connected to the terminal G.

The transistor 180B illustrated in FIG. 6B has a function of establishing or breaking electrical continuity between the terminal S and the terminal D by changing the potential of the terminal G. Thus, the transistor 180B that is a triple-gate transistor functions as one transistor including the transistor Tr1, the transistor Tr2, and the transistor Tr3. That is, it can be said that in FIG. 6B, one of a source and a drain of the transistor 180B is electrically connected to the terminal S, the other of the source and the drain of the transistor 180B is electrically connected to the terminal D, and a gate of the transistor 180B is electrically connected to the terminal G.

The transistors included in the pixel circuit 51A may each have a structure in which four or more transistors are connected in series. A transistor 180C illustrated in FIG. 6C has a structure in which six transistors (the transistor Tr1 to a transistor Tr6) are connected in series. In addition, gates of the six transistors are electrically connected to each other and electrically connected to the terminal G.

Figure 6C:
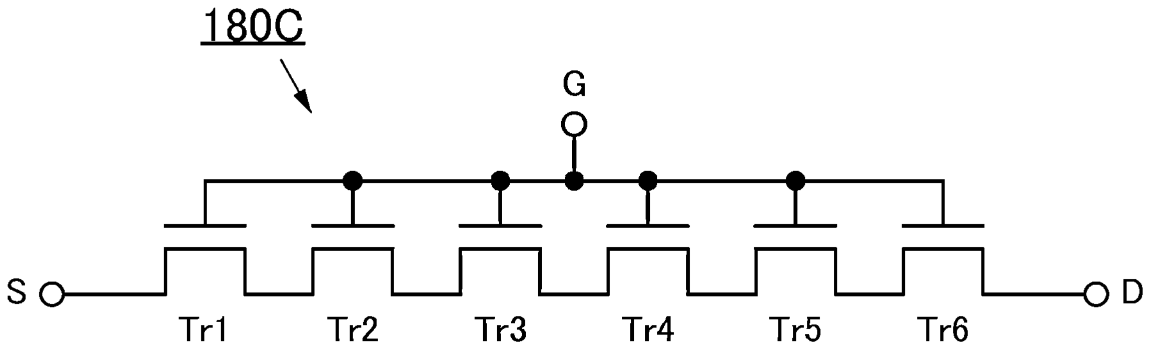

The transistor 180C illustrated in FIG. 6C has a function of establishing or breaking electrical continuity between the terminal S and the terminal D by changing the potential of the terminal G. Thus, the transistor 180C functions as one transistor including the transistor Tr1 to the transistor Tr6. That is, it can be said that in FIG. 6C, one of a source and a drain of the transistor 180C is electrically connected to the terminal S, the other of the source and the drain of the transistor 180C is electrically connected to the terminal D, and a gate of the transistor 180C is electrically connected to the terminal G.

Like the transistor 180A, the transistor 180B, and the transistor 180C, a transistor having a plurality of gates electrically connected to each other is referred to as a "multi-gate type transistor" or a "multi-gate transistor" in some cases.

For example, in some cases, it is preferable for a transistor to have a long channel length in order to have improved electrical characteristics in a saturation region. A multi-gate transistor may be used to achieve a transistor having a long channel length.

As the light-emitting element 61, for example, any of a variety of display elements such as an EL element (e.g., an EL element containing an organic substance and an inorganic substance, an organic EL element, or an inorganic EL element), an LED (e.g., a white LED, a red LED, a green LED, or a blue LED), a micro LED (e.g., an LED with a side of less than 0.1 mm), a QLED (Quantum-dot Light Emitting Diode), and an electron emitter element may be used.

<Operation Example>

Figure 7:
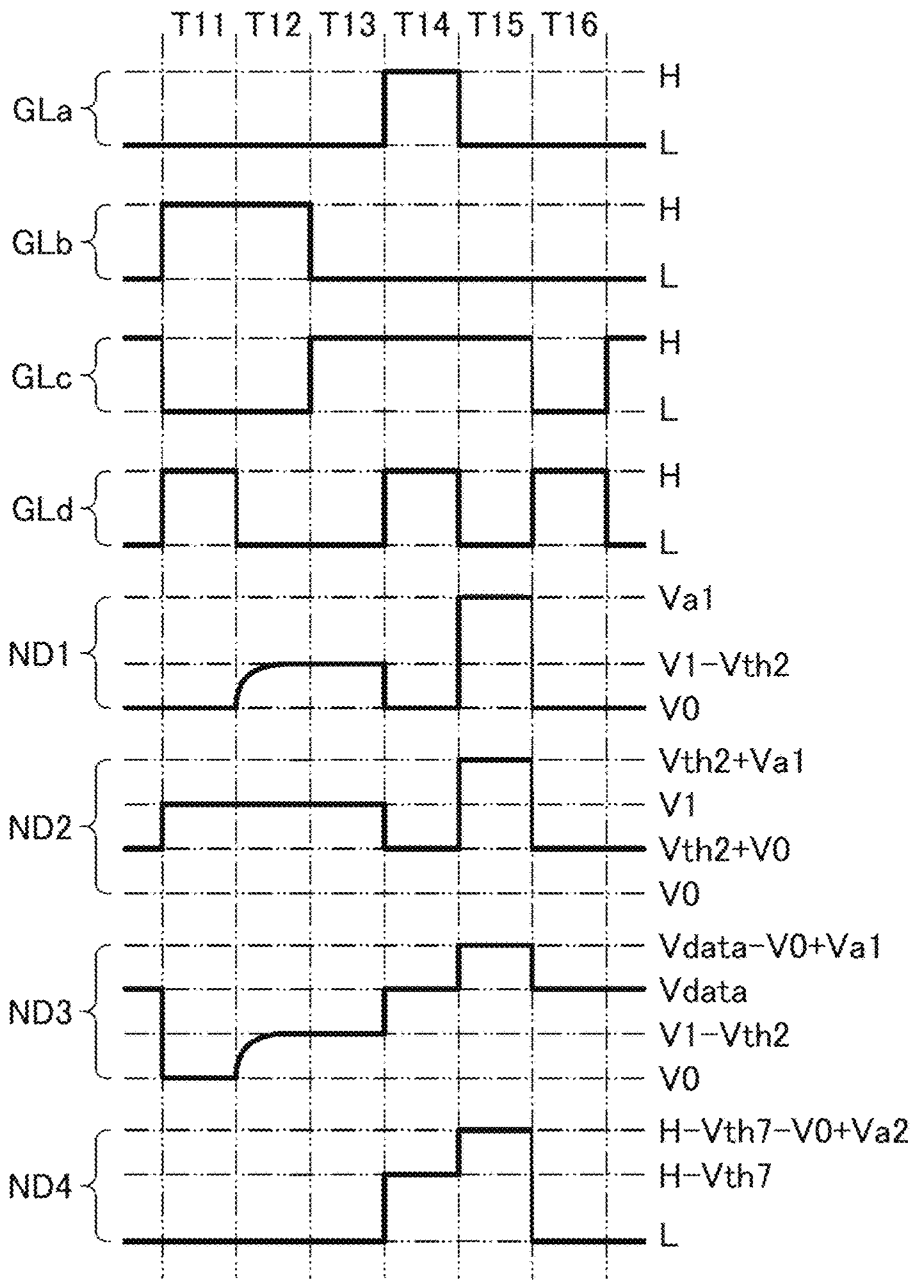
FIG. 7 is a timing chart illustrating an operation example of the semiconductor device.
Figure 8:
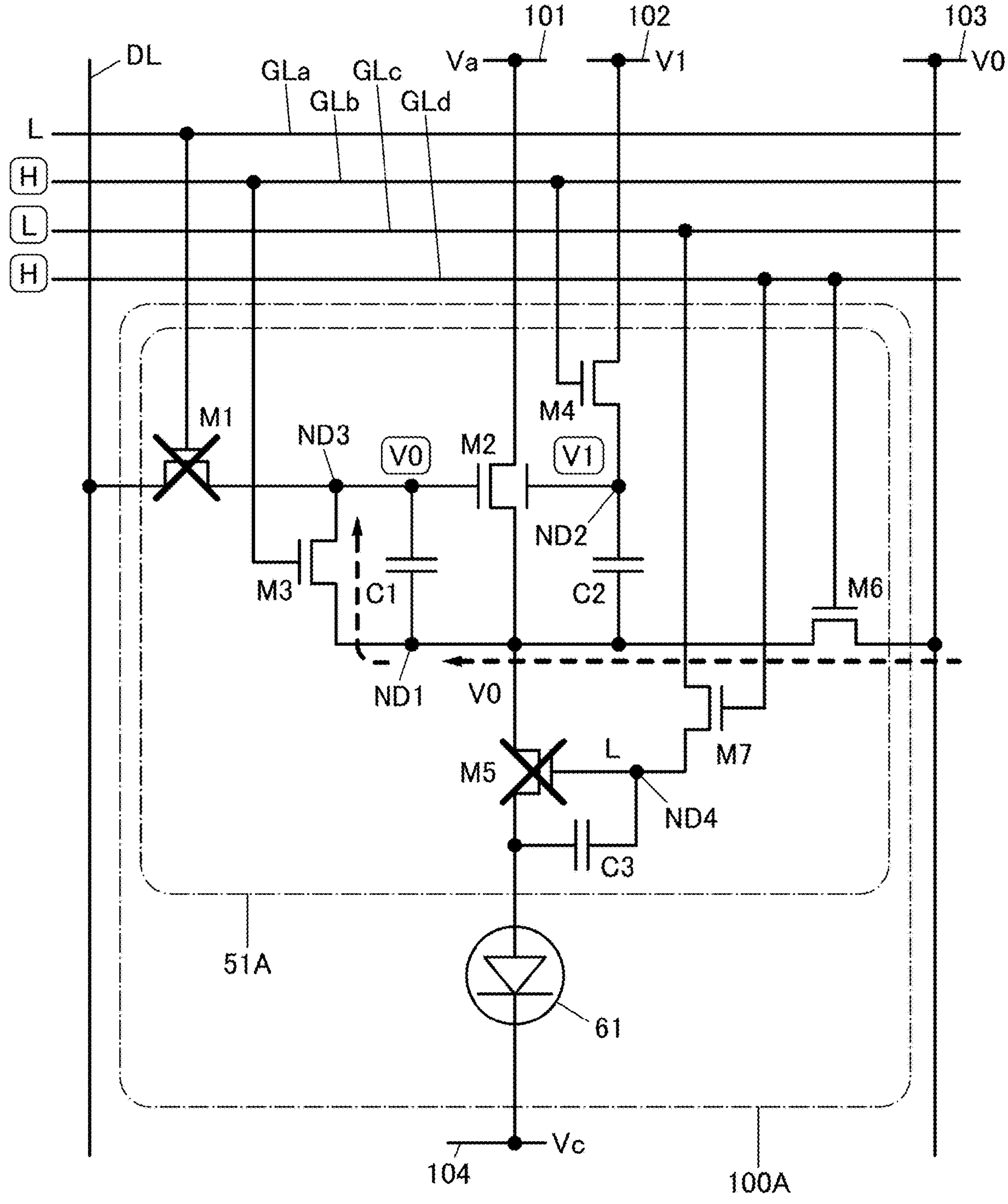
FIG. 8 is a diagram illustrating the operation example of the semiconductor device.

Next, an operation example of the semiconductor device 100A will be described with reference to drawings. FIG. 7 is a timing chart showing the operation example of the semiconductor device 100A. FIG. 8 to FIG. 13 are circuit diagrams illustrating the operation example of the semiconductor device 100A.

A video signal Vdata is supplied to the wiring DL. Therefore, the wiring DL is referred to as a "signal line" in some cases. A potential Va is supplied to the wiring 101, a potential V1 is supplied to the wiring 102, a potential V0 is supplied to the wiring 103, and a potential Vc is supplied to the wiring 104. A potential H or a potential L is supplied to each of the wiring GLa, the wiring GLb, the wiring GLc, and the wiring GLd. The potential H is preferably higher than the potential L. In this specification and the like, the "potential H" is a potential which brings an n-channel transistor into the on state when being supplied to a gate of the transistor. The "potential L" is a potential which brings an n-channel transistor into the off state when being supplied to a gate of the transistor.

The potential Va is an anode potential and the potential Vc is a cathode potential. The potential V1 is preferably a potential higher than the potential V0. For example, the potential V1 may be a potential which brings a transistor into the on state when being supplied to a gate of the transistor. Furthermore, for example, the potential V0 may be a potential which brings a transistor into the off state when being supplied to a gate of the transistor. The potential V0 is, for example, 0 V or the potential L. The potential H is preferably a potential higher than the potential V1. In this embodiment or the like, the potential V0 is 0 V and the potential V1 is 5 V. The potential Va is 15 V and the potential Vc is 0 V. The potential L is 0 V and the potential H is 6 V.

The semiconductor device 100A has a function of controlling the amount of current Ie (see FIG. 12) flowing through the light-emitting element 61 on the basis of the video signal Vdata supplied from the wiring DL. The emission luminance of the light-emitting element 61 is controlled by the amount of current Ie.

Note that in the drawings, a symbol showing a potential (also referred to as a "potential symbol") such as "H", "L", "V0", or "V1" is sometimes illustrated adjacent to a terminal, a wiring, or the like, for example. For easy understanding of changes in potentials, a potential symbol of a terminal, a wiring, or the like whose potential has changed is sometimes enclosed. Furthermore, a symbol "x" sometimes overlaps with an off-state transistor.

The current Ie flowing through the light-emitting element 61 is determined mainly by the video signal Vdata and Vth2 of the transistor M2. Thus, even when the same video signal Vdata is supplied to a plurality of pixel circuits, a Vth2 variation between the transistors M2 included in the pixel circuits makes the current Ie different between the pixels. Accordingly, the Vth2 variation between the transistors M2 is a factor in reducing display quality.

In view of this, Vth2 of the transistor M2 in each pixel is obtained and a variation in the current Ie is reduced. Note that an operation of obtaining Vth2 of the transistor M2 is sometimes referred to as a "Vth value correction operation".

In this specification and the like, a series of operations in which a transistor is brought into the conduction or nonconduction state and charge is supplied to a node that is electrically connected to the transistor to change the potential of the node is referred to as "processing" in some cases.

[Vth Correction Operation]

First, in a period T11, a reset operation is performed. Specifically, the potential H is supplied to the wiring GLb and the wiring GLd, and the potential L is supplied to the wiring GLa and the wiring GLc (see FIG. 8).

This brings the transistor M3, the transistor M4, the transistor M6, and the transistor M7 into the on state and the transistor M1 into the off state.

Thus, the potential V0 is supplied to the node ND1 through the transistor M6.

Furthermore, the potential V0 is supplied to the node ND3 through the transistor M6 and the transistor M3. The potential V1 is supplied to the node ND2 through the transistor M4. The potential L is supplied to the node ND4 through the transistor M7. Accordingly, the transistor M5 is brought into the off state.

Figure 9:
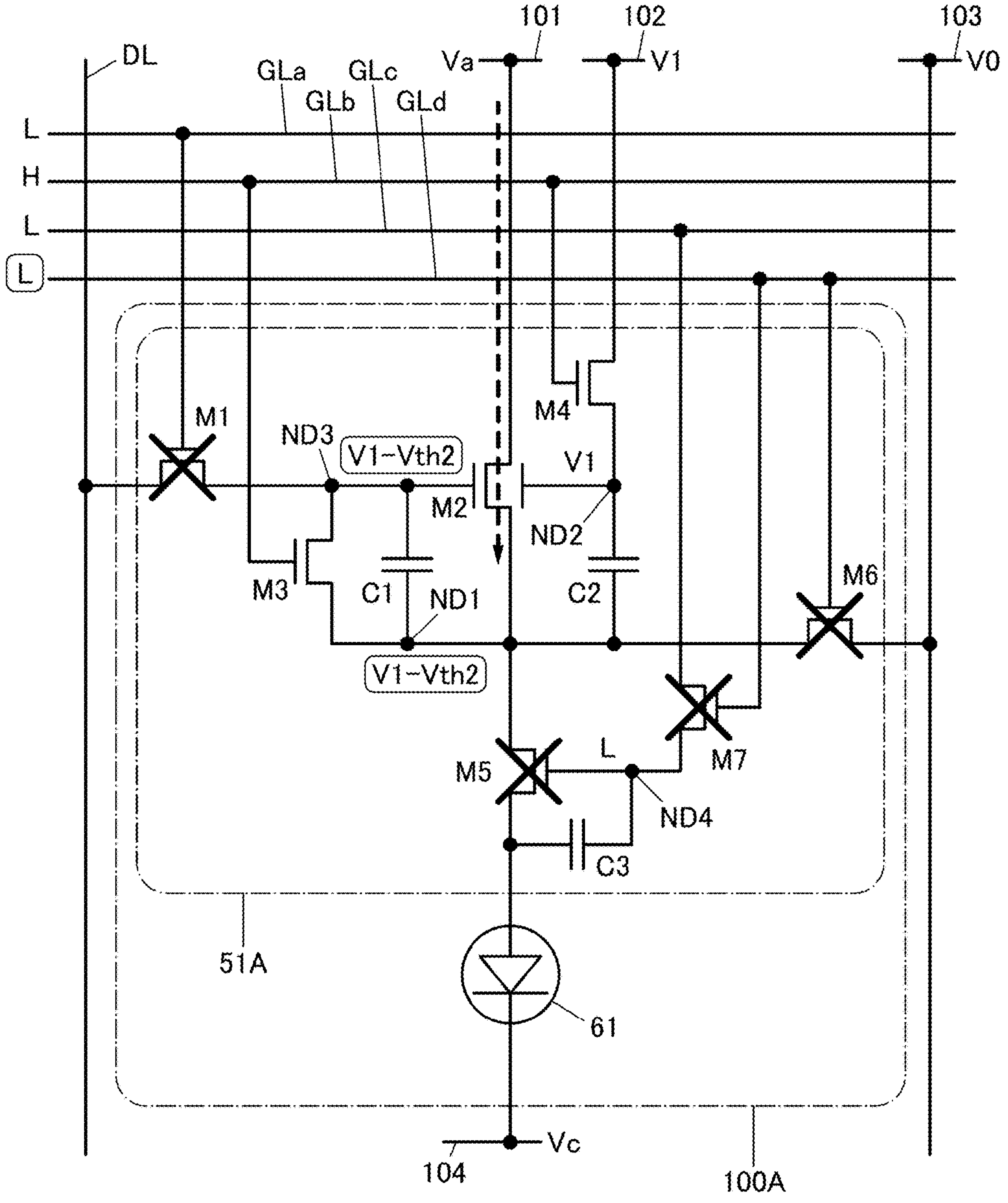
FIG. 9 is a diagram illustrating the operation example of the semiconductor device.

Next, in a period T12, the potential L is supplied to the wiring GLd (see FIG. 9). This brings the transistor M6 and the transistor M7 into the off state. Thus, the node ND4 is brought into a floating state and charge supplied to the node ND4 is retained. Thus, the off state of the transistor M5 is maintained.

Since the potential of the node ND2 is the potential V1, the transistor M2 is in the on state. Thus, charge is supplied from the wiring 101 to the node ND1 through the transistor M2. This increases the potential of the node ND1. Since the transistor M3 is also in the on state, the potential of the node ND3 also increases. Specifically, the potentials of the node ND1 and the node ND3 each increase to a value obtained by subtracting Vth2 of the transistor M2 from the potential V1.

Here, since the potential of the node ND2 is fixed at the potential V1, the increase in the potentials of the node ND1 and the node ND3 reduces a difference in potential between the back gate of the transistor M2 and the source of the transistor M2. When the potential of the node ND1 increases to the neighborhood of a potential V1−Vth2, a current flowing from the wiring 101 through the transistor M2 to the node ND1 is reduced. Thus, the rate of increase in the potential of the node ND1 is decreased. Therefore, time that is enough for the potential of the node ND1 to increase to the potential V1−Vth2 is preferably set as the period T12. Specifically, the period T12 is preferably more than or equal to 1 μs, further preferably more than or equal to 10 μs.

Figure 10:
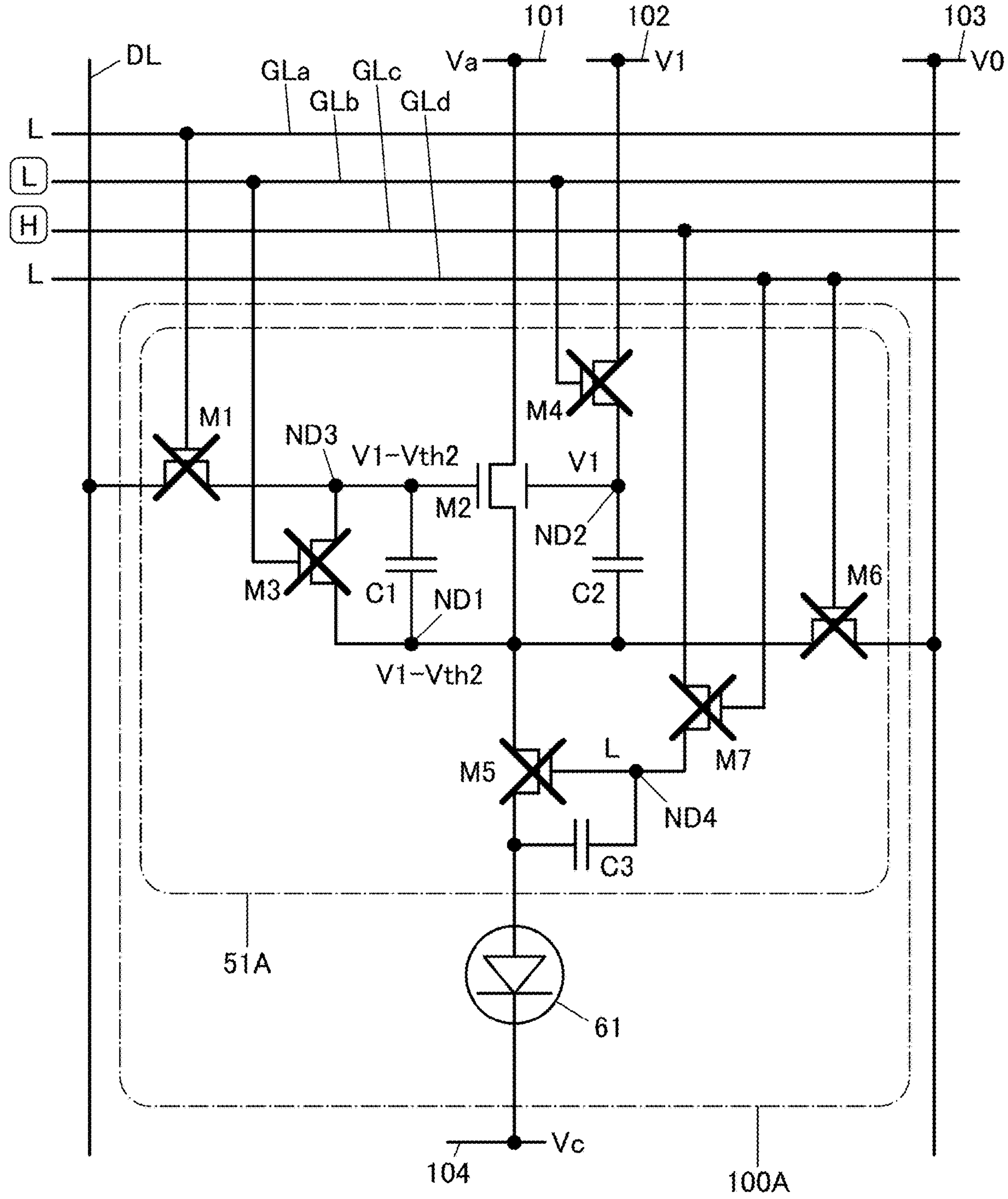
FIG. 10 is a diagram illustrating the operation example of the semiconductor device.

Next, in a period T13, the potential L is supplied to the wiring GLb (see FIG. 10). This brings the transistor M3 and the transistor M4 into the off state. Thus, the node ND2 and the node ND3 are each brought into a floating state. Therefore, charge supplied to the nodes are retained. Since the transistor M7 is in the off state, the potential of the wiring GLc does not affect the operation. In other words, charge supplied to the node ND4 is retained. Thus, the off-state of the transistor M5 is maintained. Although an example of supplying the potential H to the wiring GLc in the period T13 is described here, the potential H may be supplied to the wiring GLc in a period T14 to be described next.

[Data Writing Operation]

Figure 11:
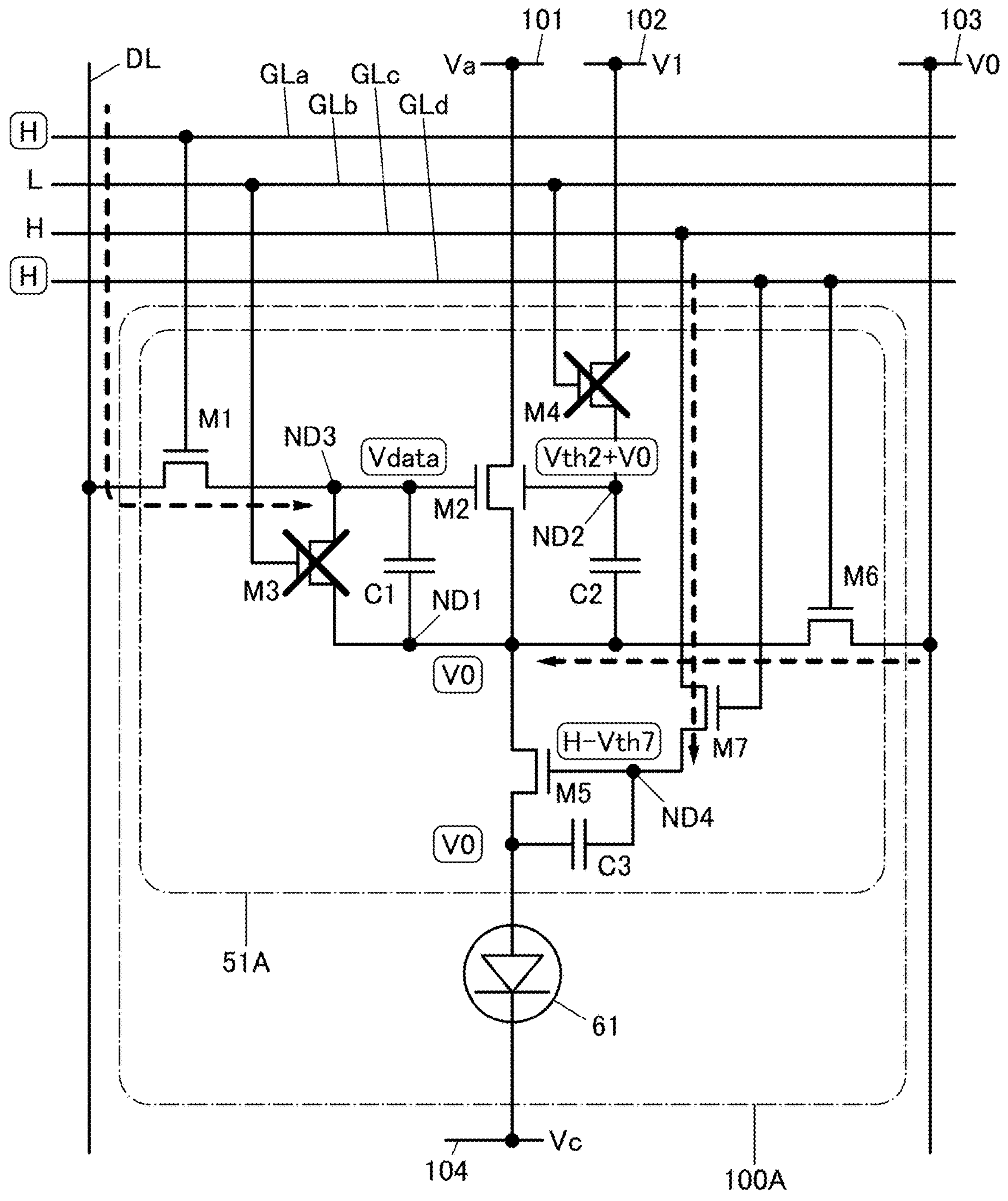
FIG. 11 is a diagram illustrating the operation example of the semiconductor device.

In the period T14, the potential H is supplied to the wiring GLa and the wiring GLd (see FIG. 11). This brings the transistor M1 into the on state. Thus, the video signal Vdata is supplied to the node ND3. In addition, the transistor M6 is brought into the on state. Thus, the potential V0 is supplied to the node ND1.

The node ND1 and the node ND2 are capacitively coupled through the capacitor C2. Therefore, when the potential of the node ND1 changes from V1−Vth2 to V0, the potential of the node ND2 also changes similarly. Since the potential V0 is 0 V in this embodiment or the like, the potential of the node ND2 is represented by the potential V1−(the potential V1−Vth2). That is, the potential of the node ND2 becomes Vth2.

Furthermore, the transistor M7 is brought into the on state. Thus, charge is supplied from the wiring GLc to the node ND4. This makes the potential of the node ND4 increase to a value obtained by subtracting Vth7 of the transistor M7 from the potential H. In this embodiment or the like, the potential H is 6 V. Assuming that Vth5 of the transistor M5 and Vth7 of the transistor M7 are each 1 V, the potential of the node ND4 (the potential H-Vth7) is 5 V. This brings the transistor M5 into the on state. Thus, the potential of the anode terminal of the light-emitting element 61 becomes the potential V0.

[Light-Emitting Operation]

Figure 12:
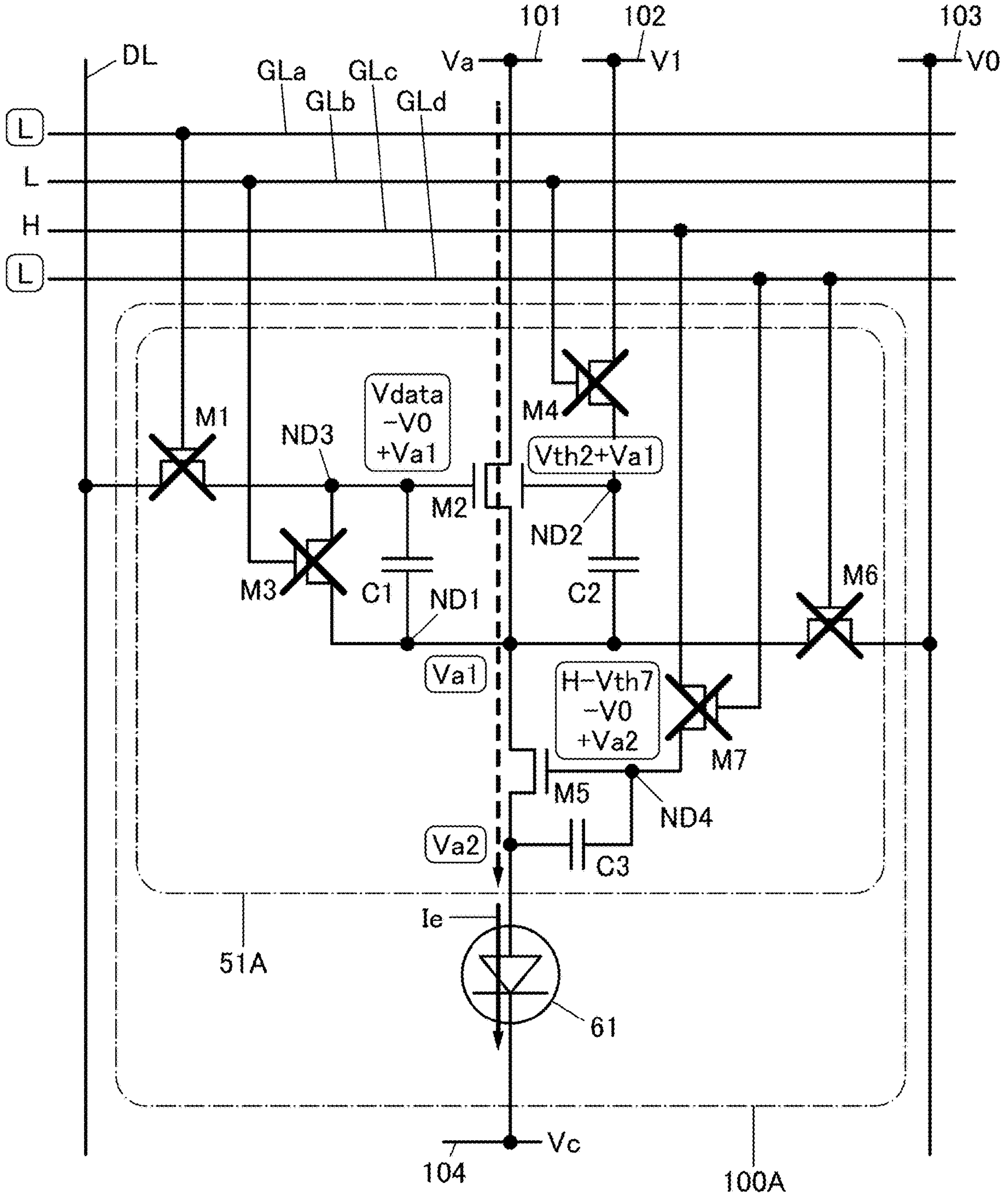
FIG. 12 is a diagram illustrating the operation example of the semiconductor device.

In a period T15, the potential L is supplied to the wiring GLa and the wiring GLd (see FIG. 12). This brings the transistor M1 and the transistor M6 into the off state. Thus, a current flows from the wiring 101 to the wiring 104. That is, the current Ie flows through the light-emitting element 61. Thus, the light-emitting element 61 emits light with a luminance corresponding to the current Ie. The flow of current from the wiring 101 to the wiring 104 increases the potentials of the node ND1 and the anode terminal of the light-emitting element 61.

The node ND3 is in a floating state, and the node ND1 and the node ND3 are capacitively coupled through the capacitor C1. Thus, when the potential of the node ND1 changes from the potential V0 to a potential Va1, the potential of the node ND3 also changes similarly. In this embodiment or the like, the potential of the node ND3 becomes the video signal Vdata+the potential Va1. That is, even when the source potential of the transistor M2 changes, the difference in potential (voltage) between the gate of the transistor M2 and the source of the transistor M2 is maintained at the video signal Vdata.

Similarly, the node ND2 is in a floating state, and the node ND1 and the node ND3 are capacitively coupled through the capacitor C1. Thus, the potential of the node ND2 becomes Vth2+the potential Va1 in accordance with a change in the potential of the node ND1. The difference in potential between the back gate of the transistor M2 and the source of the transistor M2 is maintained at Vth2.

Furthermore, the transistor M7 is brought into the off state and the node ND4 is brought into a floating state. The anode terminal of the light-emitting element 61 and the node ND4 are capacitively coupled through the capacitor C3. Thus, when the potential of the anode terminal of the light-emitting element 61 changes from the potential V0 to a potential Va2, the potential of the node ND4 also changes similarly. Since the potential V0 is 0 V in this embodiment or the like, the potential of the node ND4 becomes the potential H−Vth7+the potential Va2. That is, even when the potential of the anode terminal of the light-emitting element 61 changes, the difference in potential (voltage) between the gate of the transistor M5 and the source of the transistor M5 is maintained at the potential H−Vth7.

For example, in the case where the gate of the transistor M5 has a fixed potential, an increase in the source potential of the transistor M5 reduces the potential difference between the gate of the transistor M5 and the source of the transistor M5. When the potential difference between the gate of the transistor M5 and the source of the transistor M5 falls below the threshold voltage of the transistor M5, the transistor M5 is brought into the off state. In the case where the anode potential is set higher, the fixed potential supplied to the gate of the transistor M5 needs to be set higher; thus, a power source or power supply circuit is additionally required.

In the semiconductor device 100A of one embodiment of the present invention, the capacitor C3 is provided between the gate of the transistor M5 and the source of the transistor M5 so that a bootstrap circuit can be formed; thus, even when the anode potential is increased, the on state of the transistor M5 is maintained without addition of a power supply circuit. Accordingly, the current Ie is stably supplied to the light-emitting element 61. Note that the capacitor C3 is sometimes referred to as a “bootstrap capacitor”. The capacitor C1 and the capacitor C2 each also function as a bootstrap capacitor.

The semiconductor device 100A of one embodiment of the present invention is suitably used not only in a light-emitting element having a single structure but also in a light-emitting element having a tandem structure that requires a higher driving voltage than the light-emitting element having a single structure. Note that the structures of a light-emitting element will be described later.

As described above, the amount of current Ie flowing through the light-emitting element 61 is determined by the video signal Vdata and Vth2 of the transistor M2. When the Vth value correction operation is performed in the semiconductor device 100A of one embodiment of the present invention, the amount of current Ie flowing through the light-emitting element 61 is controlled by the video signal Vdata.

The emission luminance of the light-emitting element 61 is controlled by the video signal Vdata. Therefore, the transistor M5 needs to be surely in the on state at the time of the light-emitting operation. In the semiconductor device 100A of one embodiment of the present invention, the transistor M5 can be surely in the on state at the time of the light-emitting operation. When the semiconductor device 100A of one embodiment of the present invention is used for a display apparatus, the current Ie can be accurately controlled, so that the color reproducibility of halftones of the display apparatus can be increased. Consequently, the display quality of the display apparatus can be improved.

[Quenching Operation]

Figure 13:
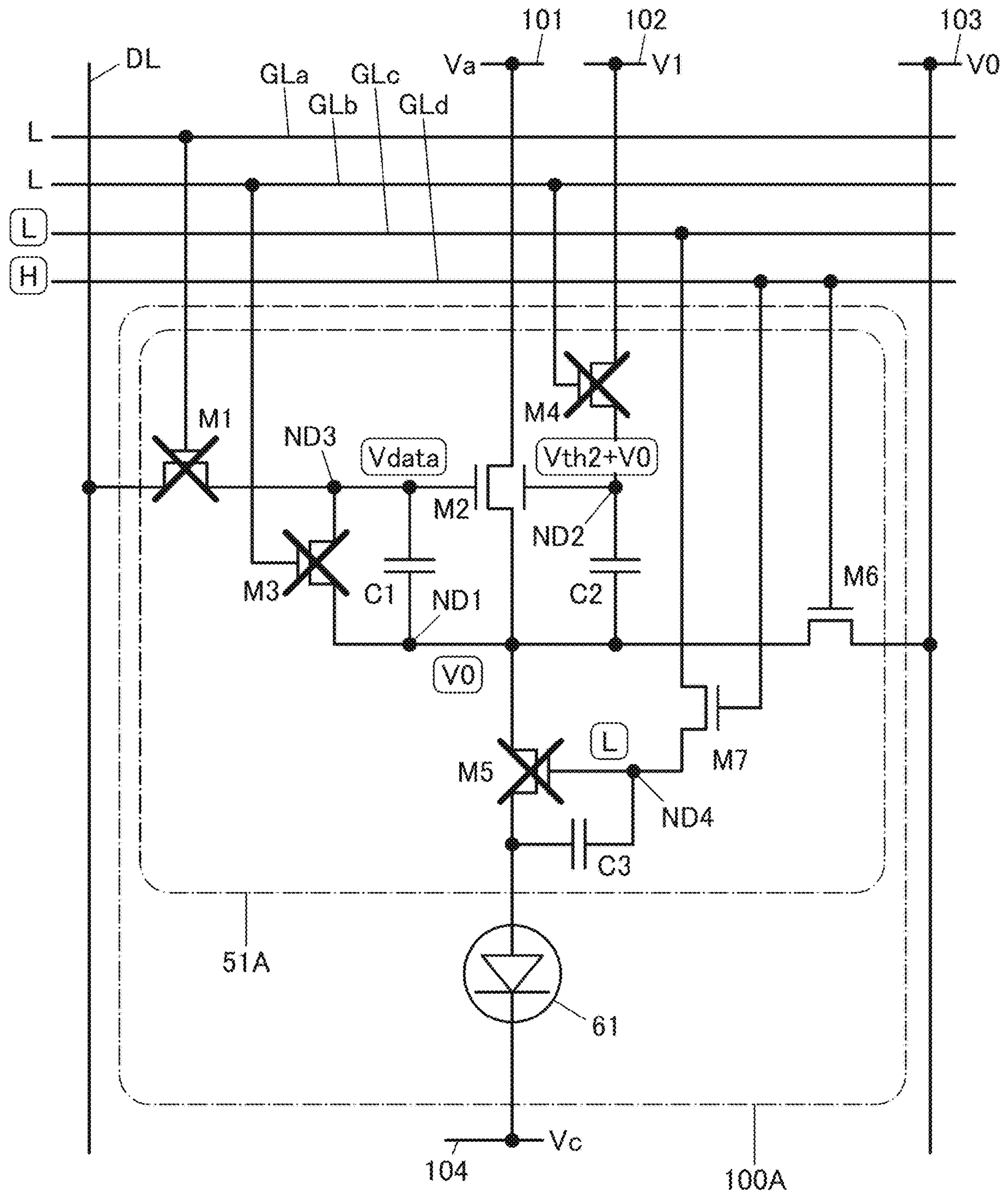
FIG. 13 is a diagram illustrating the operation example of the semiconductor device.

In a period T16, the potential H is supplied to the wiring GLd, and the potential L is supplied to the wiring GLc (see FIG. 13). Thus, the transistor M6 and the transistor M7 are brought into the on state, and the potential L is supplied from the wiring GLc to the node ND4. This brings the transistor M5 into the off state. When the transistor M5 is brought into the off state, a current stops flowing through the light-emitting element 61; thus, light emission from the light-emitting element 61 is stopped (quenching).

In a display apparatus using a light-emitting element such as an EL element, for example, as a display element, the light-emitting element can continuously emit light during one frame period. Such a driving method is also referred to as a “hold type” or “hold-type driving”. When the hold-type driving is used as a driving method of a display apparatus, a flicker phenomenon or the like on a display screen can be reduced, for example. However, the hold-type driving is likely to cause, for example, an afterimage, an image blur, and the like in moving image display. The definition that is perceived by a person in displaying moving images is also referred to as “moving image definition”. That is, the hold-type driving is likely to decrease the moving image definition.

In addition, “black insertion driving” is known as a technique that reduces, for example, an afterimage, an image blur, and the like in moving image display. The “black insertion driving" is also referred to as a "pseudo impulsive type" or "pseudo impulsive driving". The black insertion driving refers to a driving method in which black display is performed in every other frame or a driving method in which black display is performed for a certain period in one frame.

The semiconductor device 100A of one embodiment of the present invention easily achieves the black insertion driving by the quenching operation. Therefore, in a display apparatus using the semiconductor device 100A of one embodiment of the present invention, the moving image definition is unlikely to decrease. Thus, the semiconductor device 100A of one embodiment of the present invention enables high-quality moving image display.

During the period of quenching operation, the transistor M5 is in the off state. Thus, even when the potential of the node ND1 changes, the potential change does not hinder the quenching operation. Furthermore, also in the period of Vth correction operation, the transistor M5 is in the off state. Although the Vth correction operation and the quenching operation are described as different periods in this operation example, the Vth correction operation may be performed in the period of quenching operation.

<Driving Example 1>

Next, a driving example of a display apparatus in which the semiconductor devices 100A of one embodiment of the present invention is used in pixels is described. Although the details are described later, the display apparatus includes a plurality of pixels arranged in a matrix. The semiconductor devices 100A may be used in the pixels of the display apparatus. In that case, the plurality of semiconductor devices 100A may be electrically connected to the wiring DL.

For example, in the case of a display apparatus in which pixels are arranged in a matrix of n rows and m columns (n and m are each an integer more than or equal to 1), n rows of semiconductor devices 100A are electrically connected to the wiring DL. In one frame period, the n rows of semiconductor devices 100A may be sequentially selected at least one by one and the selected semiconductor devices 100A may be subjected to the Vth correction operation, the data writing operation, the light-emitting operation, and the quenching operation described above.

Figure 14:
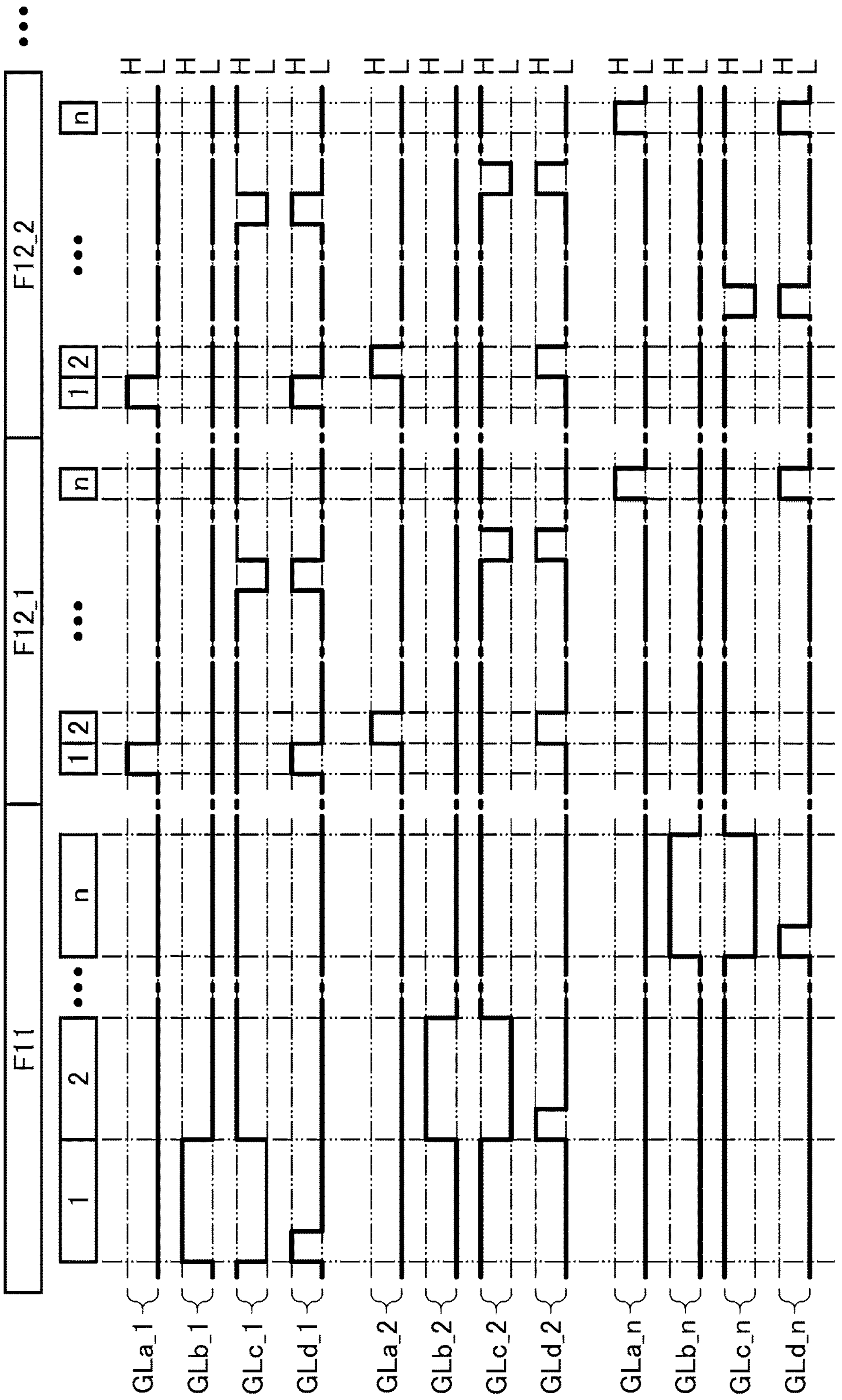
FIG. 14 is a timing chart illustrating a method for driving semiconductor devices.

FIG. 14 illustrates an example of a timing chart for describing driving of the n rows of semiconductor devices 100A. In this embodiment or the like, the semiconductor device 100A in a p-th row (p is an integer more than or equal to 1 and less than or equal to n) is referred to as a semiconductor device 100A_p. The transistor M1 to the transistor M7 included in the semiconductor device 100A_p are referred to as a transistor M1_*p* to a transistor M7_*p* in some cases. The capacitor C1 to the capacitor C3 included in the semiconductor device 100A_p are referred to as a capacitor C1_*p* to a capacitor C3_*p* in some cases. The wiring GLa, the wiring GLb, the wiring GLc, and the wiring GLd electrically connected to the semiconductor device 100A_p are referred to as a wiring GLa_p, a wiring GLb_p, a wiring GLc_p, and a wiring GLd_p in some cases. The node ND1 to the node ND4 included in the semiconductor device 100A_p are referred to as a node ND1_*p* to a node ND4_*p* in some cases. The light-emitting element 61 included in the semiconductor device 100A_p is referred to as a light-emitting element 61_*p* in some cases.

In FIG. 14, "F11", "F12_1", and "F12_2" denote frames. In addition, "1", "2", and "n" shown in each frame denote periods for driving the semiconductor device 100A_1, the semiconductor device 100A_2, and the semiconductor device 100A_n, respectively. Note that illustrations of the semiconductor device 100A_3 to the semiconductor device 100A_n−1 are omitted.

In a frame F11, the n rows of semiconductor devices 100A are sequentially selected one by one and the selected semiconductor devices 100A are subjected to the Vth correction operation. A frame in which those operations are performed is referred to as a "correction frame" in some cases. In the correction frame, the potentials of a wiring GLa_1 to a wiring GLa_n are maintained at the potential L.

First, the potential H is supplied to a wiring GLb_1 and a wiring GLd_1, and the potential L is supplied to a wiring GLc_1 (corresponding to the period T11). Next, the potential L is supplied to the wiring GLd_1, so that the threshold voltage of a transistor M2_1 is obtained (corresponding to the period T12). Next, the potential L is supplied to the wiring GLb_1 and the potential H is supplied to the wiring GLc_1, so that the obtained threshold voltage of the transistor M2_1 is retained in a capacitor C2_1 (corresponding to the period T13). Furthermore, the potential H is supplied to a wiring GLb_2 and a wiring GLd_2 and the potential L is supplied to a wiring GLc_2 (corresponding to the period T11). Next, the potential L is supplied to the wiring GLd_2, so that the threshold voltage of a transistor M2_2 is obtained (corresponding to the period T12). Next, the potential L is supplied to the wiring GLb_2 and the potential H is supplied to the wiring GLc_2, so that the obtained threshold voltage of the transistor M2_2 is retained in a capacitor C2_2 (corresponding to the period T13). This operation is repeated for n rows; thus, the threshold voltages of the transistor M2_1 to a transistor M2_*n* are retained in the capacitor C2_1 to a capacitor C2_*n*, respectively.

In each of a frame F12_1 and a frame F12_2, the n rows of semiconductor devices 100A are sequentially selected one by one, and the selected semiconductor devices 100A are subjected to the data writing operation, the light-emitting operation, and the quenching operation. After the frame F12_1 is executed, the frame F12_2 is performed. The frame in which those operations are performed is referred to as a "display frame" in some cases. In the display frames, the potentials of the wiring GLb_1 to a wiring GLb_n are maintained at the potential L. Therefore, the threshold voltages of the transistor M2_1 to the transistor M2_*n* retained respectively in the capacitor C2_1 to the capacitor C2_*n* are maintained.

In each of the frame F12_1 and the frame F12_2, first, the potential H is supplied to the wiring GLa_1, the wiring GLc_1, and the wiring GLd_1, so that the video signal Vdata is supplied to a node ND3_1 (corresponding to the period T14). Next, the potential L is supplied to the wiring GLa_1 and the wiring GLd_1, so that a light-emitting element 61_1 emits light (corresponding to the period T15). Furthermore, the potential H is supplied to the wiring GLa_2, the wiring GLc_2, and the wiring GLd_2, so that the video signal Vdata is supplied to a node ND3_2 (corresponding to the period T14). Next, the potential L is supplied to the wiring GLa_2 and the wiring GLd_2, so that a light-emitting element 61_2 emits light (corresponding to the period T15). This operation is repeated for n rows; thus, the light-emitting element 61_1 to a light-emitting element 61_*n* can each emit light.

Furthermore, in each of the frame F12_1 and the frame F12_2, the potential L is supplied to the wiring GLc_1 and the potential H is supplied to the wiring GLd_1, so that the light-emitting element 61_1 stops emitting light (corresponding to the period T16). Next, the potential H is supplied to the wiring GLc_1 and the potential L is supplied to the wiring GLd_1, so that the light-emitting element 61_1 keeps stopping light emission. Furthermore, the potential L is supplied to the wiring GLc_2 and the potential H is supplied to the wiring GLd_2, so that the light-emitting element 61_2 stops emitting light (corresponding to the period T16). Next, the potential H is supplied to the wiring GLc_2 and the potential L is supplied to the wiring GLd_2, so that the light-emitting element 61_2 keeps stopping its light emission. This operation is repeated for n rows; thus, the light-emitting element 61_1 to the light-emitting element 61_*n* can each stop light emission.

As described above, time that is enough to perform the Vth correction operation is preferably set as the correction frame period. For example, the correction frame period is preferably longer than or equal to 33.3 ms, further preferably longer than or equal to 1 s. In order to increase the display quality, the display frame period is preferably short. For example, when the frame frequency is 120 Hz, the display frame period can be 8.33 ms. When the frame frequency is 360 Hz, the display frame period can be 2.78 ms.

In the driving example illustrated in FIG. 14, the frame F11 as the correction frame is performed right after the start-up of the display apparatus, the frame F12_1 as the display frame is performed after the frame F11 is finished, and the frame F12_2 as the display frame is performed after the frame F12_1 is finished. Although not illustrated, the next display frame is repetitively performed after the frame F12_2 is finished. The continuous execution of display frames allows display of a moving image. By execution of the correction frame before the display frames are started, an enough correction frame period is secured. Thus, the display quality of the display apparatus is increased.

The correction frame is executed as necessary. For example, the correction frame may be executed every certain period. For example, the correction frame may be executed every time the display frame has been executed a determined number of times. In the correction frame period, since the transistors M5 are in the off state, quenching of the light-emitting element 61_1 to the light-emitting element 61_*n* is maintained. Thus, execution of the correction frame every time the display frame has been executed a determined number of times may cause flicker in the display. Moreover, the execution frequency of the data writing operation of the display frame is reduced by the length of the correction frame period. Therefore, the correction frame period is preferably short. In addition, the interval between the executed correction frames is preferably long. For example, the correction frame is preferably executed every time the display frame has been executed 3 or more times, further preferably 10 or more times.

Although an example in which the Vth correction operation in the correction frame period is sequentially performed row by row here, the present invention is not limited thereto. Since the potential of the wiring DL is fixed in the correction frame period, the Vth correction operation may be performed simultaneously in a plurality of rows or in all the rows. The simultaneous performance of the Vth correction operation in a plurality of rows or in all the rows shortens the correction frame period.

In the present driving example, a transistor M4_1 to a transistor M4_*n* are preferably OS transistors. The off-state current of an OS transistor is low. Thus, the threshold voltages of the transistor M2_1 to the transistor M2_*n* retained respectively in the capacitor C2_1 to the capacitor C2_*n* are retained for a long period. Therefore, the number of times the correction frame is executed is reduced.

<Driving Example 2>

Figure 15:
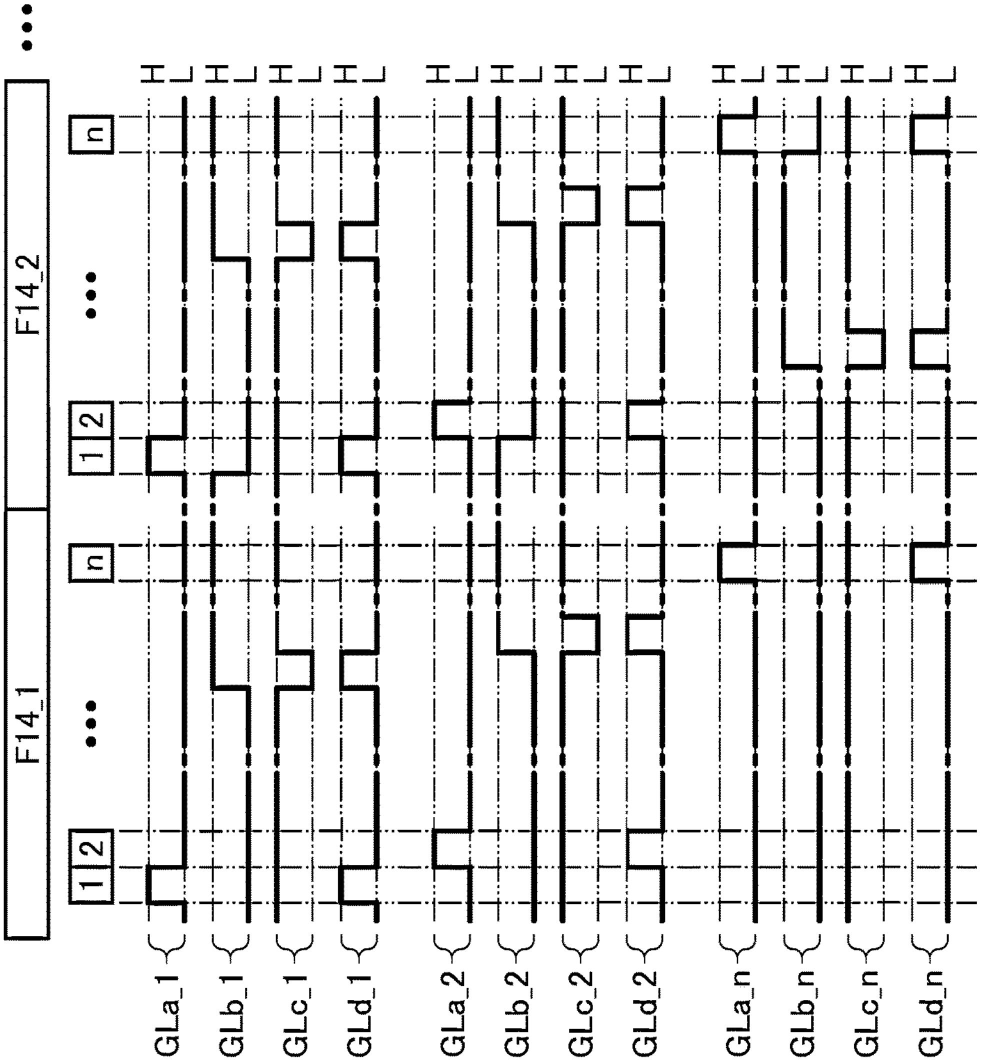
FIG. 15 is a timing chart illustrating a method for driving semiconductor devices.

FIG. 15 illustrates another example of the timing chart for describing driving of the semiconductor device 100A_1 to the semiconductor device 100A_n. In each of a frame F14_1 and a frame F14_2, the n rows of semiconductor devices 100A are sequentially selected one by one, and the selected semiconductor devices 100A are subjected to the data writing operation, the light-emitting operation, and the quenching operation. The Vth correction operation is also performed in a period when the quenching operation is performed. The frame in which those operations are performed is referred to as a "display correction frame" in some cases.

In order to increase the display quality, the display correction frame period is preferably short. For example, when the frame frequency is 120 Hz, the display correction frame period can be 8.33 ms. When the frame frequency is 360 Hz, the display correction frame period can be 2.78 ms. As described later, when the display correction frame is used, no correction frame may be additionally provided. Thus, the execution frequency of the data writing operation is increased. Therefore, the display quality of the display apparatus can be increased.

The display correction frame is similar to the display frame described in the driving example 1 in the data writing operation and the light-emitting operation. The display correction frame is different from the display frame described in the driving example 1 in that the Vth correction operation is also performed in a period when the quenching operation is performed. Here, the difference from the display frame of the driving example 1 is described. First, the potential L is supplied to the wiring GLc_1 and the potential H is supplied to the wiring GLd_1, so that the light-emitting element 61_1 stops emitting light (quenching). Furthermore, the potential H is supplied to the wiring GLb_1, so that Vth correction operation of the semiconductor device 100A_1 is started (corresponding to the period T11). Next, the potential H is supplied to the wiring GLc_1 and the potential L is supplied to the wiring GLd_1, so that quenching of the light-emitting element 61_1 is maintained. The potential of the wiring GLb_1 is maintained at the potential H, so that the threshold voltage of the transistor M2_1 is obtained.

Furthermore, the potential L is supplied to the wiring GLc_2 and the potential H is supplied to the wiring GLd_2, so that the light-emitting element 61_2 stops emitting light. The potential H is supplied to the wiring GLb_2, so that the Vth correction operation of the semiconductor device 100A_2 is started (corresponding to the period T11). Next, the potential H is supplied to the wiring GLc_2 and the potential L is supplied to the wiring GLd_2, so that quenching of the light-emitting element 61_2 is maintained. The potential of the wiring GLb_2 is maintained at the potential H, so that the threshold voltage of the transistor M2_2 is obtained. This operation is repeated for n rows; thus, the threshold voltage of the transistor M2_1 to the transistor M2_*n* are obtained.

In the driving example illustrated in FIG. 15, the frame F14_1 as the display correction frame is performed, and the frame F14_2 as the display correction frame is performed after the frame F14_1 is finished. Although not illustrated, the next display correction frame may be repetitively performed after the frame F14_2 is finished.

For example, in the Vth correction operation of the semiconductor device 100A_p, a period when the threshold voltage of the transistor M2_*p* is obtained can start after the start of the quenching operation and finish before the start of the data writing operation of the next display correction frame. In the period when the threshold voltage of the transistor M2_*p* is obtained, the potential L is supplied to the wiring GLa_p. Accordingly, the transistor M1_*p* is in the off state. Therefore, the data writing operation may be performed on the semiconductor devices 100A in the rows other than the p-th row.

In the display correction frame, the Vth correction operation is performed in every frame. Thus, even in the case where Vth2 of the transistor M2 varies during the operation of the display apparatus, the Vth correction operation is immediately performed. This increases the display quality of the display apparatus. Separate provision of a period for the Vth correction operation is unnecessary. For example, no Vth correction operation may be executed at the start-up of the display apparatus. Thus, the start-up time of the display apparatus is shortened.

The structure described above in this embodiment can be used in combination as appropriate with any of the structures described in the other embodiments and Example.

Embodiment 2

In this embodiment, a semiconductor device 100B of one embodiment of the present invention will be described. The semiconductor device 100B is a variation example of the semiconductor device 100A. Therefore, in order to reduce repeated description, differences of the semiconductor device 100B from the semiconductor device 100A are mainly described.

<Structure Example>

Figure 16:
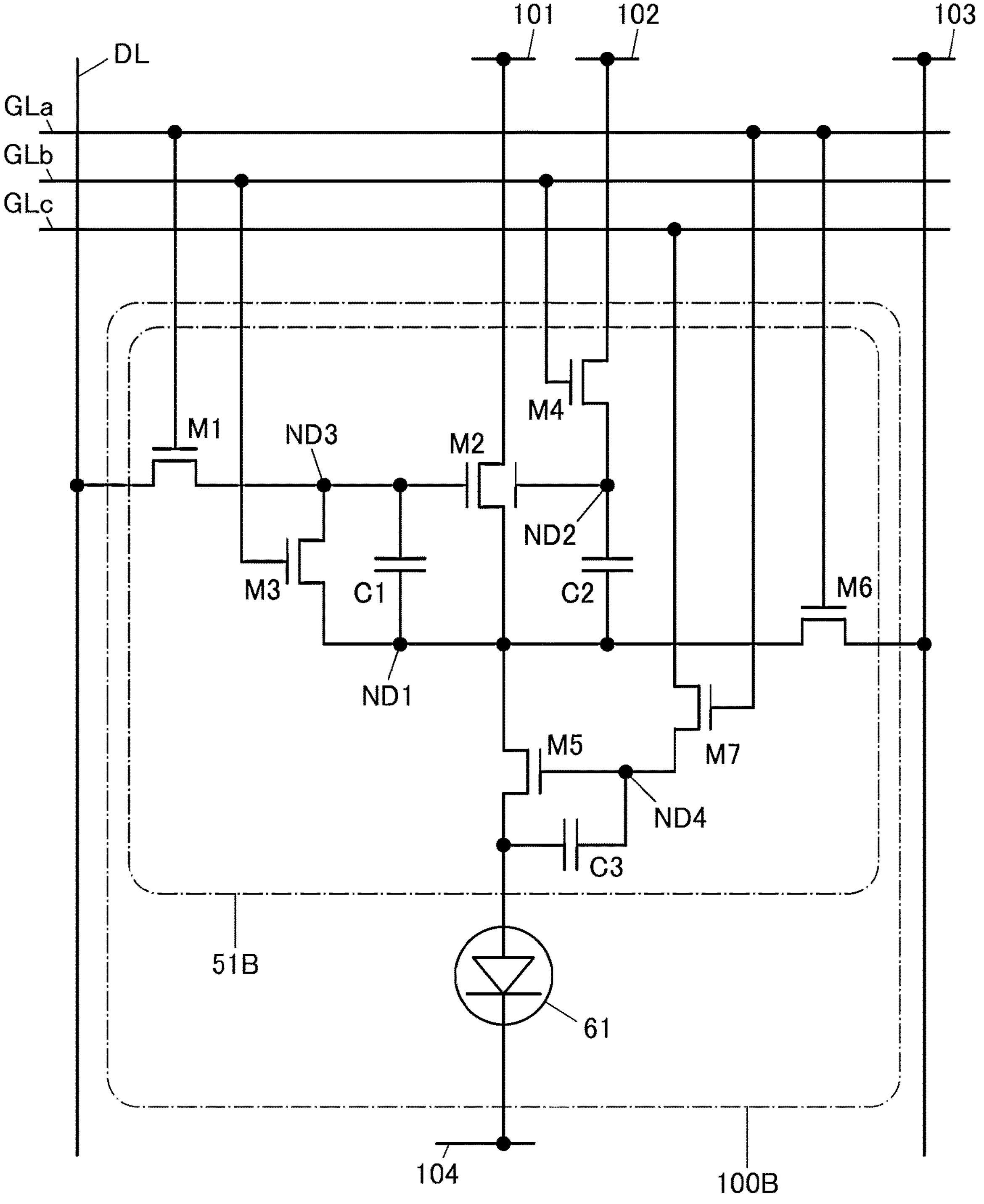
FIG. 16 is a diagram illustrating a semiconductor device.

FIG. 16 illustrates an example of a circuit structure of the semiconductor device 100B. The semiconductor device 100B includes a pixel circuit 51B and the light-emitting element 61. The pixel circuit 51B is different from the pixel circuit 51A in that the gate of the transistor M6 and the gate of the transistor M7 are electrically connected to the wiring GLa. That is, the semiconductor device 100B has a structure not provided with the wiring GLd of the semiconductor device 100A. Since formation of the wiring GLd is omitted, a display apparatus using the semiconductor device 100B of one embodiment of the present invention achieves a high aperture ratio. In addition, a high resolution is achieved. Furthermore, parasitic capacitance is reduced, whereby operation speed is increased.

<Operation Example>

Figure 17:
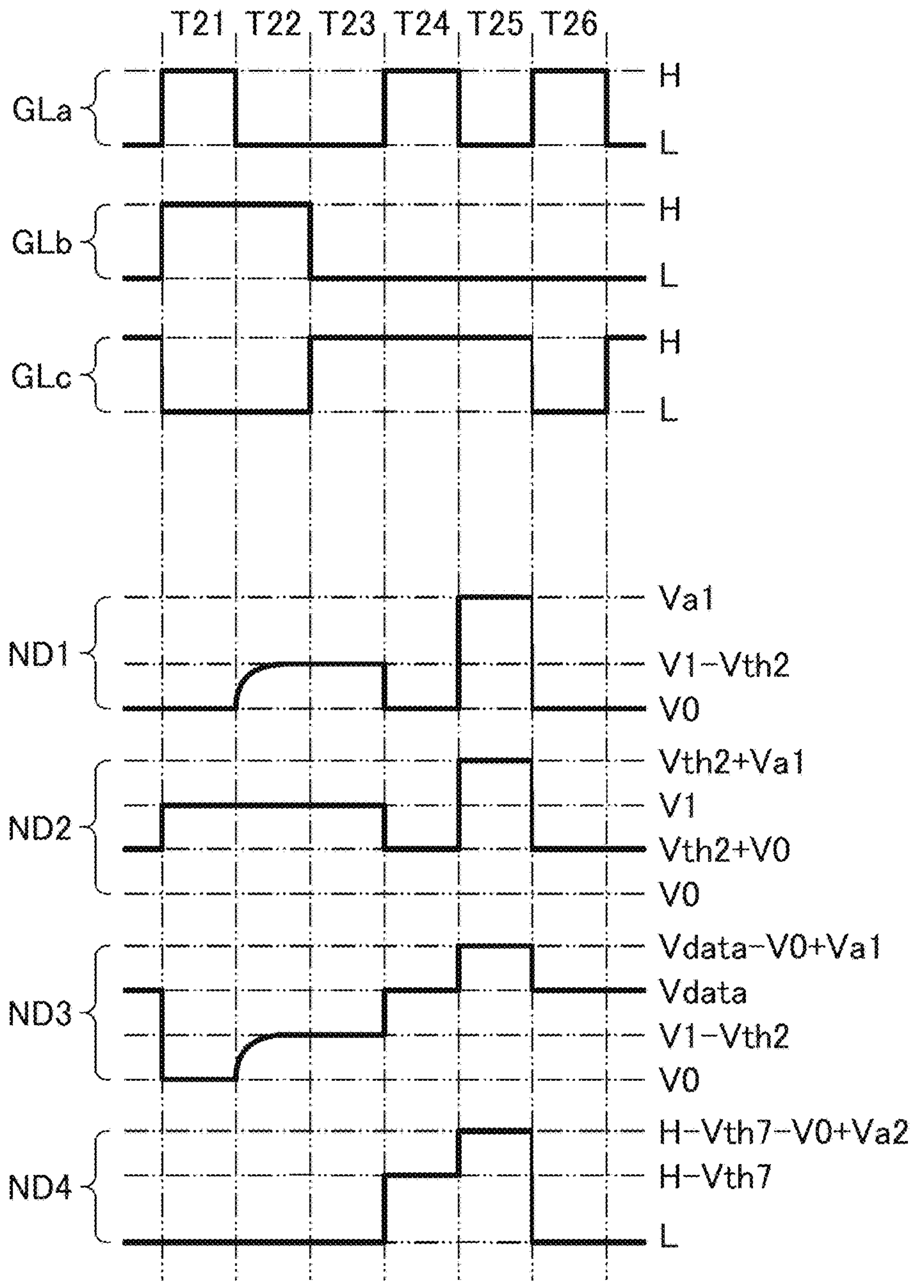
FIG. 17 is a timing chart illustrating an operation of the semiconductor device.
Figure 18:
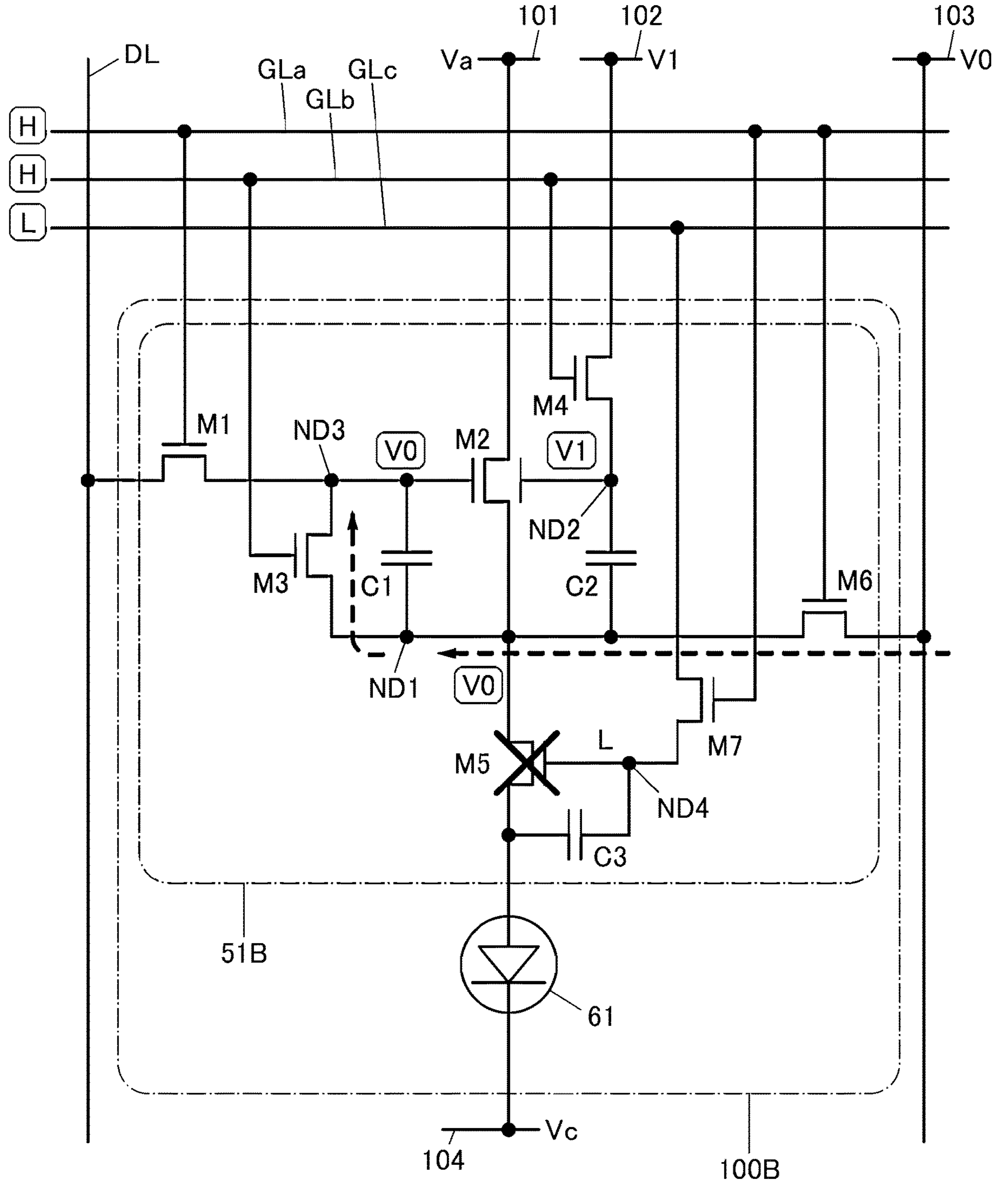
FIG. 18 is a diagram illustrating the operation of the semiconductor device.

Next, an operation example of the semiconductor device 100B is described with reference to drawings. FIG. 17 is a timing chart illustrating an operation example of the semiconductor device 100B. FIG. 18 to FIG. 23 are circuit diagrams for describing the operation example of the semiconductor device 100B.

[Vth Correction Operation]

First, in a period T21, a reset operation is performed in a manner similar to that in the period T11. Specifically, the potential H is supplied to the wiring GLa and the wiring GLb, and the potential L is supplied to the wiring GLc (see FIG. 18). In the period T21, the transistor M1, the transistor M3, the transistor M4, the transistor M6, and the transistor M7 are brought into the on state.

The potential V0 is supplied to the node ND1 through the transistor M6. Furthermore, the potential V0 is supplied to the node ND3 through the transistor M6 and the transistor M3. The potential V1 is supplied to the node ND2 through the transistor M4. The potential L is supplied to the node ND4 through the transistor M7. Accordingly, the transistor M5 is brought into the off state.

In the period T21, electrical continuity is establish between the wiring DL and the wiring 103 through the transistor M1, the transistor M3, and the transistor M6. Thus, it is preferable in the period T21 that the wiring DL and the wiring 103 have the same potential or that the wiring DL is in a floating state.

Figure 19:
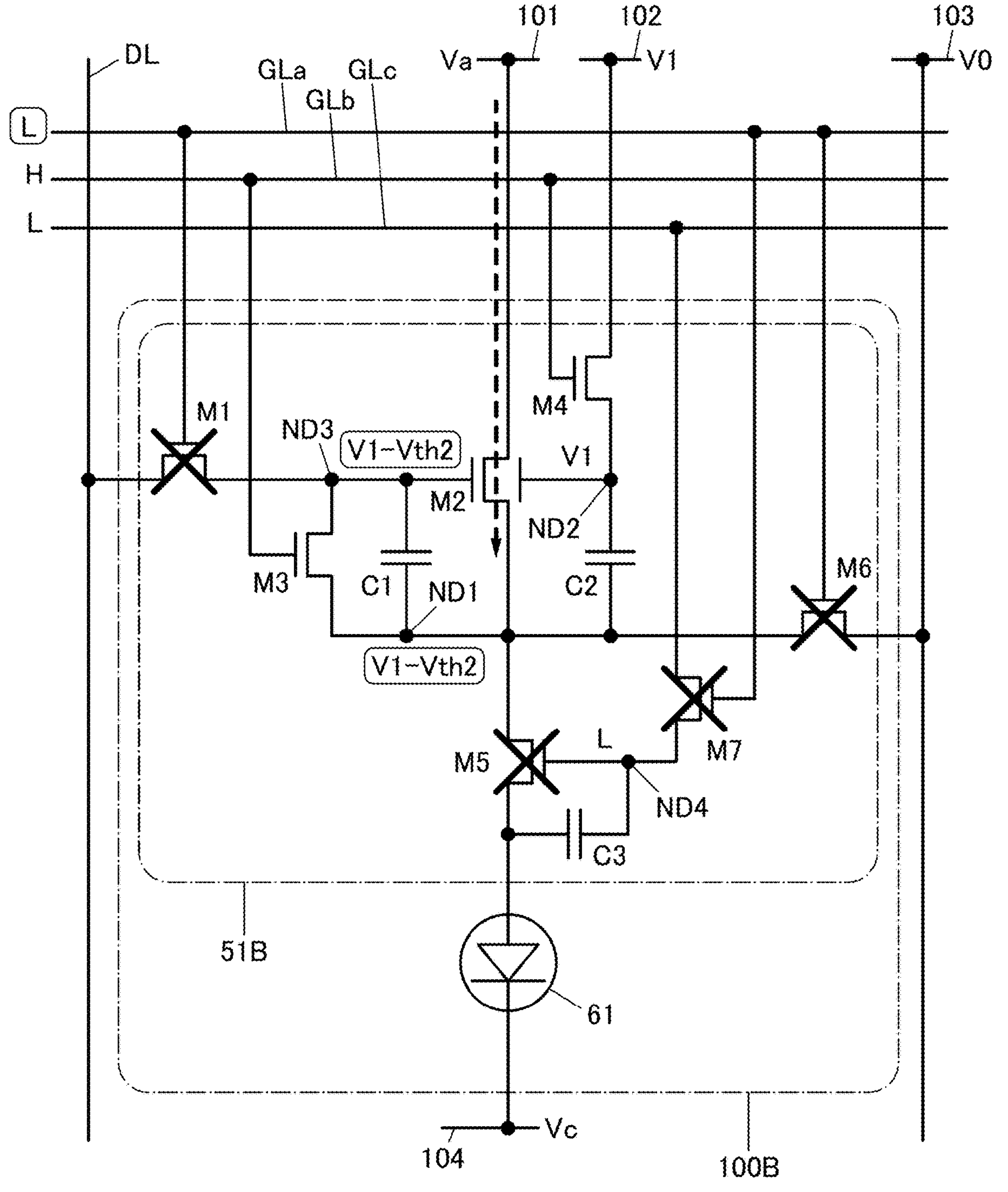
FIG. 19 is a diagram illustrating the operation of the semiconductor device.

Next, in a period T22, the potential L is supplied to the wiring GLa (see FIG. 19). This brings the transistor M1, the transistor M6, and the transistor M7 into the off state. In addition, the node ND4 is brought into a floating state and charge supplied to the node ND4 is retained, so that the off state of the transistor M5 is maintained. As in the above-described period T12, the potentials of the node ND1 and the node ND3 each increase to a value obtained by subtracting Vth2 of the transistor M2 from the potential V1.

Figure 20:
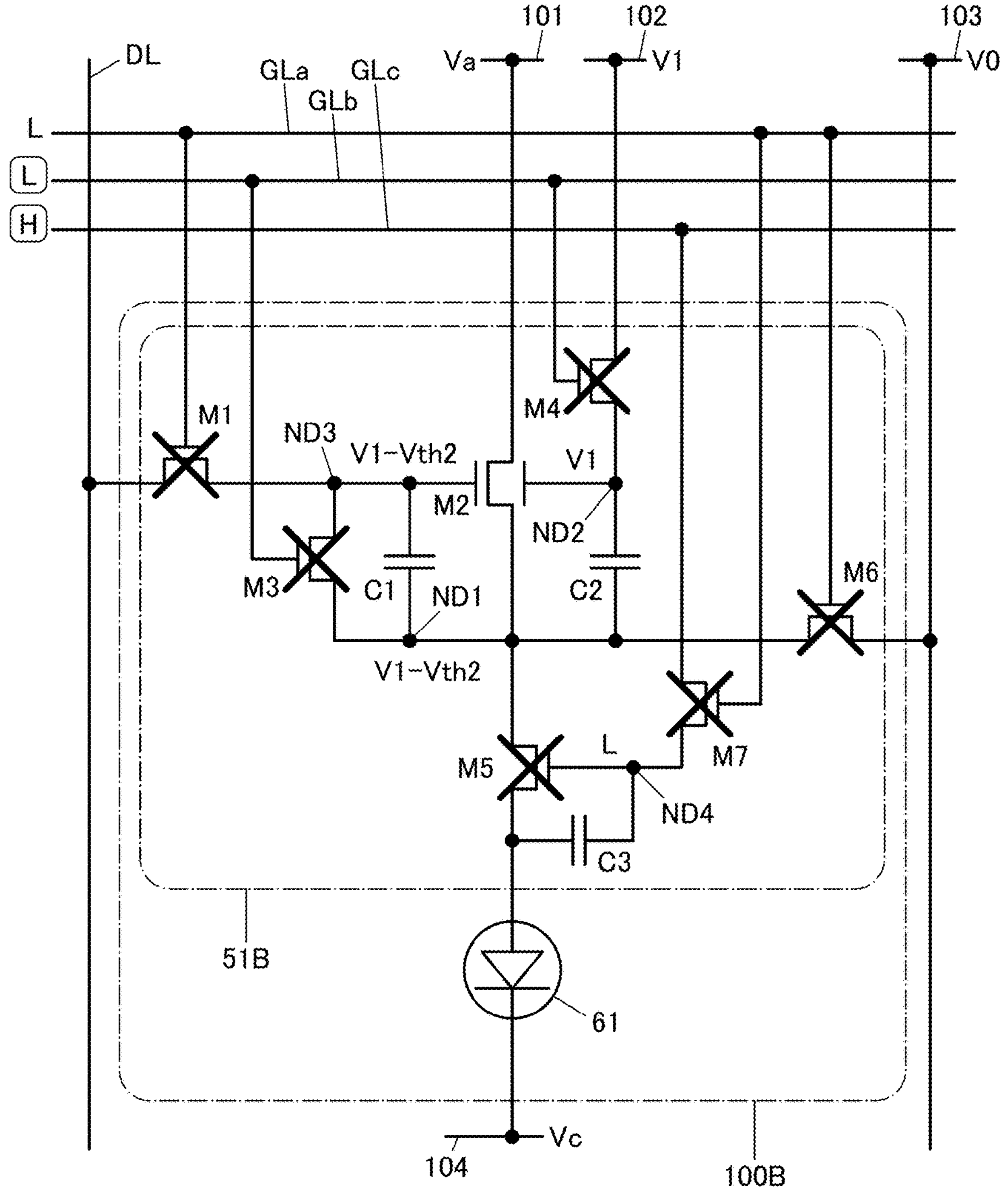
FIG. 20 is a diagram illustrating the operation of the semiconductor device.

Next, in a period T23, the potential L is supplied to the wiring GLb and the potential H is supplied to the wiring GLc (see FIG. 20). This brings the transistor M3 and the transistor M4 into the off state. The node ND1, the node ND2, and the node ND3 are brought into a floating state, and charge supplied to the nodes are retained. In addition, the off state of the transistor M5 is maintained.

[Data Writing Operation]

Figure 21:
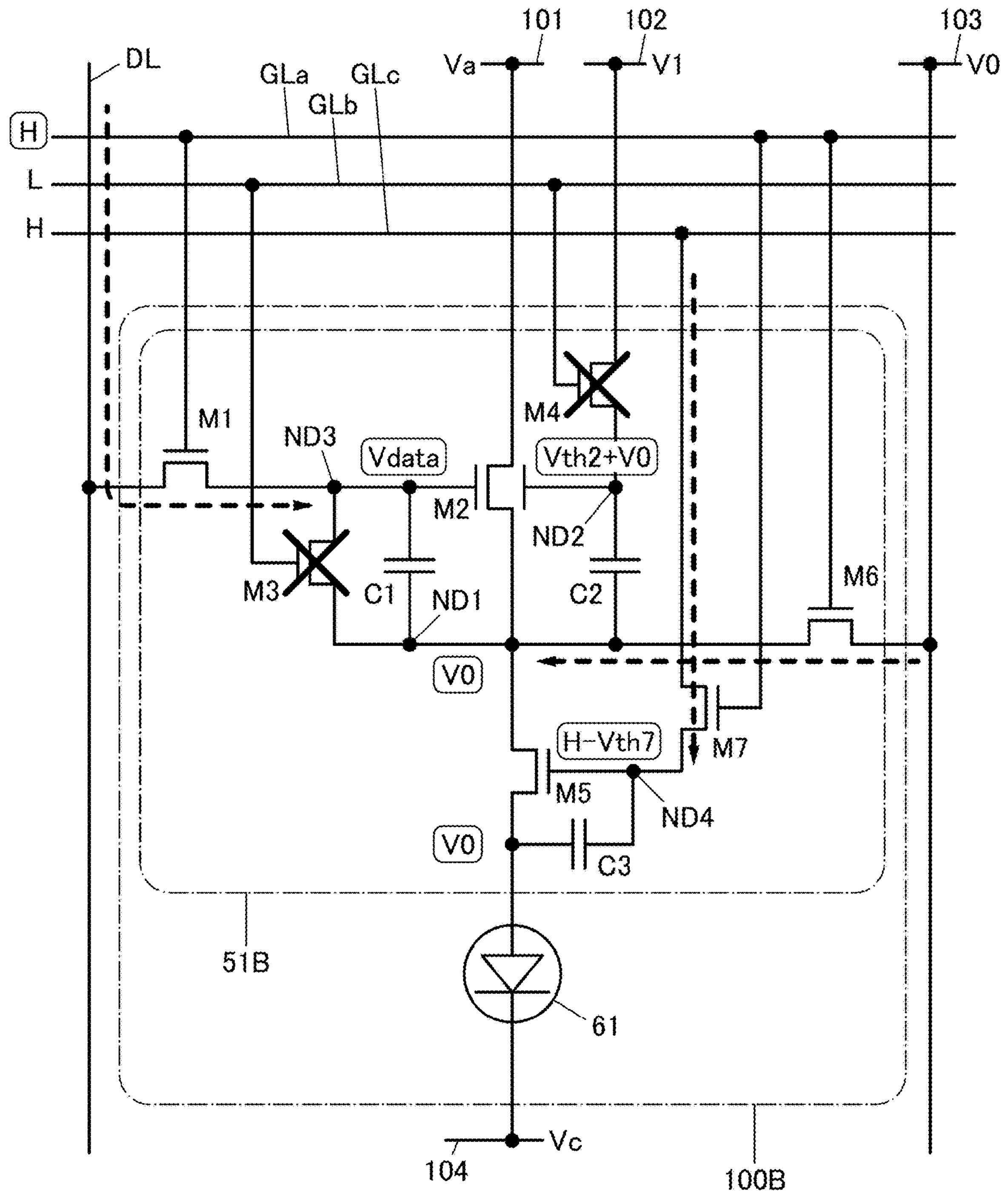
FIG. 21 is a diagram illustrating the operation of the semiconductor device.

In a period T24, the potential H is supplied to the wiring GLa (see FIG. 21). This brings the transistor M1 into the on state, so that the video signal Vdata is supplied to the node ND3. Furthermore, the transistor M6 is brought into the on state, so that the potential V0 is supplied to the node ND1. As in the above-described period T14, the potential of the node ND2 becomes Vth2.

In addition, the transistor M7 is brought into the on state, so that charge is supplied from the wiring GLc to the node ND4. As in the above-described period T14, the transistor M5 is brought into the on state, so that the potential of the anode terminal of the light-emitting element 61 becomes the potential V0.

[Light-Emitting Operation]

Figure 22:
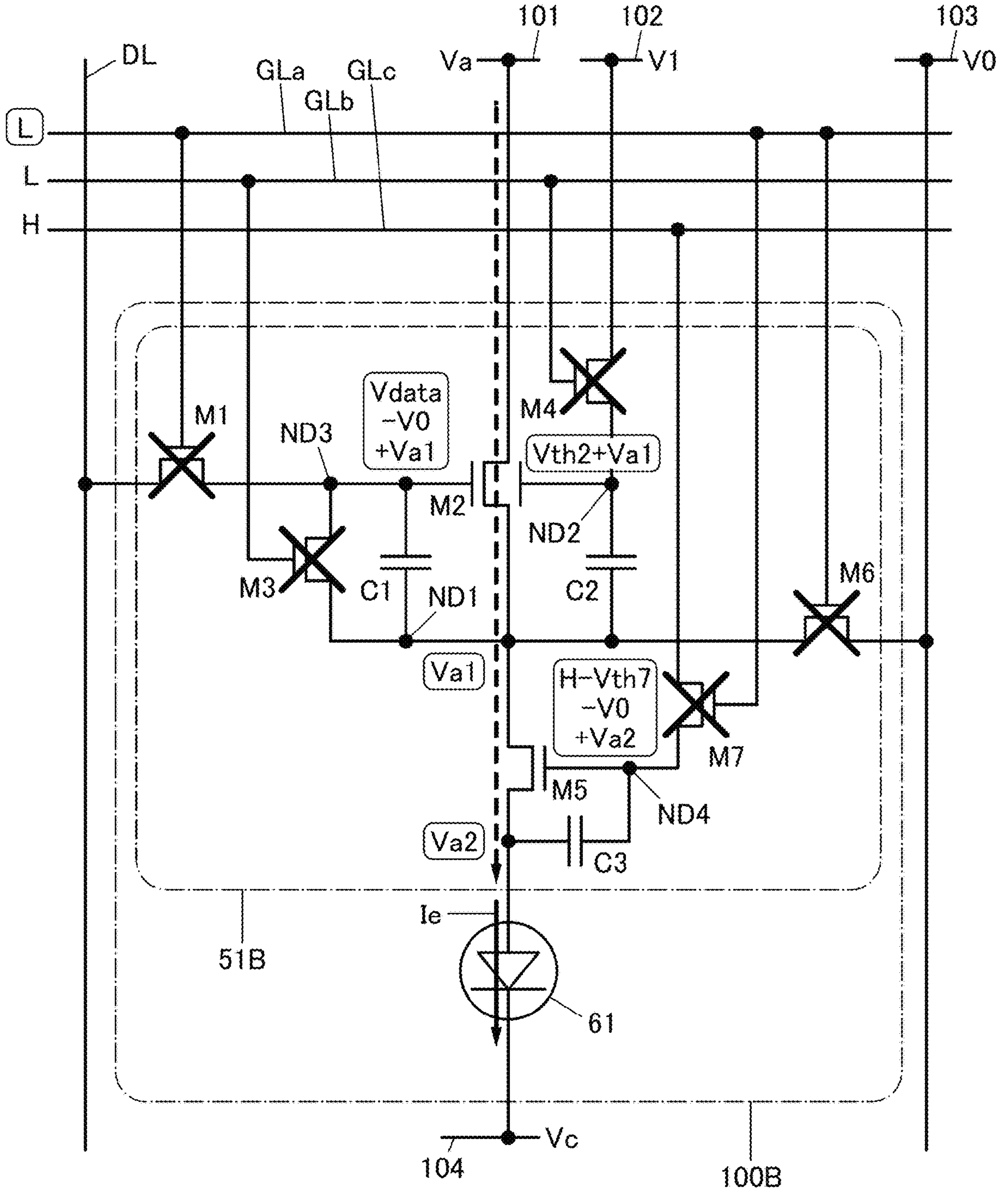
FIG. 22 is a diagram illustrating the operation of the semiconductor device.

In a period T25, the potential L is supplied to the wiring GLa (see FIG. 22). This brings the transistor M1 and the transistor M6 into the off state. As in the above-described period T15, a current flows from the wiring 101 to the wiring 104, and the light-emitting element 61 emits light with a luminance corresponding to the current Ie. At this time, the potentials of the node ND1 and the anode terminal of the light-emitting element 61 increase. The potential of the node ND1 becomes the potential Va1, and the potential of the anode terminal becomes the potential Va2. Furthermore, the potential of the node ND3 becomes the video signal Vdata+the potential Va1, and the potential of the node ND2 becomes Vth2+the potential Va1.

The transistor M7 is brought into the off state, so that the node ND4 is brought into a floating state. As in the above-described period T15, when the potential of the anode terminal of the light-emitting element 61 increases from the potential V0 to the potential Va2, the potential of the node ND4 becomes the potential H−Vth7+the potential Va2. In other words, even when the potential of the anode terminal corresponding to the source side of the transistor M5 increases, the on state of the transistor M5 is surely maintained.

[Quenching Operation]

Figure 23:
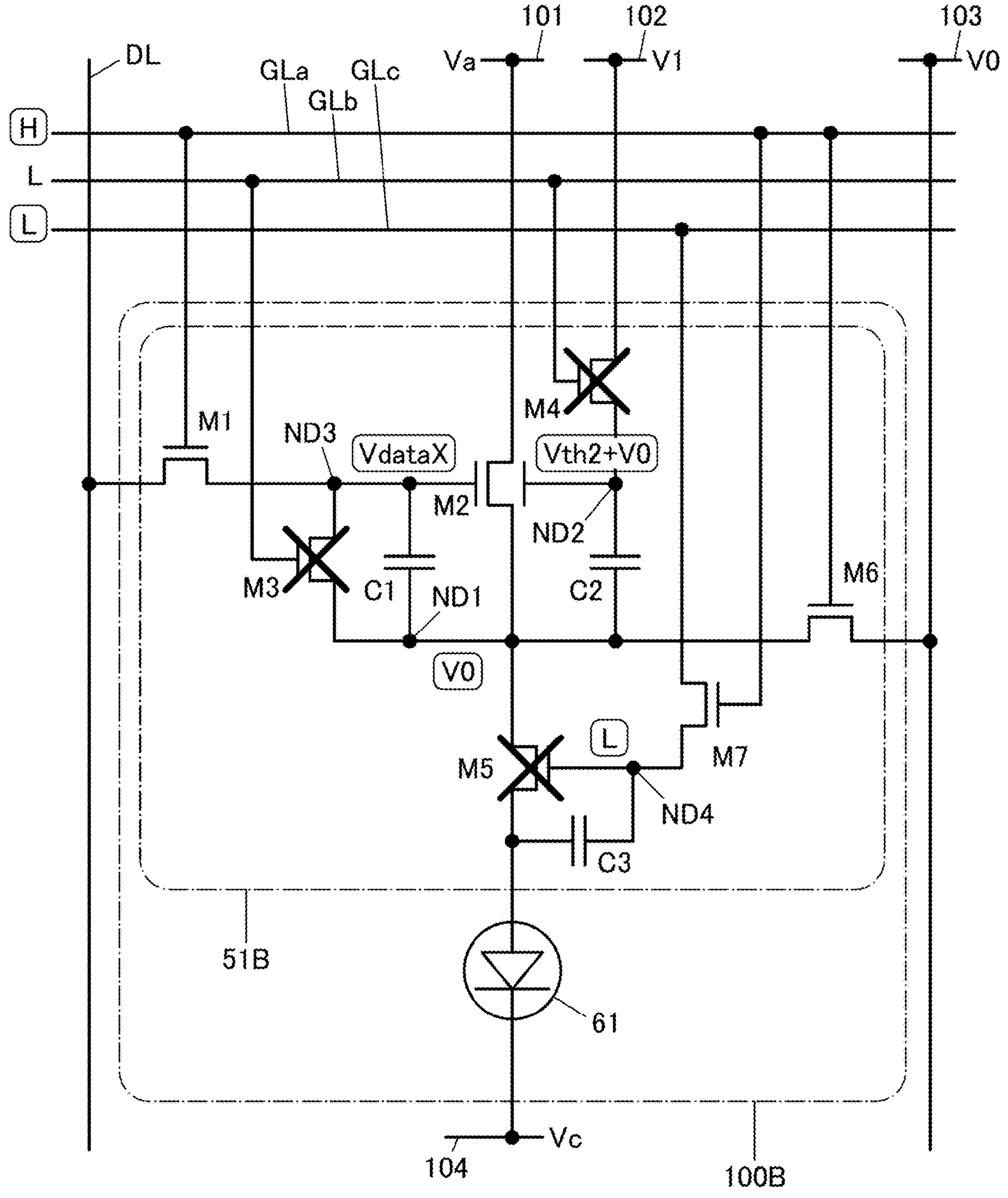
FIG. 23 is a diagram illustrating the operation of the semiconductor device.

In a period T26, the potential H is supplied to the wiring GLa and the potential L is supplied to the wiring GLc (see FIG. 23). This brings the transistor M1, the transistor M6, and the transistor M7 into the on state, so that the potential of the node ND1 becomes the potential V0 and the potential of the node ND4 becomes the L potential. When the potential of the node ND4 becomes the L potential, the transistor M5 is brought into the off state, so that the light-emitting element 61 stops emitting light.

In the period T26, a video signal that is to be written to the other semiconductor device 100B that is electrically connected to the wiring DL might be supplied to the node ND3 through the transistor M1; however, since the transistor M5 is in the off state, the quenching operation is not hindered. The video signal to be written to the other semiconductor device 100B is denoted by VdataX in FIG. 23 so as to be differentiated from the video signal Vdata in the period T24 (data writing operation).

As in the semiconductor device 100A, the semiconductor device 100B may be suitably used not only in a light-emitting element having a single structure but also in a light-emitting element having a tandem structure that requires a higher driving voltage than the light-emitting element having a single structure. In the semiconductor device 100B, black insertion driving may be performed as in the semiconductor device 100A. Therefore, in a display apparatus using the semiconductor device 100B of one embodiment of the present invention, the moving image definition is unlikely to decrease. Thus, a display apparatus capable of high-quality moving image display is achieved.

<Driving Example 1>

Figure 24:
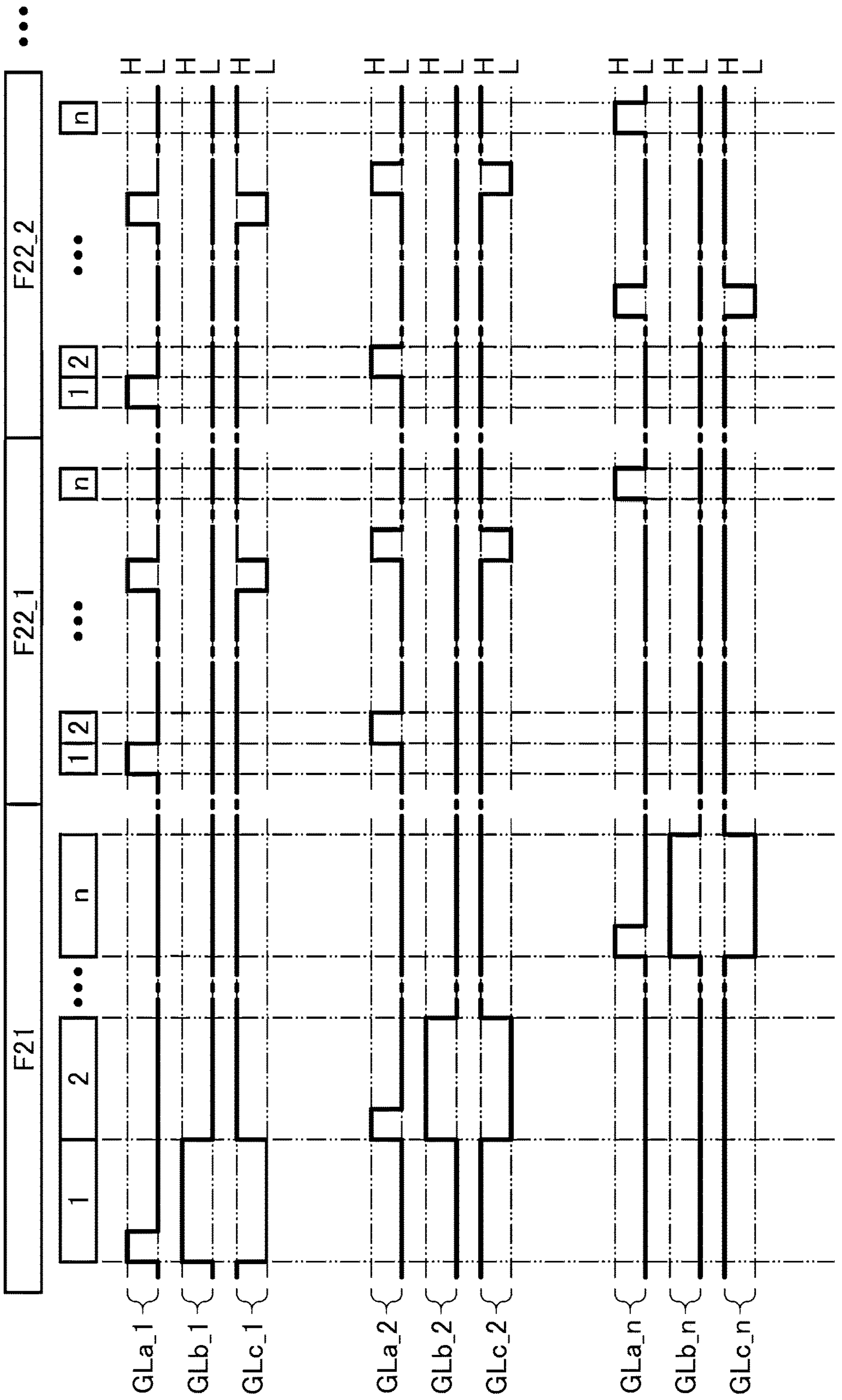
FIG. 24 is a timing chart illustrating a method for driving semiconductor devices.

Next, a driving example of a display apparatus that uses the semiconductor device 100B of one embodiment of the present invention in its pixel is described. FIG. 24 illustrates an example of a timing chart for describing driving of the n rows of semiconductor devices 100B. This driving example is an example of applying the driving example 1 of Embodiment 1 to driving of the display apparatus that uses the semiconductor device 100B; therefore, the description in the driving example 1 of Embodiment 1 can be appropriately referred to. Here, points of this driving example that are different from those of the driving example 1 of Embodiment 1 are mainly described.

A frame F21 is a correction frame. In the frame F21, a semiconductor device 100B_1 to the semiconductor device 100B_n are sequentially selected row by row and the selected semiconductor devices 100B are subjected to the Vth correction operation. First, the potential H is supplied to the wiring GLa_1 and the wiring GLb_1, and the potential L is supplied to the wiring GLc_1 (corresponding to the period T21). Next, the potential L is supplied to the wiring GLa_1, so that the threshold voltage of the transistor M2_1 is obtained (corresponding to the period T22). Next, the potential L is supplied to the wiring GLb_1 and the potential H is supplied to the wiring GLc_1, so that the obtained threshold voltage of the transistor M2_1 is retained in the capacitor C2_1 (corresponding to the period T23). Furthermore, the potential H is supplied to the wiring GLa_2 and the wiring GLb_2 and the potential L is supplied to the wiring GLc_2 (corresponding to the period T21). Next, the potential L is supplied to the wiring GLa_2, so that the threshold voltage of the transistor M2_2 is obtained (corresponding to the period T22). Next, the potential L is supplied to the wiring GLb_2 and the potential H is supplied to the wiring GLc_2, so that the obtained threshold voltage of the transistor M2_2 is retained in the capacitor C2_2 (corresponding to the period T23). This operation is repeated for n rows; thus, the threshold voltages of the transistor M2_1 to the transistor M2_*n* are retained in the capacitor C2_1 to the capacitor C2_*n*, respectively.

In the correction frame, electrical continuity is establish between the wiring DL and the wiring 103 through the transistor M1, the transistor M3, and the transistor M6 included in each of the semiconductor device 100B_1 to the semiconductor device 100B_n. Therefore, during the execution of the correction frame, the same potential as that of the wiring 103 may be supplied to the wiring DL or the wiring DL may be in a floating state. For example, in this embodiment or the like, since the potential V0 supplied to the wiring 103 is 0 V, the video signal Vdata supplied to the wiring DL can be 0 V (potential corresponding to black display) during the execution of the correction frame. Alternatively, a switch can be provided between the wiring DL and a source of the video signal Vdata (e.g., a source driver) and the switch can be set in the nonconduction state during the execution of the correction frame.

A frame F22_1 and a frame F22_2 are each a display frame. In each of the frame F22_1 and the frame F22_2, the semiconductor device 100B_1 to the semiconductor device 100B_n are sequentially selected row by row, and the selected semiconductor devices 100B are subjected to the data writing operation, the light-emitting operation, and the quenching operation. In the display frames, the potentials of the wiring GLb_1 to the wiring GLb_n are maintained at the potential L. Therefore, the threshold voltages of the transistor M2_1 to the transistor M2_*n* retained respectively in the capacitor C2_1 to the capacitor C2_*n* are maintained.

In each of the frame F22_1 and the frame F22_2, first, the potential H is supplied to the wiring GLa_1 and the wiring GLc_1, so that the video signal Vdata is supplied to the node ND3_1 (corresponding to the period T24). Next, the potential L is supplied to the wiring GLa_1, so that the light-emitting element 61_1 emits light (corresponding to the period T25). Furthermore, the potential H is supplied to the wiring GLa_2 and the wiring GLc_2, so that the video signal Vdata is supplied to a node ND3_2 (corresponding to the period T24). Next, the potential L is supplied to the wiring GLa_2, so that the light-emitting element 61_2 emits light (corresponding to the period T25). This operation is repeated for n rows; thus, the light-emitting element 61_1 to the light-emitting element 61_*n* can each emit light.

Furthermore, in each of the frame F22_1 and the frame F22_2, the potential H is supplied to the wiring GLa_1 and the potential L is supplied to the wiring GLc_1, so that the light-emitting element 61_1 stops emitting light (corresponding to the period T26). Next, the potential L is supplied to the wiring GLa_1 and the potential H is supplied to the wiring GLc_1, so that the light-emitting element 61_1 keeps stopping light emission. Furthermore, the potential H is supplied to the wiring GLa_2 and the potential L is supplied to the wiring GLc_2, so that the light-emitting element 61_2 stops emitting light (corresponding to the period T26). Next, the potential L is supplied to the wiring GLa_2 and the potential H is supplied to the wiring GLc_2, so that the light-emitting element 61_2 keeps stopping its light emission. This operation is repeated for n rows; thus, the light-emitting element 61_1 to the light-emitting element 61_*n* can each stop light emission.

In the driving example illustrated in FIG. 24, the frame F21 as the correction frame is performed right after the start-up of the display apparatus, the frame F22_1 as the display frame is performed after the frame F21 is finished, and the frame F22_2 as the display frame is performed after the frame F22_1 is finished. By execution of the correction frame before the display frames are started, an enough correction frame period is secured. Thus, the display quality of the display apparatus is increased.

Note that the correction frame is executed as necessary. For example, the correction frame may be executed every certain period. For example, the correction frame may be executed every time the display frame has been executed a determined number of times. The execution of the correction frame may cause flicker in the display. Moreover, the execution frequency of the data writing operation of the display frame is reduced by the length of the correction frame period. Therefore, the correction frame period is preferably short. In addition, the interval between the executed correction frames is preferably long.

Although an example in which the Vth correction operation in the correction frame period is sequentially performed row by row here, the present invention is not limited thereto. Since the potential of the wiring DL is fixed in the correction frame period, the Vth correction operation may be performed simultaneously in a plurality of rows or in all the rows. The simultaneous performance of the Vth correction operation in a plurality of rows or in all the rows shortens the correction frame period.

Driving Example 2

Figure 25:
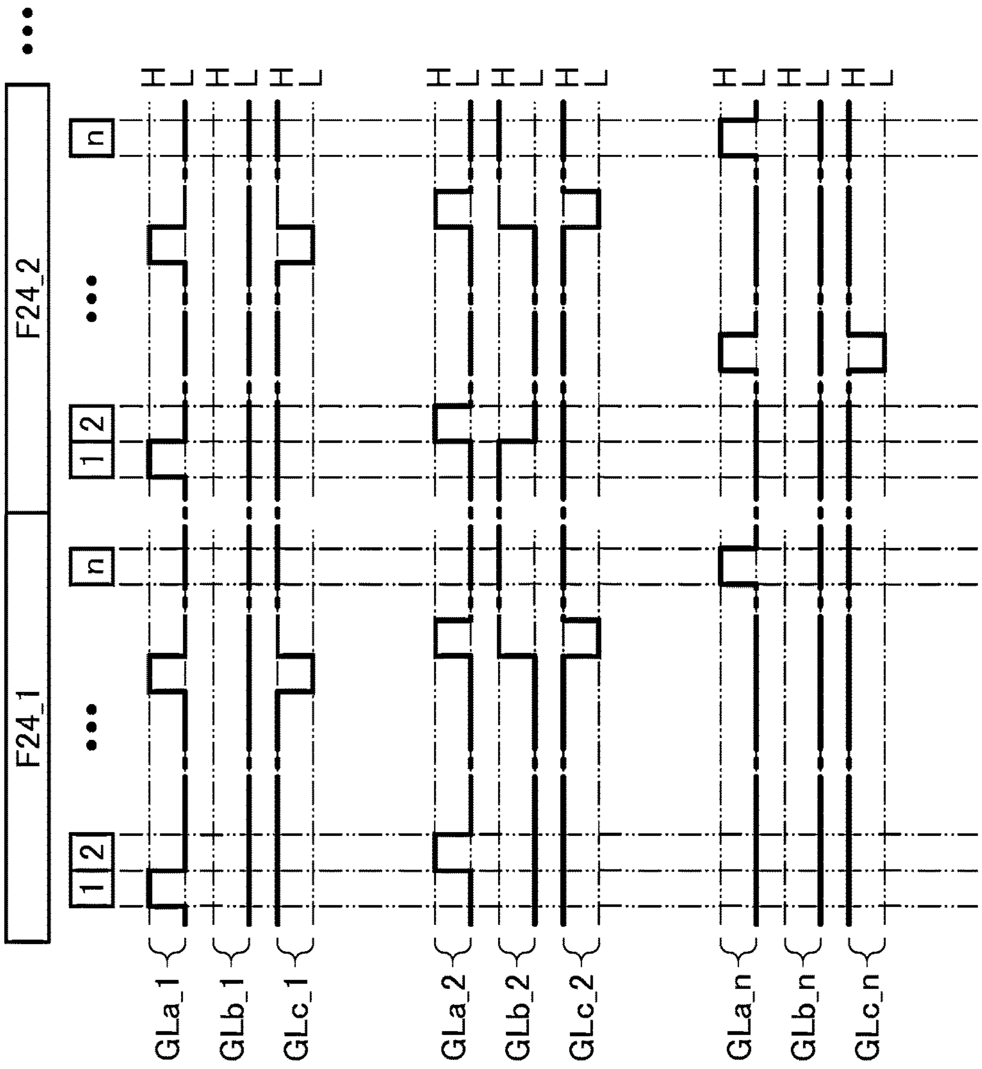
FIG. 25 is a timing chart illustrating a method for driving semiconductor devices.

FIG. 25 is a timing chart for describing another driving example of the semiconductor devices 100B_1 to the semiconductor device 100B_n. This driving example is an example of applying the driving example 2 of Embodiment 1 to driving of the display apparatus that uses the semiconductor device 100B; therefore, the description in the driving example 2 of Embodiment 1 can be appropriately referred to. Here, points of this driving example that are different from those of the driving example 2 of Embodiment 1 are mainly described.

A frame F24_1 and a frame F24_2 are each a display correction frame. In each of the frame F24_1 and the frame F24_2, the semiconductor device 100B_1 to the semiconductor device 100B_n are sequentially selected row by row, and the selected semiconductor devices 100B are subjected to the data writing operation, the light-emitting operation, and the quenching operation. In the case where the potential of the wiring DL is the same as that of the wiring 103 in a period when the quenching operation is performed, the Vth correction operation is also performed. As described above, for example, in the Vth correction operation of a semiconductor device 100B_p in the p-th row (p is an integer more than or equal to 1 and less than or equal to n), the reset operation (corresponding to the period T21) brings the transistor M1_*p*, the transistor M3_*p*, and the transistor M6_*p* into the on state, so that electrical continuity is established between the wiring DL and the wiring 103 (see FIG. 18). Furthermore, in the period when the quenching operation of the semiconductor device 100B_p is performed, the data writing operation of the semiconductor devices 100B in the rows other than the p-th row is performed and therefore the video signal VdataX is supplied to the wiring DL. Moreover, the video signal VdataX supplied to the wiring DL is supplied to the node ND3_*p* through the transistor M1_*p* (see FIG. 23). Therefore, in the case where the potential of the video signal VdataX is the same as the potential V0 supplied to the wiring 103 (a potential corresponding to black display) in the period when the quenching operation is performed, it is preferable to perform the Vth correction operation. In addition, in the case where the potential of the video signal VdataX is different from the potential V0, it is preferable that the Vth correction operation be not performed. For example, in this embodiment or the like, the potential V0 is 0 V. Hence, the following settings are possible: the Vth correction operation is performed in the case where the video signal VdataX is 0 V in the period when the quenching operation is performed, and the Vth correction operation is not performed in the case where the video signal VdataX is other than 0 V in the period when the quenching operation is performed.

FIG. 25 illustrates a timing chart of a case where, for example, the Vth correction operation of the semiconductor device 100B_1 and a semiconductor device 100_*n* is not performed since the video signal VdataX in the first row and the n-th row is other than 0 V and the Vth correction operation of a semiconductor device 100B_2 is performed since the video signal VdataX in the second row is 0 V.

Figure 26:
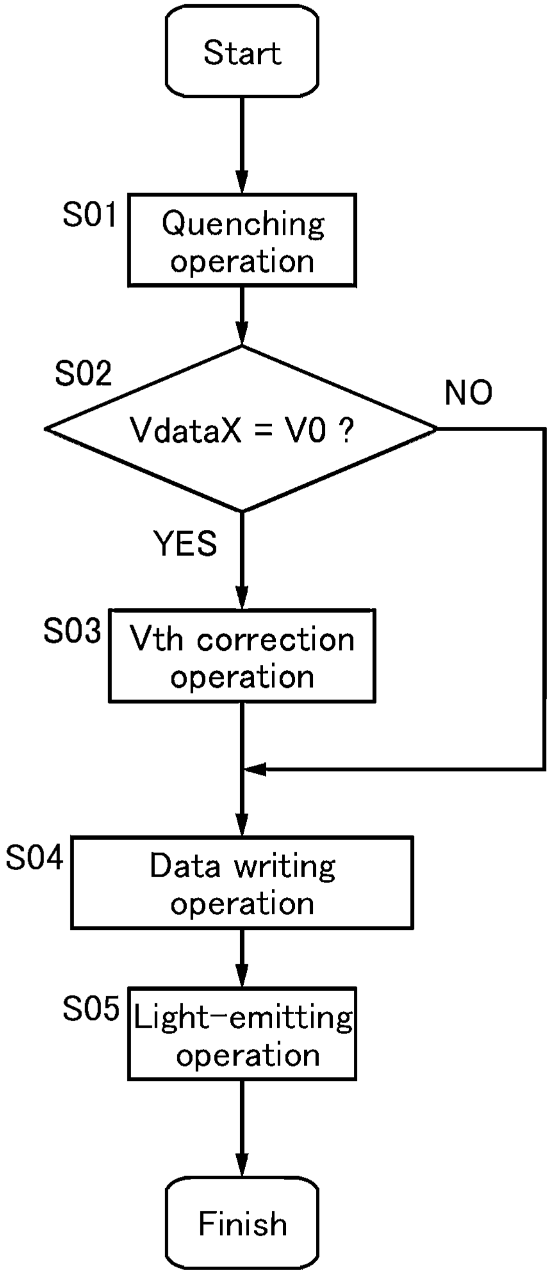
FIG. 26 is a flowchart illustrating a method for driving a semiconductor device.

FIG. 26 is a flowchart for describing an operation of the display correction frame in this driving example. For the description simplicity, the operation of the display correction frame is illustrated from the quenching operation in FIG. 26. By making the quenching operation of the next display correction frame start after the light-emitting operation is finished, the display correction frame may be repetitively performed. Note that a step S01, a step S03, a step S04, and a step S05 correspond to the period T26, the period T21, the period T24, and the period T25, respectively.

In the step S01, the quenching operation of the semiconductor device 100B_p starts. Then in a step S02, whether the potential of the video signal VdataX is the same as the potential V0 is determined. In the case where YES is the result of the determination in the step S02 (the potential of the video signal VdataX is the same as the potential V0), the Vth correction operation starts in the step S03, and the data writing operation in the step S04 is performed after the step S03 is finished. In the case where NO is the result of the determination in the step S02 (the potential of the video signal VdataX is not the same as the potential V0), the Vth correction operation in the step S03 is not performed and the data writing operation in the step S04 is performed. After the step S04 is executed, the light-emitting operation in the step S05 is executed, and the light emission is maintained until the quenching operation in the step S01 of the next display correction frame is started.

In the case where the semiconductor device 100B of one embodiment of the present invention is used in a pixel of a display apparatus, for example, the semiconductor devices 100B are arranged in a matrix of n rows and m columns (n and m are each an integer more than or equal to 1) and m columns of the semiconductor devices 100B are connected to the wiring GLa, the wiring GLb, and the wiring GLc which are provided on the row basis. Thus, the quenching operation and the Vth correction operation are simultaneously performed on all the m columns of semiconductor devices 100B provided on the row basis. Accordingly, the following settings are possible: the Vth correction operation is performed in the case where the video signals VdataX supplied to wirings DL in the m columns are each 0 V (the potential corresponding to black display). Furthermore, the following settings are possible: the Vth correction operation is not performed in the case where at least one of the video signals VdataX supplied to wirings DL in the m columns is not 0 V (the potential corresponding to black display).

In FIG. 25, first, the potential H is supplied to the wiring GLa_1 and the potential L is supplied to the wiring GLc_1, so that the light-emitting element 61_1 stops emitting light (quenching). The potential of the wiring GLb_1 is maintained at the potential L, so that the Vth correction operation of the semiconductor device 100B_1 is not performed. Next, the potential L is supplied to the wiring GLa_1 and the potential H is supplied to the wiring GLc_1, so that quenching of the light-emitting element 61_1 is maintained.

Furthermore, the potential H is supplied to the wiring GLa_2 and the potential L is supplied to the wiring GLc_2, so that the light-emitting element 61_2 stops emitting light. The potential H is supplied to the wiring GLb_2, so that the Vth correction operation of the semiconductor device 100B_2 is started (corresponding to the period T21). Next, the potential L is supplied to the wiring GLa_2 and the potential H is supplied to the wiring GLc_2, so that quenching of the light-emitting element 61_2 is maintained. Furthermore, the potential of the wiring GLb_2 is maintained at the potential H, so that the threshold voltage of the transistor M2_2 is obtained.

In this manner, in the semiconductor device 100B_p, in the case where the Vth correction operation is performed, the potential H is supplied to the wiring GLb_p, and in the case where the Vth correction operation is not performed, the potential of the wiring GLb_p is maintained at the potential L, for example. This operation is repeated for n rows; thus, the threshold voltage of the transistor M2 is obtained only in the row where the potential of the video signal VdataX is the same as the potential V0 (the potential corresponding to black display). A period when the threshold voltage of the transistor M2_*p* is obtained may be provided so as to start after the start of the quenching operation and finish before the start of the data writing operation of the next display correction frame.

In the driving example illustrated in FIG. 25, the frame F24_1 as the display correction frame is performed, and after the frame F24_1 is finished, the frame F24_2 as the display correction frame is performed. Although not illustrated, after the frame F24_2 is finished, the next display correction frame may be repetitively performed. Therefore, no correction frame may be additionally provided. Thus, the execution frequency of the data writing operation can be increased. Therefore, the display quality of the display apparatus can be increased.

The structure described above in this embodiment can be used in combination as appropriate with any of the structures described in the other embodiments and Example.

Embodiment 3

Figure 27A:
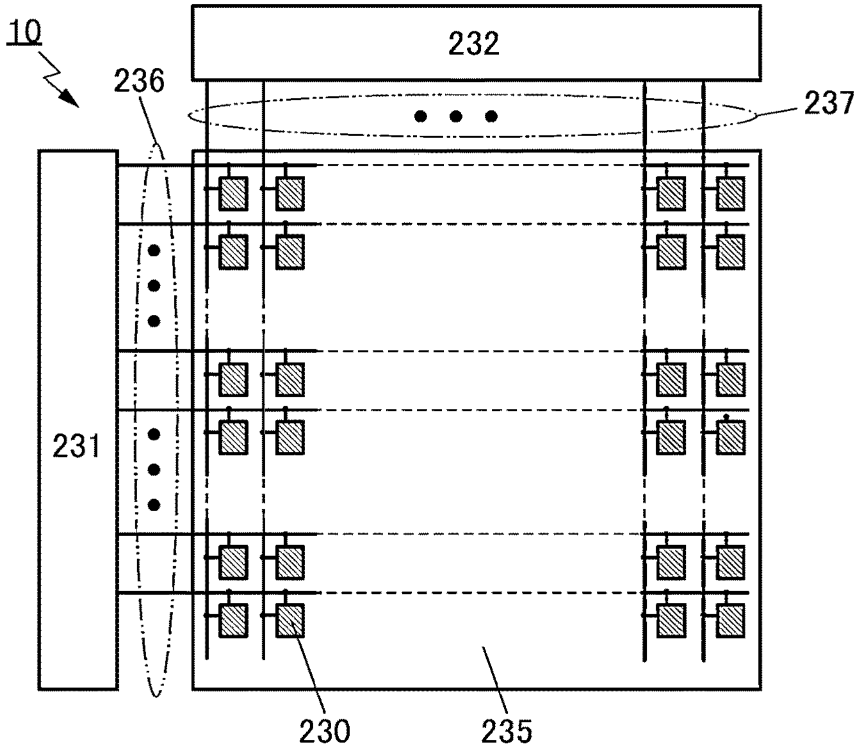
FIG. 27A is a diagram illustrating a display apparatus.

In this embodiment, a structure example of a display apparatus 10 including a semiconductor device 100 (the semiconductor device 100A or the semiconductor device 100B) will be described. FIG. 27A is a block diagram illustrating the display apparatus 10. The display apparatus 10 includes a display region 235, a first driver circuit portion 231, and a second driver circuit portion 232. The display region 235 includes a plurality of pixels 230 arranged in a matrix. The semiconductor device 100 of one embodiment of the present invention may be used in the pixel 230.

A circuit included in the first driver circuit portion 231 functions as, for example, a scan line driver circuit. A circuit included in the second driver circuit portion 232 functions as, for example, a signal line driver circuit. Some sort of circuit may be provided to face the first driver circuit portion 231 with the display region 235 positioned therebetween. Some sort of circuit may be provided at a position facing the second driver circuit portion 232 with the display region 235 positioned therebetween. Note that in this specification and the like, circuits included in the first driver circuit portion 231 and the second driver circuit portion 232 are collectively referred to as a "peripheral driver circuit" in some cases.

Any of various circuits such as a shift register, a level shifter, an inverter, a latch, an analog switch, and a logic circuit can be used as the peripheral driver circuit, for example. In the peripheral driver circuit, a transistor, a capacitor, or the like can be used, for example.

For example, OS transistors may be used as the transistors included in the pixels 230 and Si transistors may be used as the transistors included in the peripheral driver circuit. The off-state current of the OS transistor is low. Thus, power consumption of the pixels 230 using the OS transistors can be reduced. The Si transistor has higher operation speed than the OS transistor. Thus, the Si transistor is preferably used in the peripheral driver circuit. Depending on the display apparatus, the OS transistors may be used as both the transistors included in the pixels 230 and the transistors included in the peripheral driver circuit. Depending on the display apparatus, the Si transistors may be used as both the transistors included in the pixels 230 and the transistors included in the peripheral driver circuit. Depending on the display apparatus, the Si transistors may be used as the transistors included in the pixels 230 and the OS transistors may be used as the transistors included in the peripheral driver circuit.

Both the Si transistor and the OS transistor may be used as the transistors included in the pixel 230. Both the Si transistor and the OS transistor may be used as the transistors included in the peripheral driver circuit.

The display apparatus 10 includes m wirings 236 which are placed in substantially parallel with each other and whose potentials are controlled by a circuit included in the first driver circuit portion 231. The display apparatus 10 includes n wirings 237 which are placed in parallel with each other and whose potentials are controlled by a circuit included in the second driver circuit portion 232.

Note that FIG. 27A is a diagram illustrating an example in which the wirings 236 and the wirings 237 are connected to the pixels 230. However, FIG. 27A is an example, and the wirings connected to the pixels 230 are not limited to the wirings 236 and the wirings 237.

Figure 27B:
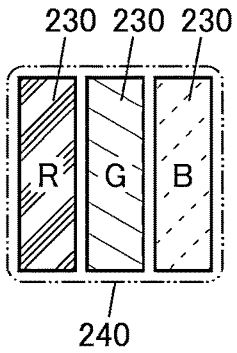
FIG. 27B to FIG. 27H are diagrams each illustrating a structure example of a pixel.
Figure 27C:
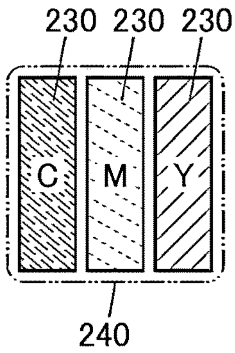

The display apparatus 10 can achieve full-color display by making the pixel 230 that controls red light, the pixel 230 that controls green light, and the pixel 230 that controls blue light collectively function as one pixel 240 and by controlling the amount of light (emission luminance) emitted from each pixel 230. Thus, the three pixels 230 each function as a subpixel. That is, the emission amount or the like of red light, green light, and blue light are controlled by three subpixels, for example (see FIG. 27B). The light colors controlled by the three subpixels are not limited to a combination of red (R), green (G), and blue (B) and may be cyan (C), magenta (M), and yellow (Y) (see FIG. 27C).

Figure 27D:
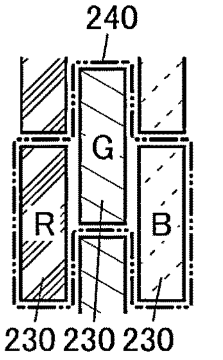

Three display pixels 230 constituting one pixel 240 may be arranged in a delta pattern (see FIG. 27D). Specifically, three pixels 230 constituting one pixel 240 may be arranged such that the lines connecting the center points of the three pixels 230 form a triangle.

Figure 27E:
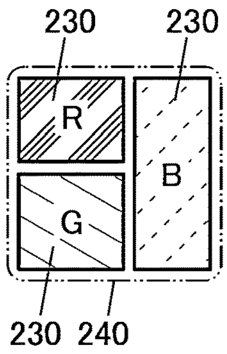

The areas of three subpixels (the pixels 230) are not necessarily the same as one another. For example, in the case where the emission efficiency, reliability, and the like are different depending on emission colors, the areas of three subpixels may be different depending on emission colors (see FIG. 27E). Note that the arrangement of the subpixels illustrated in FIG. 27E may be called "S-stripe RGB arrangement", for example.

Figure 27F:
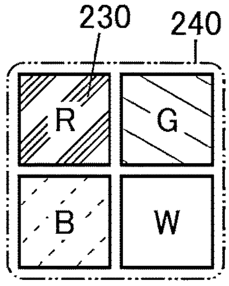
Figure 27G:
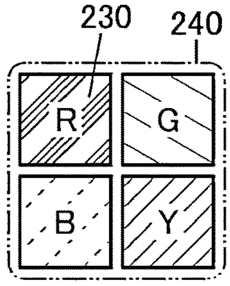
Figure 27H:
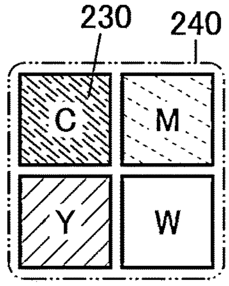

Furthermore, four subpixels may collectively function as one pixel 240. For example, a subpixel that controls white light may be added to the three subpixels that control red light, green light, and blue light (see FIG. 27F). With addition of the subpixel that controls white light, the display apparatus 10 with the increased luminance of the display region 235 can be achieved. Alternatively, a subpixel that controls yellow light may be added to the three subpixels that control red light, green light, and blue light, for example (see FIG. 27G). Alternatively, a subpixel that controls white light may be added to the three subpixels that control cyan light, magenta light, and yellow light, for example (see FIG. 27H).

When the number of subpixels functioning as one pixel is increased and subpixels that control light of red, green, blue, cyan, magenta, yellow, and the like are used in an appropriate combination in the pixel 240, the display apparatus 10 with the increased reproducibility of halftones can be achieved. Consequently, the display apparatus 10 with the increased display quality can be achieved.

The display apparatus 10 of one embodiment of the present invention can reproduce the color gamut of various standards. For example, the display apparatus of one embodiment of the present invention can reproduce the color gamut of the following standards: the PAL (Phase Alternating Line) standard or NTSC (National Television System Committee) standard used for TV broadcasting; the sRGB (standard RGB) standard or Adobe RGB standard used widely for display apparatuses, for example, in electronic devices such as personal computers, digital cameras, and printers; the ITU-R BT.709 (International Telecommunication Union Radiocommunication Sector Broadcasting Service (Television) 709) standard used for HDTV (High Definition Televisions, also referred to Hi-Vision); the DCI-P3 (Digital Cinema Initiatives P3) standard used for digital cinema projection; the ITU-R BT.2020 (REC.2020 (Recommendation 2020)) standard used for UHDTV (Ultra High Definition Television, also referred to as Super Hi-Vision); and the like.

For example, by using the pixels 240 arranged in a matrix of 1920×1080, the display apparatus 10 that can perform full-color display with a definition of what is called full high-vision (also referred to as "2K definition", "2K1K", "2K", or the like) can be obtained. For example, by using the pixels 240 arranged in a matrix of 3840×2160, the display apparatus 10 that can perform full-color display with a definition of what is called ultra hivision (also referred to as "4K definition", "4K2K", "4K", or the like) can be obtained. For example, by using the pixels 240 arranged in a matrix of 7680×4320, the display apparatus 10 that can perform full-color display with a definition of what is called super hi-vision (also referred to as "8K definition", "8K4K", "8K", or the like, for example) can be obtained. By increasing the number of pixels 240, the display apparatus 10 that can perform full-color display with 16K or 32K definition can also be obtained.

The pixel density of the display region 235 is preferably higher than or equal to 100 ppi and lower than or equal to 10000 ppi, and further preferably higher than or equal to 1000 ppi and lower than or equal to 10000 ppi. For example, the pixel density of the display region 235 may be higher than or equal to 2000 ppi and lower than or equal to 6000 ppi, or higher than or equal to 3000 ppi and lower than or equal to 5000 ppi.

Note that there is no particular limitation on the aspect ratio of the display region 235. For example, the display region 235 of the display apparatus 10 is compatible with a variety of aspect ratios such as 1:1 (square), 4:3, 16:9, and 16:10.

The diagonal size of the display region 235 may be greater than or equal to 0.1 inches and less than or equal to 100 inches and may be greater than or equal to 100 inches.

In the case where the display apparatus 10 is used as a display apparatus for virtual reality (VR) or augmented reality (AR), the diagonal size of the display region 235 can be greater than or equal to 0.1 inches and less than or equal to 5.0 inches, preferably greater than or equal to 0.5 inches and less than or equal to 2.0 inches, further preferably greater than or equal to 1 inch and less than or equal to 1.7 inches. For example, the diagonal size of the display region 235 may be 1.5 inches or approximately 1.5 inches. When the display region 235 has a diagonal size of less than or equal to 2.0 inches, preferably, approximately 1.5 inches, the number of times of light exposure treatment performed using a light exposure apparatus (typified by a scanner apparatus) can be one; thus, the productivity of a manufacturing process can be improved.

The structure of transistors used in the display region 235 may be selected as appropriate depending on the diagonal size of the display region 235. In the case where single crystal Si transistors are used in the display region 235, for example, the diagonal size of the display region 235 is preferably greater than or equal to 0.1 inches and less than or equal to 3 inches. In the case where LTPS transistors are used in the display region 235, the diagonal size of the display region 235 is preferably greater than or equal to 0.1 inches and less than or equal to 30 inches, further preferably greater than or equal to 1 inch and less than or equal to 30 inches. In the case where LTPO (a structure in which an LTPS transistor and an OS transistor are combined) is employed in the display region 235, the diagonal size of the display region 235 is preferably greater than or equal to 0.1 inches and less than or equal to 50 inches, further preferably greater than or equal to 1 inch and less than or equal to 50 inches. In the case where OS transistors are used in the display region 235, the diagonal size of the display region 235 is preferably greater than or equal to 0.1 inches and less than or equal to 200 inches, further preferably greater than or equal to 50 inches and less than or equal to 100 inches.

With single crystal Si transistors, increasing the size of a display panel is extremely difficult because of the size of a single crystal Si substrate. Furthermore, since a laser crystallization apparatus is used in the manufacturing process of LTPS transistors, the LTPS transistors are unlikely to respond to a size increase of a display panel (typically to a screen diagonal size greater than 30 inches). By contrast, since the manufacturing process of OS transistors, for example, does not necessarily require a laser crystallization apparatus or the like or can be performed at a relatively low process temperature (typically, lower than or equal to 450° C.), the OS transistors are applicable to a display panel with a relatively large area (typically, a diagonal size greater than or equal to 50 inches and less than or equal to 100 inches). In addition, LTPO is applicable to a display panel with a size midway between the case of using LTPS transistors and the case of using OS transistors (typically, a diagonal size greater than or equal to 1 inch and less than or equal to 50 inches).

<Structure Example of Light-Emitting Element>

A light-emitting element (also referred to as light-emitting device) that can be used for a semiconductor device of one embodiment of the present invention will be described.

Figure 28A:
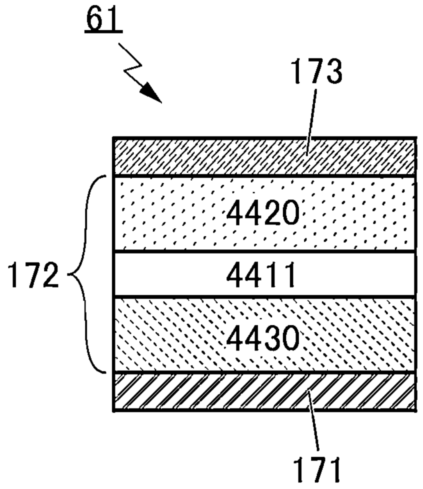
FIG. 28A to FIG. 28D are diagrams illustrating structure examples of a light-emitting element.

As illustrated in FIG. 28A, the light-emitting element 61 includes an EL layer 172 between a pair of electrodes (a conductive layer 171 and a conductive layer 173). The EL layer 172 can be formed of a plurality of layers such as a layer 4420, a light-emitting layer 4411, and a layer 4430, for example. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which are provided between the pair of electrodes, can function as a single light-emitting unit. In this specification and the like, the structure of the structure illustrated in FIG. 28A is referred to as a single structure.

Figure 28B:
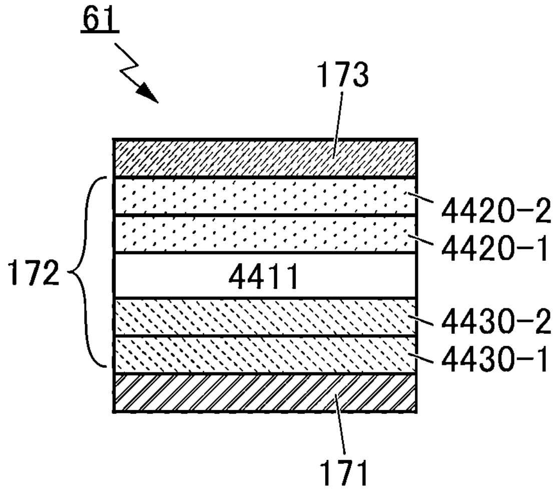

FIG. 28B is a modification example of the EL layer 172 included in the light-emitting element 61 illustrated in FIG. 28A. Specifically, the light-emitting element 61 illustrated in FIG. 28B includes a layer 4430-1 over the conductive layer 171, a layer 4430-2 over the layer 4430-1, the light-emitting layer 4411 over the layer 4430-2, a layer 4420-1 over the light-emitting layer 4411, a layer 4420-2 over the layer 4420-1, and the conductive layer 173 over the layer 4420-2. In the case where the conductive layer 171 serves as an anode and the conductive layer 173 serves as a cathode, for example, the layer 4430-1 functions as a hole-injection layer, the layer 4430-2 functions as a hole-transport layer, the layer 4420-1 functions as an electron-transport layer, and the layer 4420-2 functions as an electron-injection layer. Alternatively, in the case where the conductive layer 171 is a cathode and the conductive layer 173 is an anode, the layer 4430-1 functions as an electron-injection layer, the layer 4430-2 functions as an electron-transport layer, the layer 4420-1 functions as a hole-transport layer, and the layer 4420-2 functions as a hole-injection layer. In the light-emitting element 61 with such a layered structure, carriers can be efficiently injected to the light-emitting layer 4411, and the efficiency of the recombination of carriers in the light-emitting layer 4411 can be enhanced.

Figure 28C:
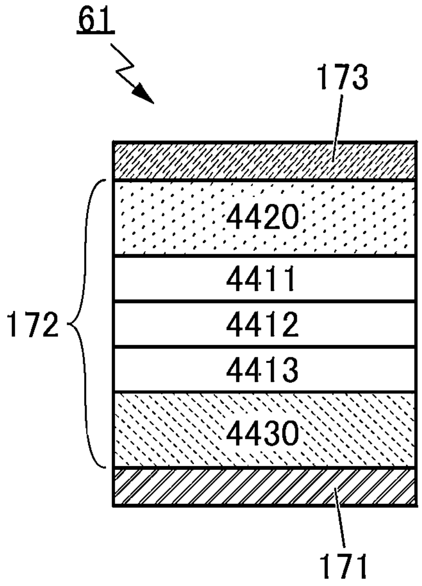

Note that the structure in which a plurality of light-emitting layers (the light-emitting layer 4411, a light-emitting layer 4412, and a light-emitting layer 4413) are provided between the layer 4420 and the layer 4430 as illustrated in FIG. 28C is also an example of the single structure.

Figure 28D:
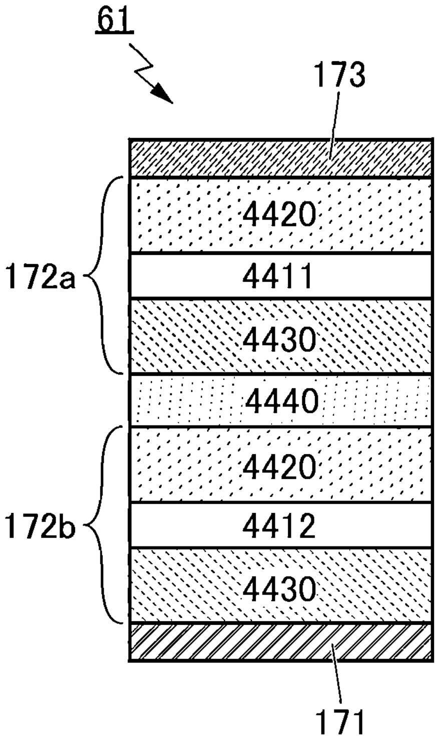

A structure in which a plurality of light-emitting units (an EL layer 172*a* and an EL layer 172*b*) are connected in series with an intermediate layer (charge-generation layer) 4440 therebetween as illustrated in FIG. 28D is referred to as a tandem structure or a stack structure in this specification and the like. Note that the tandem structure enables the light-emitting element 61 capable of high-luminance light emission.

In the case where the light-emitting element 61 has the tandem structure illustrated in FIG. 28D, the EL layer 172*a* and the EL layer 172*b* may emit light of the same color. For example, the EL layer 172*a* and the EL layer 172*b* may both emit green light. Note that in the case where the display region 235 includes three subpixels of R, G, and B and each of the subpixels includes a light-emitting element, the light-emitting element of each subpixels may have the tandem structure. Specifically, the EL layer 172*a* and the EL layer 172*b* in the subpixel of R each contain a material capable of emitting red light. The EL layer 172*a* and the EL layer 172*b* in the subpixel of G each contain a material capable of emitting green light. The EL layer 172*a* and the EL layer 172*b* in the subpixel of B each contain a material capable of emitting blue light. In other words, the light-emitting layer 4411 and the light-emitting layer 4412 may contain the same material. In the light-emitting element 61 having a tandem structure illustrated in FIG. 28D, when the EL layer 172*a* and the EL layer 172*b* emit light of the same color, the current density per unit emission luminance can be reduced. Thus, the reliability of the light-emitting element 61 can be increased.

The emission color of the light-emitting element can be, for example, red, green, blue, cyan, magenta, yellow, white, or the like depending on materials that constitutes the EL layer 172. Furthermore, the color purity can be further increased when the light-emitting element has a microcavity structure.

The light-emitting layer may contain two or more light-emitting substances that emit light of R (red), G (green), B (blue), Y (yellow), or O (orange), for example. The light-emitting element that emits white light preferably contains two or more kinds of light-emitting substances in the light-emitting layer. In the light-emitting element of one embodiment of the present invention, to obtain white light emission with the use of two kinds of light-emitting substances, the two kinds of light-emitting substances may be selected such that their emission colors are complementary colors. For example, in the light-emitting element of one embodiment of the present invention, when an emission color of a first light-emitting substance and an emission color of a second light-emitting substance are complementary colors, it is possible to obtain a light-emitting element which emits white light as a whole. In the light-emitting element of one embodiment of the present invention, to obtain white light emission by using three or more light-emitting substances, the light-emitting element may be configured to emit white light as a whole by combining emission colors of the three or more light-emitting substances.

The light-emitting layer preferably includes two or more light-emitting substances that each emit light containing two or more of spectral components of R, G, and B.

Examples of a light-emitting substance include a substance that emits fluorescent light (a fluorescent material), a substance that emits phosphorescent light (a phosphorescent material), an inorganic compound (e.g., a quantum dot material and the like), and a substance that exhibits thermally activated delayed fluorescence (a thermally activated delayed fluorescence (TADF) material). Note that as a TADF material, a material that is in a thermal equilibrium state between a singlet excited state and a triplet excited state may be used. Since such a TADF material enables a short emission lifetime (excitation lifetime), an efficiency decrease of a light-emitting element in a high-luminance region can be inhibited.

<Method for Forming Light-Emitting Element>

An example of a method for forming the light-emitting element 61 will be described below.

Figure 29A:
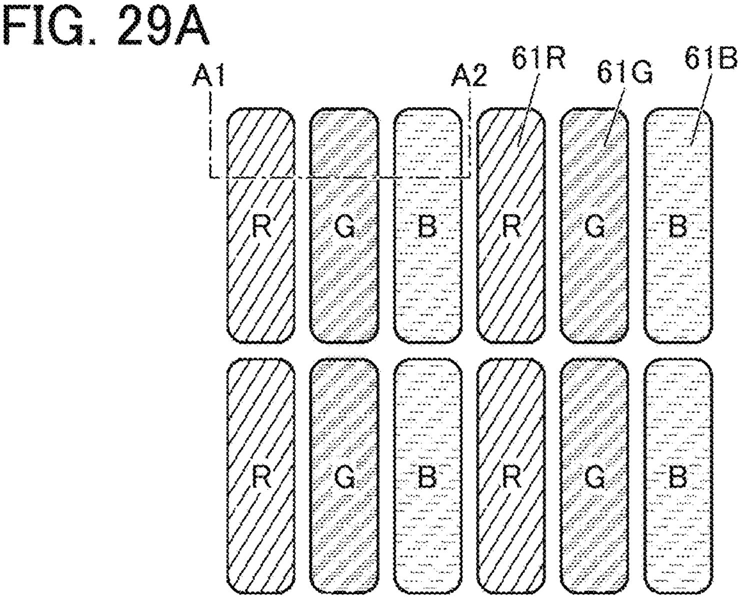
FIG. 29A to FIG. 29D are diagrams illustrating structure examples of the light-emitting element.

FIG. 29A is a schematic top view of the light-emitting element 61. The light-emitting element 61 includes a plurality of light-emitting elements 61R exhibiting red, a plurality of light-emitting elements 61G exhibiting green, and a plurality of light-emitting elements 61B exhibiting blue. In FIG. 29A, light-emitting regions of the light-emitting elements are denoted by R, G, and B to easily differentiate the light-emitting elements. Note that the structure of the light-emitting element 61 illustrated in FIG. 29A may be referred to as an SBS (Side By Side) structure. Although FIG. 29A illustrates the structure having the light-emitting element 61 for three colors of red (R), green (G), and blue (B), one embodiment of the present invention is not limited thereto. One embodiment of the present invention may include, for example, a structure including four or more light-emitting elements 61.

The light-emitting elements 61R, the light-emitting elements 61G, and the light-emitting elements 61B are arranged in a matrix. FIG. 29A illustrates what is called a stripe arrangement, in which the light-emitting elements of the same color are arranged in one direction; however, the arrangement of the light-emitting elements is not limited thereto. For example, a delta arrangement, a zigzag arrangement, an S-stripe RGB arrangement, a PenTile arrangement, or the like can be used as the method for arranging light-emitting elements.

As the light-emitting element 61R, the light-emitting element 61G, and the light-emitting element 61B, an organic EL device such as an OLED (Organic Light Emitting Diode) or a QOLED (Quantum-dot Organic Light Emitting Diode) is preferably used, for example. Examples of a light-emitting substance contained in the EL element include a substance emitting fluorescent light (a fluorescent material), a substance emitting phosphorescent light (a phosphorescent material), an inorganic compound (e.g., a quantum dot material), and a substance exhibiting thermally activated delayed fluorescence (a thermally activated delayed fluorescent (TADF) material).

Figure 29B:
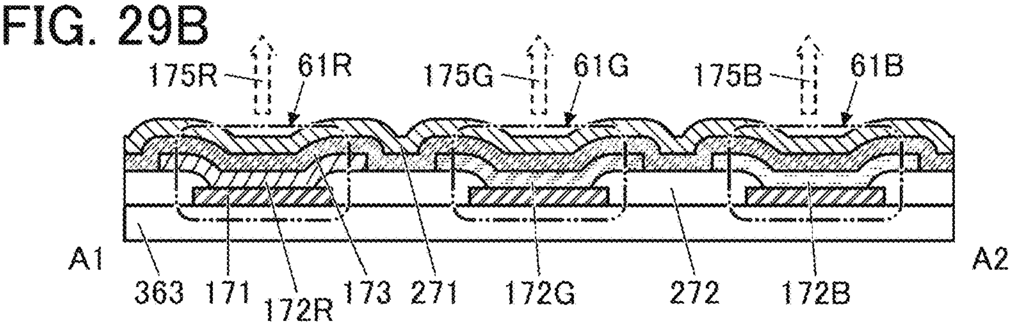

FIG. 29B is a cross-sectional schematic view taken along dashed-dotted line A1-A2 in FIG. 29A. FIG. 29B illustrates cross sections of the light-emitting element 61R, the light-emitting element 61G, and the light-emitting element 61B. The light-emitting element 61R, the light-emitting element 61G, and the light-emitting element 61B are provided over an insulating layer 363. The light-emitting element 61R, the light-emitting element 61G, and the light-emitting element 61B include the conductive layer 171 functioning as a pixel electrode and the conductive layer 173 functioning as a common electrode. As the insulating layer 363, one or both of an inorganic insulating film and an organic insulating film can be used. An inorganic insulating film is preferably used as the insulating layer 363. As the inorganic insulating film, for example, an oxide insulating film or a nitride insulating film such as a silicon oxide film, a silicon oxynitride film, a silicon nitride oxide film, a silicon nitride film, an aluminum oxide film, an aluminum oxynitride film, or a hafnium oxide film can be given.

The light-emitting element 61R includes an EL layer 172R between the conductive layer 171 functioning as a pixel electrode and the conductive layer 173 functioning as a common electrode. The EL layer 172R contains at least a light-emitting organic compound that emits light with intensity in a red wavelength range. An EL layer 172G included in the light-emitting element 61G contains at least a light-emitting organic compound that emits light with intensity in a green wavelength range. An EL layer 172B included in the light-emitting element 61B contains at least a light-emitting organic compound that emits light with intensity in a blue wavelength range.

The EL layer 172R, the EL layer 172G, and the EL layer 172B may each include one or more of an electron-injection layer, an electron-transport layer, a hole-injection layer, and a hole-transport layer in addition to the layer containing a light-emitting organic compound (the light-emitting layer).

The conductive layer 171 functioning as a pixel electrode is provided in each of the light-emitting elements. The conductive layer 173 functioning as a common electrode is provided as a continuous layer shared by the light-emitting elements. A conductive film having a light transmitting property with respect to visible light is used as either the conductive layer 171 functioning as a pixel electrode or the conductive layer 173 functioning as a common electrode, and a reflective conductive film is used as the other. In the display apparatus of one embodiment of the present invention, when the conductive layer 171 functioning as a pixel electrode has a light-transmitting property and the conductive layer 173 functioning as a common electrode has a reflective property, a bottom-emission display apparatus can be obtained. Alternatively, when the conductive layer 171 functioning as a pixel electrode has a reflective property and the conductive layer 173 functioning as a common electrode has a light-transmitting property, a top-emission display apparatus can be obtained. Note that when both the conductive layer 171 functioning as a pixel electrode and the conductive layer 173 functioning as a common electrode have a light-transmitting property, the display apparatus of one embodiment of the present invention can be a dual-emission display apparatus.

For example, in the case where the light-emitting element 61R has a top-emission structure, light 175R is emitted from the light-emitting element 61R to the conductive layer 173 side. In the case where the light-emitting element 61G has a top-emission structure, light 175G is emitted from the light-emitting element 61G to the conductive layer 173 side. In the case where the light-emitting element 61B has a top-emission structure, light 175B is emitted from the light-emitting element 61B to the conductive layer 173 side.

An insulating layer 272 is provided to cover end portions of the conductive layer 171 functioning as a pixel electrode. An end portion of the insulating layer 272 is preferably tapered. For the insulating layer 272, a material similar to the material that can be used for the insulating layer 363 can be used.

The insulating layer 272 is provided to prevent an unintentional electric short-circuit between adjacent light-emitting elements 61 and unintended light emission. The insulating layer 272 also has a function of preventing the contact of a metal mask with the conductive layer 171 in the case where the metal mask is used to form the EL layer 172.

The EL layer 172R, the EL layer 172G, and the EL layer 172B each include a region in contact with the top surface of the conductive layer 171 functioning as a pixel electrode and a region in contact with the surface of the insulating layer 272. End portions of the EL layer 172R, the EL layer 172G, and the EL layer 172B are positioned over the insulating layer 272.

As illustrated in FIG. 29B, there is a gap between the EL layers of the light-emitting elements that exhibit two different colors. In this manner, the EL layer 172R, the EL layer 172G, and the EL layer 172B are preferably provided so as not to be in contact with each other. This can favorably prevent unintentional light emission (also referred to as crosstalk) from being caused by a current flowing through two adjacent EL layers. As a result, one embodiment of the present invention can increase the contrast and achieve a display apparatus with high display quality.

The EL layer 172R, the EL layer 172G, and the EL layer 172B can be formed separately by a vacuum evaporation method or the like using a shadow mask such as a metal mask, for example. Alternatively, these layers may be formed separately by a photolithography method. In one embodiment of the present invention, the use of the photolithography method achieves a high-definition display apparatus, which is difficult to obtain in the case of using a metal mask.

In this specification and the like, a device formed using a metal mask or an FMM (fine metal mask, high-resolution metal mask) may be referred to as a device having an MM (metal mask) structure. In this specification and the like, a device fabricated without using a metal mask or an FMM may be referred to as a device having an MML (metal maskless) structure. A display apparatus having an MML structure is fabricated without using a metal mask and thus has higher flexibility in designing the pixel arrangement, the pixel shape, and the like than a display apparatus having an MM structure.

A protective layer 271 is provided over the conductive layer 173 functioning as a common electrode so as to cover the light-emitting element 61R, the light-emitting element 61G, and the light-emitting element 61B. The protective layer 271 has a function of preventing diffusion of impurities such as, for example, water into the light-emitting elements from above.

The protective layer 271 can have, for example, a single-layer structure or a stacked-layer structure at least including an inorganic insulating film. As the inorganic insulating film, for example, an oxide film or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide (IGZO) may be used for the protective layer 271, for example. Note that the protective layer 271 is formed by an ALD method, a CVD method, or a sputtering method, for example. Although the protective layer 271 includes an inorganic insulating film in this example, one embodiment of the present invention is not limited thereto. For example, the protective layer 271 may have a stacked-layer structure of an inorganic insulating film and an organic insulating film.

Note that in this specification, a nitride oxide refers to a compound that contains more nitrogen than oxygen. A oxynitride refers to a compound that contains more oxygen than nitrogen. The content of each element can be measured by Rutherford backscattering spectrometry (RBS), for example.

In the case where an indium gallium zinc oxide is used as the protective layer 271, the indium gallium zinc oxide can be processed by a wet etching method or a dry etching method. For example, in the case where IGZO is used as the protective layer 271, a chemical solution such as, for example, oxalic acid, phosphoric acid, or a mixed chemical solution (e.g., a mixed chemical solution of phosphoric acid, acetic acid, nitric acid, and water, which is also referred to as a mixed acid aluminum etchant) can be used for processing. Note that the volume ratio of phosphoric acid, acetic acid, nitric acid, and water mixed in the mixed acid aluminum etchant can be 53.3:6.7:3.3:36.7 or in the neighborhood thereof.

Figure 29C:
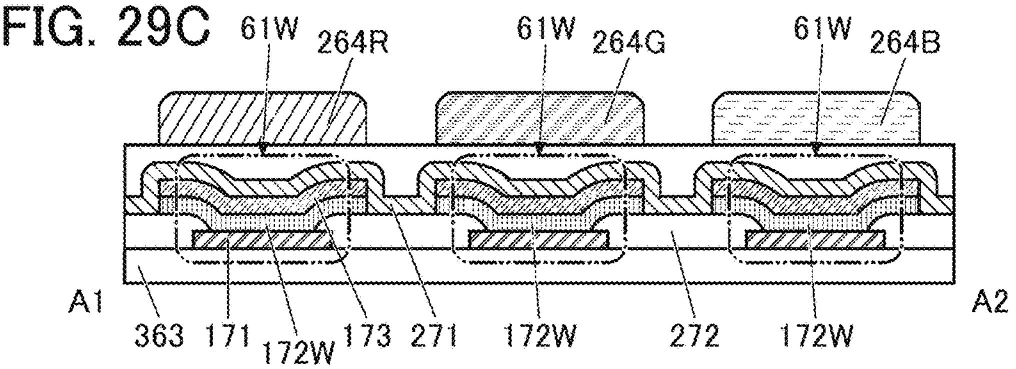

FIG. 29C illustrates an example different from the above. Specifically, in FIG. 29C, the light-emitting element 61 includes light-emitting elements 61W that emit white light. The light-emitting elements 61W each include an EL layer 172W that emits white light between the conductive layer 171 functioning as a pixel electrode and the conductive layer 173 functioning as a common electrode.

The EL layer 172W can have, for example, a structure in which two light-emitting layers that are selected so as to emit light of complementary colors are stacked. It is also possible to use a stacked EL layer in which a charge-generation layer is interposed between light-emitting layers.

FIG. 29C illustrates three light-emitting elements 61W arranged side by side. The coloring layer 264R is provided above the light-emitting element 61W on the left. The coloring layer 264R functions as a band path filter that transmits red light. Similarly, a coloring layer 264G that transmits green light is provided above the light-emitting element 61W in the middle. Similarly, a coloring layer 264B that transmits blue light is provided above the light-emitting element 61W on the right. In this manner, the display apparatus can display an image with colors.

Here, the EL layer 172W and the conductive layer 173 functioning as a common electrode are each separated between two adjacent light-emitting elements 61W. This can prevent unintentional light emission from being caused by current flowing through the EL layers 172W of two adjacent light-emitting elements 61W. Particularly when a stack-type EL layer in which a charge-generation layer is provided between two light-emitting layers is used as the EL layer 172W, in the display apparatus including the EL layers, crosstalk is more significant as the definition increases, i.e., as the distance between adjacent pixels decreases, leading to lower contrast. Thus, the above structure of one embodiment of the present invention can achieve a display apparatus having both high definition and high contrast.

The EL layer 172W and the conductive layer 173 functioning as a common electrode are each preferably separated by a photolithography method. This can decrease the distance between light-emitting elements. Thus, with one embodiment of the present invention, a display apparatus with a higher aperture ratio than a display apparatus formed using, for example, a shadow mask such as a metal mask can be achieved.

Note that in the case of a bottom-emission light-emitting element, a coloring layer may be provided between the conductive layer 171 functioning as a pixel electrode and the insulating layer 363 in the display apparatus of one embodiment of the present invention.

Figure 29D:
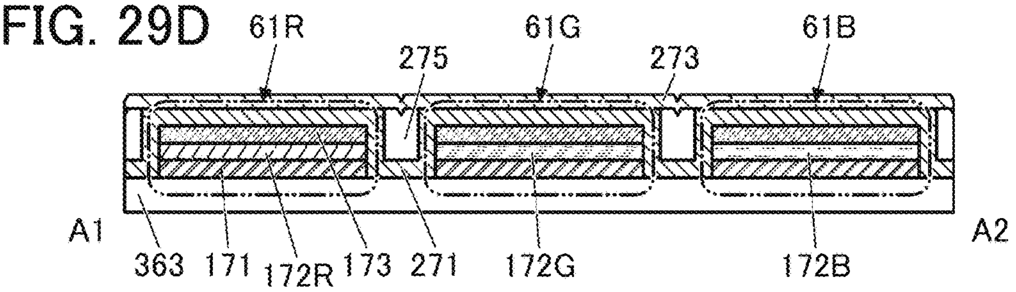

FIG. 29D illustrates an example different from the above. Specifically, in FIG. 29D, the insulating layers 272 are not provided between the light-emitting element 61R, the light-emitting element 61G, and the light-emitting element 61B. The display apparatus according to one embodiment of the present invention can have a structure with a high aperture ratio. When the insulating layer 272 is not provided, unevenness formed by the light-emitting elements 61 can be reduced, thereby the display apparatus of one embodiment of the present invention can have a wide viewing angle. Specifically, the viewing angle of the display apparatus of one embodiment of the present invention can be greater than or equal to 150° and less than 180°, preferably greater than or equal to 160° and less than 180°, further preferably greater than or equal to 160° and less than 180°.

The protective layer 271 covers the side surfaces of the EL layer 172R, the EL layer 172G, and the EL layer 172B. With this structure of one embodiment of the present invention, impurities (typically, water or the like) can be inhibited from entering the EL layer 172R, the EL layer 172G, and the EL layer 172B through their side surfaces. Thus, a leakage current between adjacent light-emitting elements 61 is reduced. Accordingly, in the display apparatus of one embodiment of the present invention, color saturation and contrast ratio are improved and power consumption is reduced.

In the structure illustrated in FIG. 29D, the top shapes of the conductive layer 171, the EL layer 172R, and the conductive layer 173 are substantially the same. This structure can be formed in the following manner: the conductive layer 171, the EL layer 172R, and the conductive layer 173 are formed and collectively processed using a resist mask or the like, for example. In this process, the EL layer 172R and the conductive layer 173 are processed using the conductive layer 173 as a mask, and thus this process can be called self-alignment patterning. Although the EL layer 172R is described here, the EL layer 172G and the EL layer 172B can each have a similar structure.

Furthermore, in FIG. 29D, the protective layer 273 is provided over the protective layer 271. For example, the protective layer 271 is formed with an apparatus that can deposit a film with excellent coverage (typically, an ALD apparatus), and the protective layer 273 is formed with an apparatus that can deposit a film with coverage inferior to that of the protective layer 271 (typically, a sputtering apparatus). By the formation of the protective layer 271 and the protective layer 273, the region 275 can be provided between the protective layer 271 and the protective layer 273. In other words, the regions 275 are positioned between the EL layer 172R and the EL layer 172G and between the EL layer 172G and the EL layer 172B.

Note that the region 275 includes, for example, one or more of air, nitrogen, oxygen, carbon dioxide, and Group 18 elements (typically, helium, neon, argon, xenon, krypton, and the like). Furthermore, for example, a gas used during deposition of the protective layer 273 is sometimes included in the region 275. For example, in the case where the protective layer 273 is deposited using a sputtering method, any one or more of the above-described Group 18 elements is sometimes included in the region 275. In the case where a gas is included in the region 275, the gas can be identified with a gas chromatography method or the like. Alternatively, in the case where the protective layer 273 is formed using a sputtering method, a gas used in the sputtering is sometimes contained in the protective layer 273. In this case, for example, an element such as argon is sometimes detected when the protective layer 273 is analyzed by an energy dispersive X-ray analysis (EDX analysis) or the like, for example.

In the case where the refractive index of the region 275 is lower than the refractive index of the protective layer 271, light emitted from the EL layer 172R, the EL layer 172G, or the EL layer 172B is reflected at the interface between the protective layer 271 and the region 275. Thus, light emitted from the EL layer 172R, the EL layer 172G, or the EL layer 172B can be inhibited from entering an adjacent pixel in some cases. This can inhibit color mixture of light emitted from adjacent pixels and thus can increase the display quality of the display apparatus.

In the case of the structure illustrated in FIG. 29D, a region between the light-emitting element 61R and the light-emitting element 61G or a region between the light-emitting element 61G and the light-emitting element 61B (hereinafter, simply referred to as a distance between the light-emitting elements) can be small. Specifically, the distance between the light-emitting elements can be less than or equal to 1 μm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or less than or equal to 10 nm. In other words, the structure illustrated in FIG. 29D includes a region where an interval between the side surface of the EL layer 172R and the side surface of the EL layer 172G or an interval between the side surface of the EL layer 172G and the side surface of the EL layer 172B is less than or equal to 1 μm, preferably less than or equal to 0.5 μm (500 nm), further preferably less than or equal to 100 nm.

In the structure illustrated in FIG. 29D, in the case where the region 275 includes a gas, for example, the light-emitting elements can be isolated from each other and color mixture of light from the light-emitting elements, crosstalk, or the like can be inhibited.

Alternatively, the region 275 may be filled with a filler. Examples of the filler include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. Alternatively, a photoresist may be used as the filler. The photoresist used as the filler may be a positive photoresist or a negative photoresist.

When the white-light-emitting device (having a single structure or a tandem structure) and a light-emitting device having an SBS structure are compared to each other, the light-emitting device having an SBS structure can have lower power consumption than the white-light-emitting device. Therefore, in the display apparatus of one embodiment of the present invention, a light-emitting device having an SBS structure is preferably used to reduce power consumption. Meanwhile, the manufacturing process of the white-light-emitting device is simpler than that of a light-emitting device having an SBS structure. Therefore, the display apparatus of one embodiment of the present invention is suitably used for the white-light-emitting device, in which case the manufacturing cost can be lowered or the manufacturing yield can be increased.

Figure 30A:
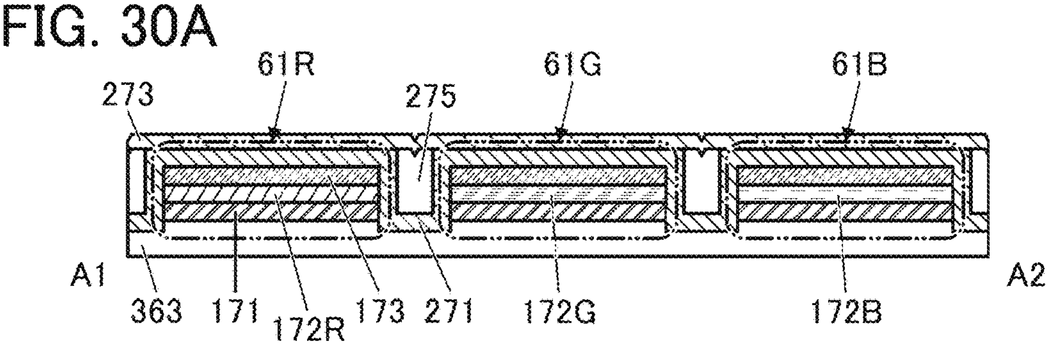
FIG. 30A to FIG. 30D are diagrams illustrating structure examples of the light-emitting element.

FIG. 30A illustrates an example different from the above. Specifically, the structure illustrated in FIG. 30A is different from the structure illustrated in FIG. 29D in the structure of the insulating layer 363. The insulating layer 363 has a depression portion in its top surface that is formed by being partially etched when the light-emitting element 61R, the light-emitting element 61G, and the light-emitting element 61B are processed. The protective layer 271 is formed in the depression portion. In other words, in the cross-sectional view, the structure illustrated in FIG. 30A includes a region in which the bottom surface of the protective layer 271 is positioned below the bottom surface of the conductive layer 171. The structure illustrated in FIG. 30A having the region can suitably inhibit impurities (typically, water or the like) from entering the light-emitting element 61R, the light-emitting element 61G, and the light-emitting element 61B from the bottom. It is likely that the depression portion can be formed when impurities (also referred to as residue) that could be attached to the side surfaces of the light-emitting element 61R, the light-emitting element 61G, and the light-emitting element 61B in processing of the light-emitting elements are removed by wet etching or the like, for example. In the display apparatus of one embodiment of the present invention, after the residue is removed, the side surfaces of the light-emitting elements are covered with the protective layer 271, whereby a highly reliable display apparatus can be provided.

Figure 30B:
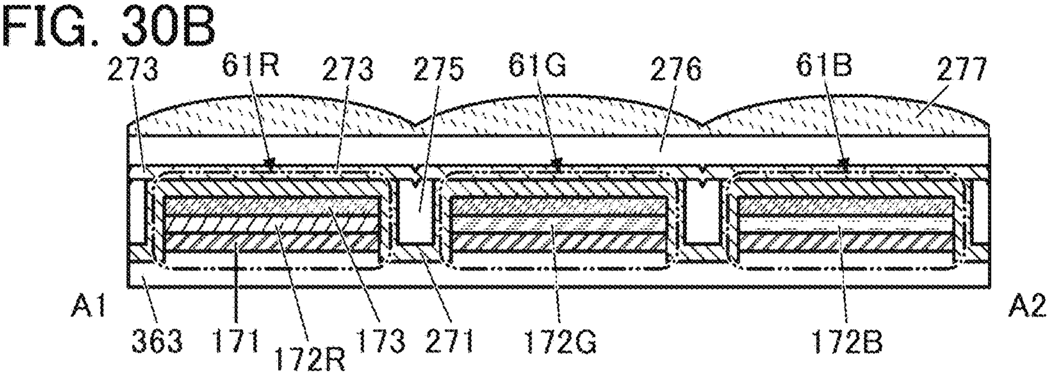

FIG. 30B illustrates an example different from the above. Specifically, the structure illustrated in FIG. 30B includes an insulating layer 276 and a microlens array 277 in addition to the structure illustrated in FIG. 30A. The insulating layer 276 functions as an adhesive layer. Note that when the refractive index of the insulating layer 276 is lower than the refractive index of the microlens array 277, the microlens array 277 can condense light emitted from the light-emitting element 61R, the light-emitting element 61G, and the light-emitting element 61B. Thus, the structure illustrated in FIG. 30B can increase the light extraction efficiency of the display apparatus. In particular, this is suitable, because a user can see bright images when the user sees the display surface from the front of the display surface of the display apparatus.

As the insulating layer 276, a variety of curable adhesives that are, for example, a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferable, for example. A two-liquid-mixture-type resin may be used. An adhesive sheet may be used, for example.

Figure 30C:
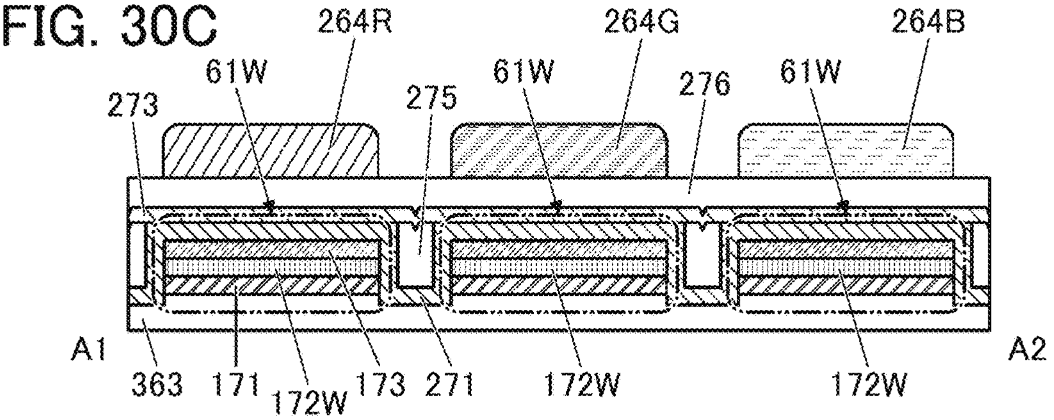

FIG. 30C illustrates an example different from the above. Specifically, the structure illustrated in FIG. 30C includes three light-emitting elements 61W instead of the light-emitting element 61R, the light-emitting element 61G, and the light-emitting element 61B in the structure illustrated in FIG. 30A. In addition, the structure illustrated in FIG. 30C includes the insulating layer 276 over the three light-emitting elements 61W. The structure illustrated in FIG. 30C also includes the coloring layer 264R, the coloring layer 264G, and the coloring layer 264B over the insulating layer 276. Specifically, the coloring layer 264R that transmits red light is provided at a position overlapping with the light-emitting element 61W on the left. The coloring layer 264G that transmits green light is provided at a position overlapping with the light-emitting element 61W in the middle. The coloring layer 264B that transmits blue light is provided at a position overlapping with the light-emitting element 61W on the right. Thus, the display apparatus can display a color image. The structure illustrated in FIG. 30C is also a modification example of the structure illustrated in FIG. 29C.

Figure 30D:
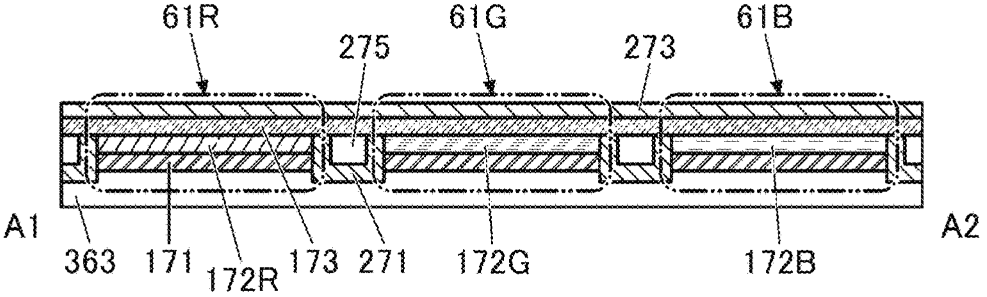

FIG. 30D illustrates an example different from the above. Specifically, in the structure illustrated in FIG. 30D, the protective layer 271 is provided adjacent to the side surfaces of the conductive layer 171 and the EL layer 172. The conductive layer 173 is provided as a continuous layer shared by the light-emitting elements. In the structure illustrated in FIG. 30D, the region 275 is preferably filled with a filler.

A color purity of the emission color can be increased when the light-emitting element 61 of one embodiment of the present invention has a micro-optical resonator (microcavity) structure. In the case where the light-emitting element 61 has a microcavity structure, the light-emitting element 61 may be configured in such a manner that a product of a distance d between the conductive layer 171 and the conductive layer 173 and a refractive index n of the EL layer 172 (optical distance) is set to m times as large as ½ of a wavelength λ (m is an integer more than or equal to 1). The distance d can be obtained by Formula 1.

$$d = m \times \lambda/(2 \times n) \quad \text{(Formula 1)}$$

According to Formula 1, in the light-emitting element 61 having the microcavity structure, the distance d is determined in accordance with the wavelength (emission color) of emitted light. The distance d corresponds to the thickness of the EL layer 172. Thus, the EL layer 172G is provided to have a larger thickness than the EL layer 172B, and the EL layer 172R is provided to have a larger thickness than the EL layer 172G, in some cases.

Note that to be exact, the distance d is a distance from a reflection region in the conductive layer 171 functioning as a reflective electrode to a reflection region in the conductive layer 173 functioning as a transflective electrode. For example, in the case where the conductive layer 171 is a stack of silver and ITO that is a transparent conductive film and the ITO is positioned on the EL layer 172 side, the distance d suitable for the emission color can be set by adjusting the thickness of the ITO. That is, even when the EL layer 172R, the EL layer 172G, and the EL layer 172B have the same thickness, the distance d suitable for the emission color can be obtained by adjusting the thickness of the ITO.

However, it is sometimes difficult to determine the exact position of the reflection region in each of the conductive layer 171 and the conductive layer 173. In that case, the light-emitting element 61 can obtain a sufficient effect of the microcavity, supposed that a certain position in each of the conductive layer 171 and the conductive layer 173 serves as the reflective region.

The light-emitting element 61 includes a hole-injection layer, a hole-transport layer, a light-emitting layer, an electron-transport layer, an electron-injection layer, and the like, for example. Note that a specific structure example of the light-emitting element 61 will be described in another embodiment. In order to increase the outcoupling efficiency in the microcavity structure, the optical path length from the conductive layer 171 functioning as a reflective electrode to the light-emitting layer is preferably set to an odd multiple of λ/4. In order to achieve this optical path length, the thicknesses of the layers included in the light-emitting element 61 are preferably adjusted as appropriate.

In the case where light is emitted from the conductive layer 173 side, the light reflectance of the conductive layer 173 is preferably higher than the light transmittance thereof. The light transmittance of the conductive layer 173 is preferably higher than or equal to 2% and lower than or equal to 50%, further preferably higher than or equal to 2% and lower than or equal to 30%, still further preferably higher than or equal to 2% and lower than or equal to 10%. When the transmittance of the conductive layer 173 is set low (the light reflectance is set high), the effect of the microcavity can be enhanced.

Figure 31A:
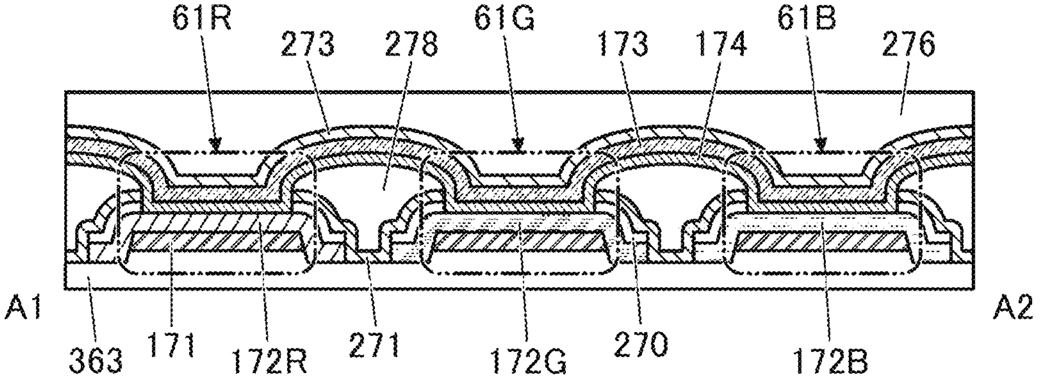
FIG. 31A and FIG. 31B are diagrams illustrating structure examples of the light-emitting element.

FIG. 31A illustrates an example different from the above example. Specifically, in the structure illustrated in FIG. 31A, the EL layer 172 extends beyond the end portions of the conductive layer 171 in each of the light-emitting element 61R, the light-emitting element 61G, and the light-emitting element 61B. For example, in the light-emitting element 61R, the EL layer 172R extends beyond the end portions of the conductive layer 171. In the light-emitting element 61G, the EL layer 172G extends beyond the end portions of the conductive layer 171. In the light-emitting element 61B, the EL layer 172B extends beyond the end portions of the conductive layer 171.

The light-emitting element 61R, the light-emitting element 61G, and the light-emitting element 61B each include a region where the EL layer 172 overlaps with the protective layer 271 with an insulating layer 270 therebetween. In a region between adjacent light-emitting elements 61, an insulating layer 278 is provided over the protective layer 271.

Examples of the insulating layer 278 include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. Alternatively, a photoresist may be used as the insulating layer 278. The photoresist used as the insulating layer 278 may be a positive photoresist or a negative photoresist.

A common layer 174 is provided over the light-emitting element 61R, the light-emitting element 61G, the light-emitting element 61B, and the insulating layer 278. The conductive layer 173 is provided over the common layer 174. The common layer 174 includes a region in contact with the EL layer 172R, a region in contact with the EL layer 172G, and a region in contact with the EL layer 172B. The common layer 174 is shared by the light-emitting element 61R, the light-emitting element 61G, and the light-emitting element 61B.

As the common layer 174, one or more of a hole-injection layer, a hole-transport layer, a hole-blocking layer, an electron-blocking layer, an electron-transport layer, and an electron-injection layer can be used. For example, the common layer 174 may be a carrier-injection layer (a hole-injection layer or an electron-injection layer). The common layer 174 can also be regarded as part of the EL layer 172. Note that the common layer 174 is provided as necessary. In the case where the common layer 174 is provided, a layer having the same function as the common layer 174 among the layers included in the EL layer 172 is not necessarily provided.

The protective layer 273 is provided over the conductive layer 173. The insulating layer 276 is provided over the protective layer 273.

Figure 31B:
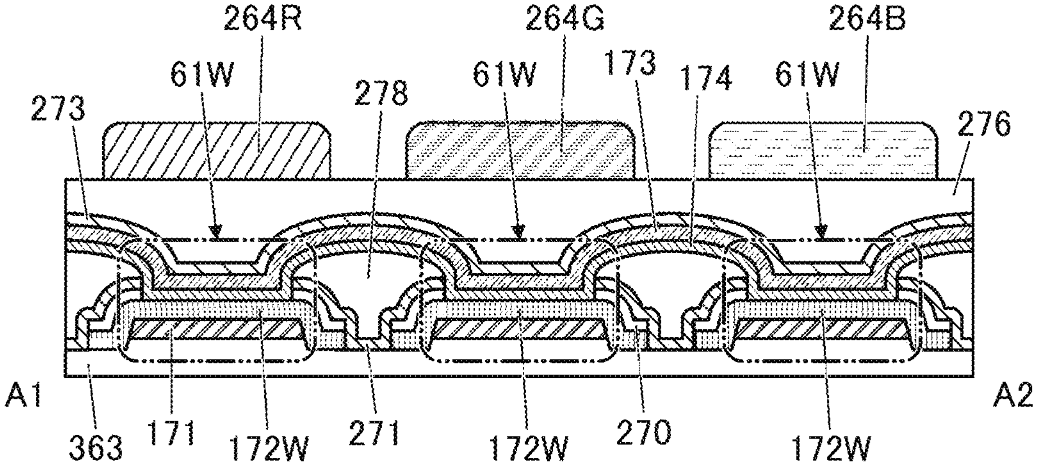

FIG. 31B illustrates an example different from the above example. Specifically, the structure illustrated in FIG. 31B includes three light-emitting elements 61W instead of the light-emitting element 61R, the light-emitting element 61G, and the light-emitting element 61B in the structure illustrated in FIG. 31A. In addition, the structure illustrated in FIG. 31B includes the insulating layer 276 over the three light-emitting elements 61W. The structure illustrated in FIG. 31B includes the coloring layer 264R, the coloring layer 264G, and the coloring layer 264B over the insulating layer 276. Specifically, the coloring layer 264R that transmits red light is provided at a position overlapping with the left light-emitting element 61W. The coloring layer 264G that transmits green light is provided at a position overlapping with the middle light-emitting element 61W. The coloring layer 264B that transmits blue light is provided at a position overlapping with the right light-emitting element 61W. Thus, the display apparatus can display color images. The structure illustrated in FIG. 31B is also a modification example of the structure illustrated in FIG. 30C.

Figure 32A:
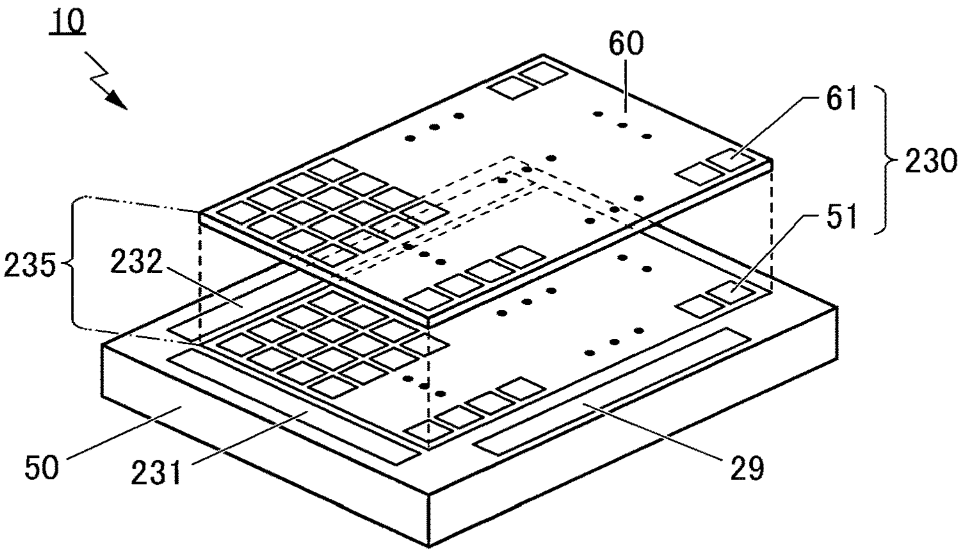
FIG. 32A and FIG. 32B are perspective views of the display apparatus.

FIG. 32A is a perspective view of the display apparatus 10. The display apparatus 10 illustrated in FIG. 32A includes a layer 60 overlapping with a layer 50. The layer 50 includes a plurality of pixel circuits 51 arranged in a matrix, the first driver circuit portion 231, the second driver circuit portion 232, and an input/output terminal portion 29. The layer 60 includes the plurality of light-emitting elements 61 arranged in a matrix.

One pixel circuit 51 and one light-emitting element 61 are electrically connected to each other and function as one pixel 230. Thus, a region where the plurality of pixel circuits 51 included in the layer 50 and the plurality of light-emitting elements 61 included in the layer 60 overlap with each other functions as the display region 235.

For example, power, a signal, and the like necessary for the operation of the display apparatus 10 are supplied to the display apparatus 10 through the input/output terminal portion 29. In the display apparatus 10 illustrated in FIG. 32A, the transistors included in the peripheral driver circuit can be formed in the same steps as the transistors included in the pixels 230.

Figure 32B:
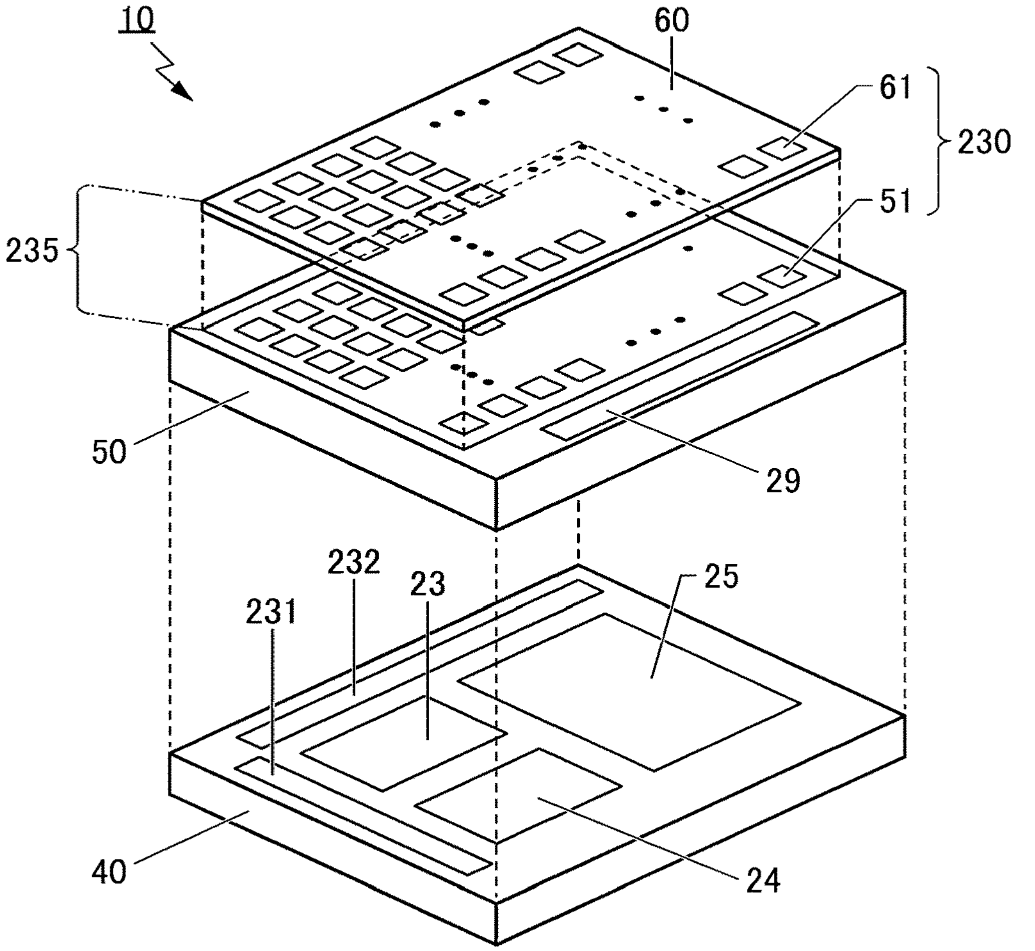

The display apparatus 10 may have a structure illustrated in FIG. 32B in which a layer 40, the layer 50, and the layer 60 are provided to overlap with one another. In the display apparatus 10 in FIG. 32B, the plurality of pixel circuits 51 arranged in a matrix are provided in the layer 50, and the first driver circuit portion 231 and the second driver circuit portion 232 are provided in the layer 40. By providing the first driver circuit portion 231 and the second driver circuit portion 232 in a layer different from that of the pixel circuit 51 in the display apparatus 10 illustrated in FIG. 32B, the bezel width around the display region 235 can be small; thus, the area occupied by the display region 235 can be increased.

With the increase in the occupied area of the display region 235, the display apparatus 10 illustrated in FIG. 32B can have increased definition. Under a fixed definition of the display region 235 in the display apparatus 10 illustrated in FIG. 32B, the occupied area per pixel can be increased; thus, the emission luminance can be increased. In addition, the proportion of the light-emitting area to the area occupied by one pixel (also referred to as “aperture ratio”) can be increased by enlarging the area occupied by one pixel. For example, the pixel aperture ratio can be greater than or equal to 40% and less than 100%, preferably greater than or equal to 50% and less than or equal to 95%, further preferably greater than or equal to 60% and less than or equal to 95%. An increase in the occupied area per pixel can lower the density of current supplied to the light-emitting elements 61. Thus, a load applied to the light-emitting element 61 is reduced. Thus, the reliability of the semiconductor device 100 can be increased. Thus, the reliability of the display apparatus 10 including the semiconductor device 100 can be increased.

Stacking the display region 235, the peripheral driver circuit, and the like can shorten a wiring electrically connecting them. Thus, wiring resistance and parasitic capacitance are reduced. Moreover, the semiconductor device 100 can have a higher operation speed. The semiconductor device 100 is reduced in power consumption.

The layer 40 may include a CPU 23 (Central Processing Unit), a GPU 24 (Graphics Processing Unit), and a memory circuit portion 25, in addition to the peripheral driver circuit. In this embodiment and the like, a peripheral driver circuit, a CPU 23, a GPU 24, and a memory circuit portion 25 are collectively referred to as a “functional circuit” in some cases.

For example, the CPU 23 has a function of controlling the operations of the GPU 24 and the circuits provided in the layer 40 in accordance with a program stored in the memory circuit portion 25. The GPU 24 has a function of performing arithmetic processing for generating image data. Furthermore, the GPU 24 can perform a large number of matrix operations (product-sum operations) in parallel and thus can perform arithmetic processing using a neural network at high speed, for example. The GPU 24 has a function of correcting image data using correction data stored in the memory circuit portion 25, for example. The GPU 24 has a function of generating image data in which one or more of brightness, hue, contrast, and the like are corrected, for example.

Upconversion or downconversion of image data may be performed using the GPU 24 in the display apparatus 10. A super-definition circuit may be provided in the layer 40 in the display apparatus 10. The super-definition circuit has a function of determining a potential of any pixel included in the display region 235 by product-sum operation of weights and potentials of pixels placed in the periphery of the pixel. The super-definition circuit has a function of upconverting image data with a definition lower than that of the display region 235. The super-definition circuit has a function of downconverting image data with a definition higher than that of the display region 235.

Providing the super-definition circuit can reduce the load on the GPU 24 in the display apparatus 10. For example, the GPU 24 executes processing up to 2K definition (or 4K definition) and the super-definition circuit performs upconversion to 4K definition (or 8K definition), whereby the load on the GPU 24 can be reduced. Downconversion may be performed in a similar manner.

Note that the functional circuit included in the layer 40 does not necessarily include all of these components, and may include another component. For example, one or more of a potential generation circuit that generates a plurality of different potentials, a power management circuit that controls supply or stop of power for each circuit included in the display apparatus 10, and the like may be provided.

The supply or stop of electrical power may be performed per circuit included in the CPU 23. For example, power consumption of the CPU 23 can be reduced by stopping power supply to a circuit, which is determined not to be used for a while, of the circuits included in the CPU 23 and restarting power supply to the circuit as needed. Data necessary for restarting power supply is stored in, for example, a memory circuit in the CPU 23, the memory circuit portion 25, or the like before the circuit is stopped. Data necessary for recovery of the circuit is stored in, for example, the memory circuit in the CPU 23, the memory circuit portion 25, or the like, whereby high-speed recovery of the circuit stopped can be achieved. Note that supply of a clock signal may be stopped in the CPU 23 to stop the circuit operation.

As the functional circuit, one or more of a DSP circuit, a sensor circuit, a communication circuit, an FPGA (Field Programmable Gate Array), and the like may be included, for example.

Some of the transistors in the functional circuit included in the layer 40 may be provided in the layer 50. Moreover, some of the transistors in the pixel circuits 51 included in the layer 50 may be provided in the layer 40. Thus, the functional circuit may have a structure including a Si transistor and an OS transistor. In addition, the pixel circuits 51 may each have a structure including the Si transistor and the OS transistor.

Figure 33:
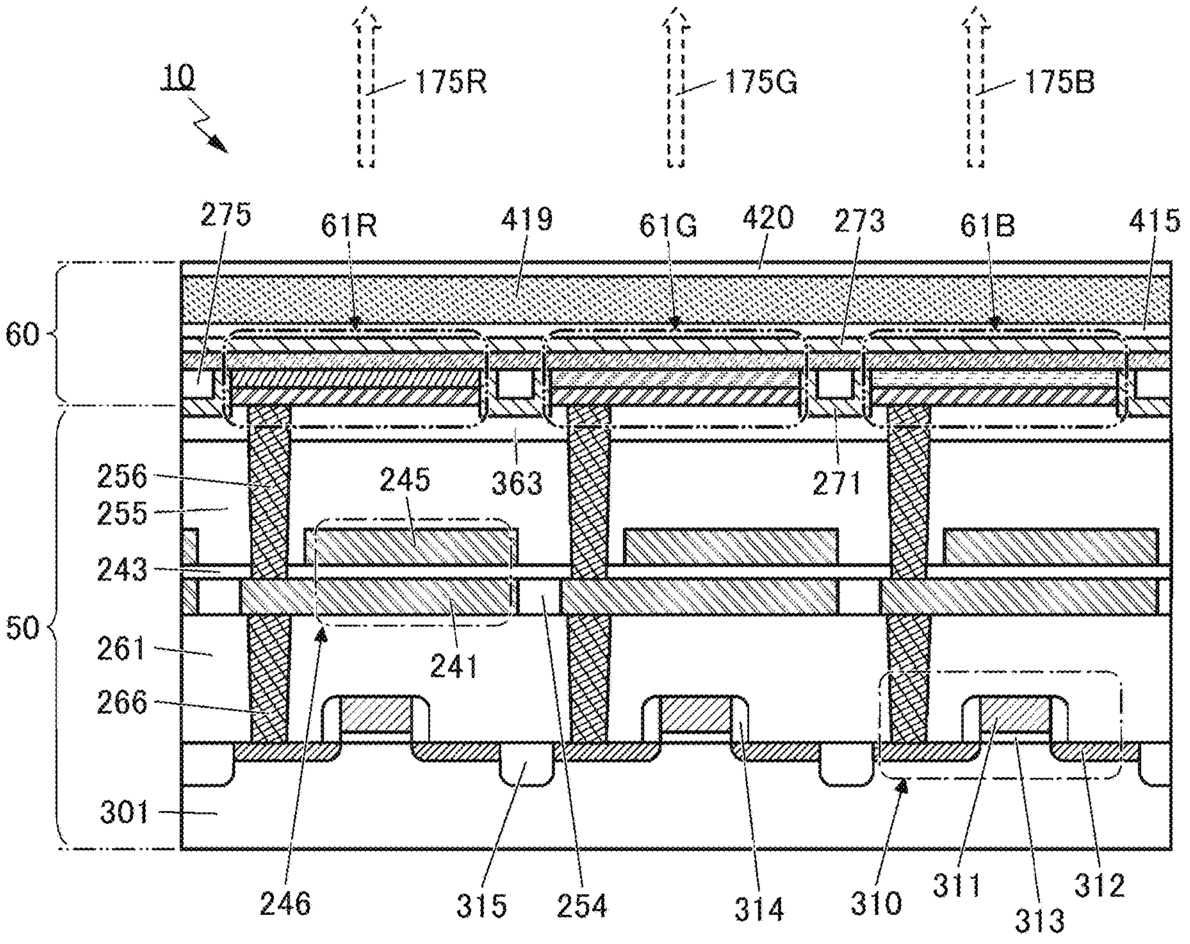
FIG. 33 is a cross-sectional view illustrating an example of the display apparatus.

FIG. 33 illustrates a cross-sectional structure example of part of the display apparatus 10 illustrated in FIG. 32A. The display apparatus 10 illustrated in FIG. 33 includes the layer 50 including a substrate 301, a capacitor 246, and a transistor 310 and the layer 60 including the light-emitting element 61R, the light-emitting element 61G, and the light-emitting element 61B. The layer 60 is provided over the insulating layer 363 included in the layer 50.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance region 312 is a region where the substrate 301 is doped with an impurity, and functions as one of a source and a drain. The insulating layer 314 is provided to cover the side surface of the conductive layer 311 and functions as an insulating layer.

In addition, an element isolation layer 315 is provided between two adjacent transistors 310 to be embedded in the substrate 301.

The insulating layer 261 is provided to cover the transistor 310. The capacitor 246 is provided over the insulating layer 261.

The capacitor 246 includes a conductive layer 241, a conductive layer 245, and an insulating layer 243 positioned therebetween. The conductive layer 241 functions as one electrode of the capacitor 246. The conductive layer 245 functions as the other electrode of the capacitor 246. The insulating layer 243 functions as a dielectric of the capacitor 246.

The conductive layer 241 is provided over the insulating layer 261 and is embedded in an insulating layer 254. The conductive layer 241 is electrically connected to one of the source and the drain of the transistor 310 through a plug 266 embedded in the insulating layer 261. The insulating layer 243 is provided to cover the conductive layer 241. The conductive layer 245 is provided in a region overlapping with the conductive layer 241 with the insulating layer 243 therebetween.

An insulating layer 255 is provided to cover the capacitor 246. The insulating layer 363 is provided over the insulating layer 255. The light-emitting element 61R, the light-emitting element 61G, and the light-emitting element 61B are provided over the insulating layer 363. A protective layer 415 is provided over the light-emitting element 61R, the light-emitting element 61G, and the light-emitting element 61B. A substrate 420 is provided over the top surface of the protective layer 415 with a resin layer 419 therebetween.

The pixel electrode of the light-emitting element is electrically connected to one of the source and the drain of the transistor 310 through a plug 256 embedded in the insulating layer 243, the insulating layer 255, and the insulating layer 363, the conductive layer 241 embedded in the insulating layer 254, and the plug 266 embedded in the insulating layer 261.

Figure 34:
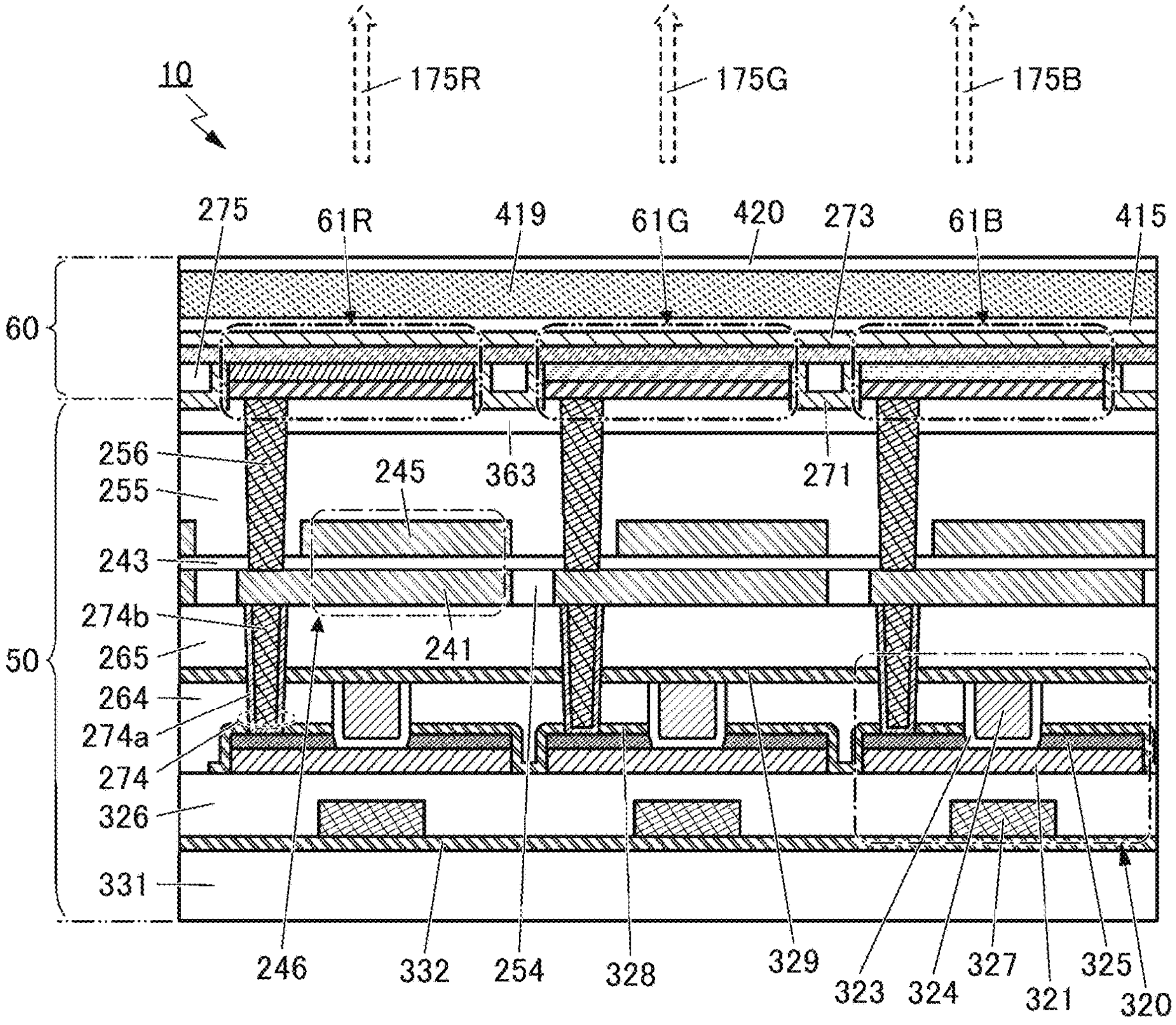
FIG. 34 is a cross-sectional view illustrating an example of the display apparatus.

FIG. 34 is a modification example of the cross-sectional structure example illustrated in FIG. 33. The cross-sectional structure example of the display apparatus 10 illustrated in FIG. 34 is different from the cross-sectional structure example illustrated in FIG. 33 mainly in that a transistor 320 is provided instead of the transistor 310. Note that description of portions similar to those in FIG. 33 is sometimes omitted.

A transistor 320 is a transistor that includes a metal oxide (also referred to as an oxide semiconductor) in a semiconductor layer where a channel is formed.

The transistor 320 includes a semiconductor layer 321, an insulating layer 323, a conductive layer 324, a pair of conductive layers 325, an insulating layer 326, and a conductive layer 327.

As the substrate 331, an insulating substrate or a semiconductor substrate can be used.

An insulating layer 332 is provided over the substrate 331. The insulating layer 332 functions, for example, as a barrier layer that prevents diffusion of impurities such as water or hydrogen from the substrate 331 into the transistor 320 and release of oxygen from the semiconductor layer 321 to the insulating layer 332 side. As the insulating layer 332, for example, a film through which hydrogen or oxygen is less likely to diffuse than through a silicon oxide film. As the insulating layer 332, an aluminum oxide film, a hafnium oxide film, a silicon nitride film, or the like can be used.

The conductive layer 327 is provided over the insulating layer 332. The insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321, for example. The top surface of the insulating layer 326 is preferably planarized The semiconductor layer 321 is provided over the insulating layer 326. The semiconductor layer 321 preferably includes a metal oxide (also referred to as an oxide semiconductor) film having semiconductor characteristics. Materials that can be suitably used for the semiconductor layer 321 will be described in detail later.

The pair of conductive layers 325 is provided over and in contact with the semiconductor layer 321, and functions as a source electrode and a drain electrode.

An insulating layer 328 is provided to cover, for example, the top and side surfaces of the pair of conductive layers 325, the side surface of the semiconductor layer 321, and the like. The insulating layer 264 is provided over the insulating layer 328. The insulating layer 328 functions as a barrier layer that prevents diffusion of impurities such as, for example, water or hydrogen from, for example, the insulating layer 264 or the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325, and the top surface of the semiconductor layer 321 and the conductive layer 324 are embedded in the opening. The conductive layer 324 functions as a second gate electrode. The insulating layer 323 functions as a second gate insulating layer.

The top surface of the conductive layer 324, the top surface of the insulating layer 323, and the top surface of the insulating layer 264 are planarized such that they are substantially level with each other. The insulating layer 329 and the insulating layer 265 are provided to cover these layers.

The insulating layer 264 and the insulating layer 265 each function as an interlayer insulating layer. The insulating layer 329 functions as a barrier layer that prevents diffusion of impurities such as, for example, water or hydrogen from, for example, the insulating layer 265 or the like into the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274*a* that covers side surfaces of each opening formed in the insulating layer 265, the insulating layer 329, the insulating layer 264, and the insulating layer 328 and part of the top surface of the conductive layer 325, and a conductive layer 274*b* in contact with a top surface of the conductive layer 274*a*. In that case, a conductive material in which hydrogen and oxygen are less likely to diffuse is preferably used for the conductive layer 274*a*.

Figure 35:
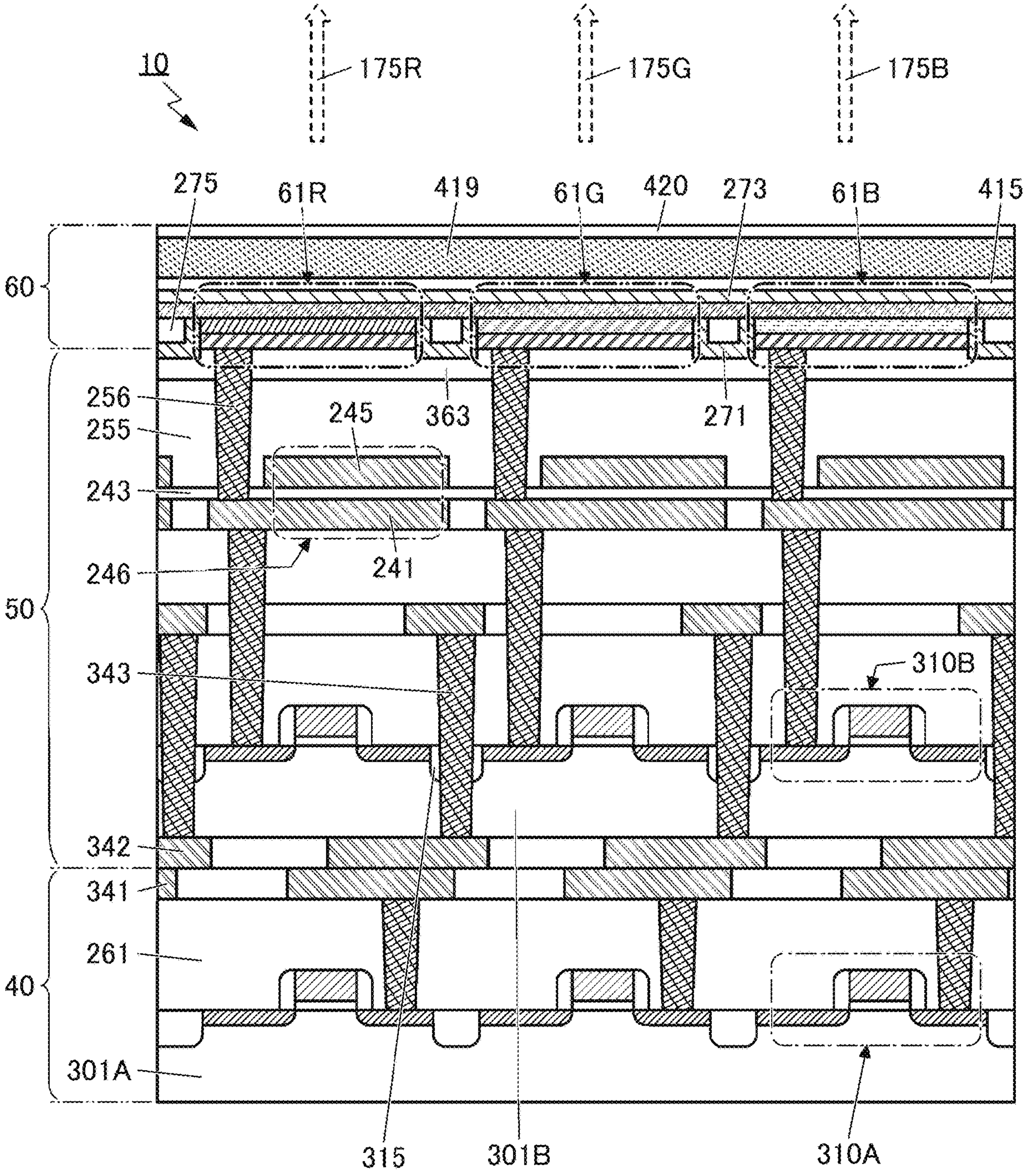
FIG. 35 is a cross-sectional view illustrating an example of the display apparatus.

FIG. 35 illustrates a cross-sectional structure example of part of the display apparatus 10 illustrated in FIG. 32B. The display apparatus 10 illustrated in FIG. 35 has a structure in which a transistor 310A whose channel is formed in a substrate 301A included in the layer 40 and a transistor 310B whose channel is formed in the substrate 301B included in the layer 50 are stacked. A material similar to that of the substrate 301 can be used for the substrate 301A.

The display apparatus 10 illustrated in FIG. 35 has a structure in which the layer 60 including the light-emitting element 61, the layer 50 including a substrate 301B, the transistor 310B, and the capacitor 246, and the layer 40 including the substrate 301A and the transistor 310A are attached to each other.

The substrate 301B is provided with a plug 343 that penetrates the substrate 301B. The plug 343 functions as a Si through electrode (TSV: Through Silicon Via). The plug 343 is electrically connected to a conductive layer 342 provided on the rear surface (the surface that is opposite to the substrate 420 side) of the substrate 301B. The conductive layer 341 is provided over the insulating layer 261 over the substrate 301A.

The conductive layer 341 and the conductive layer 342 are bonded to each other, whereby the layer 40 and the layer 50 are electrically connected to each other.

The same conductive material is preferably used for the conductive layer 341 and the conductive layer 342. For example, a metal film containing an element selected from Al, Cr, Cu, Ta, Sn, Zn, Au, Ag, Pt, Ti, Mo, and W, a metal nitride film containing the above element as its component (a titanium nitride film, a molybdenum nitride film, or a tungsten nitride film), or the like can be used. Copper is particularly preferably used for the conductive layer 341 and the conductive layer 342. In that case, it is possible to employ Cu—Cu (copper-copper) direct bonding (a technique for achieving electrical continuity by connecting Cu (copper) pads) for bonding between the conductive layer 341 and the conductive layer 342. Note that the conductive layer 341 and the conductive layer 342 may be bonded to each other with a bump therebetween.

Figure 36:
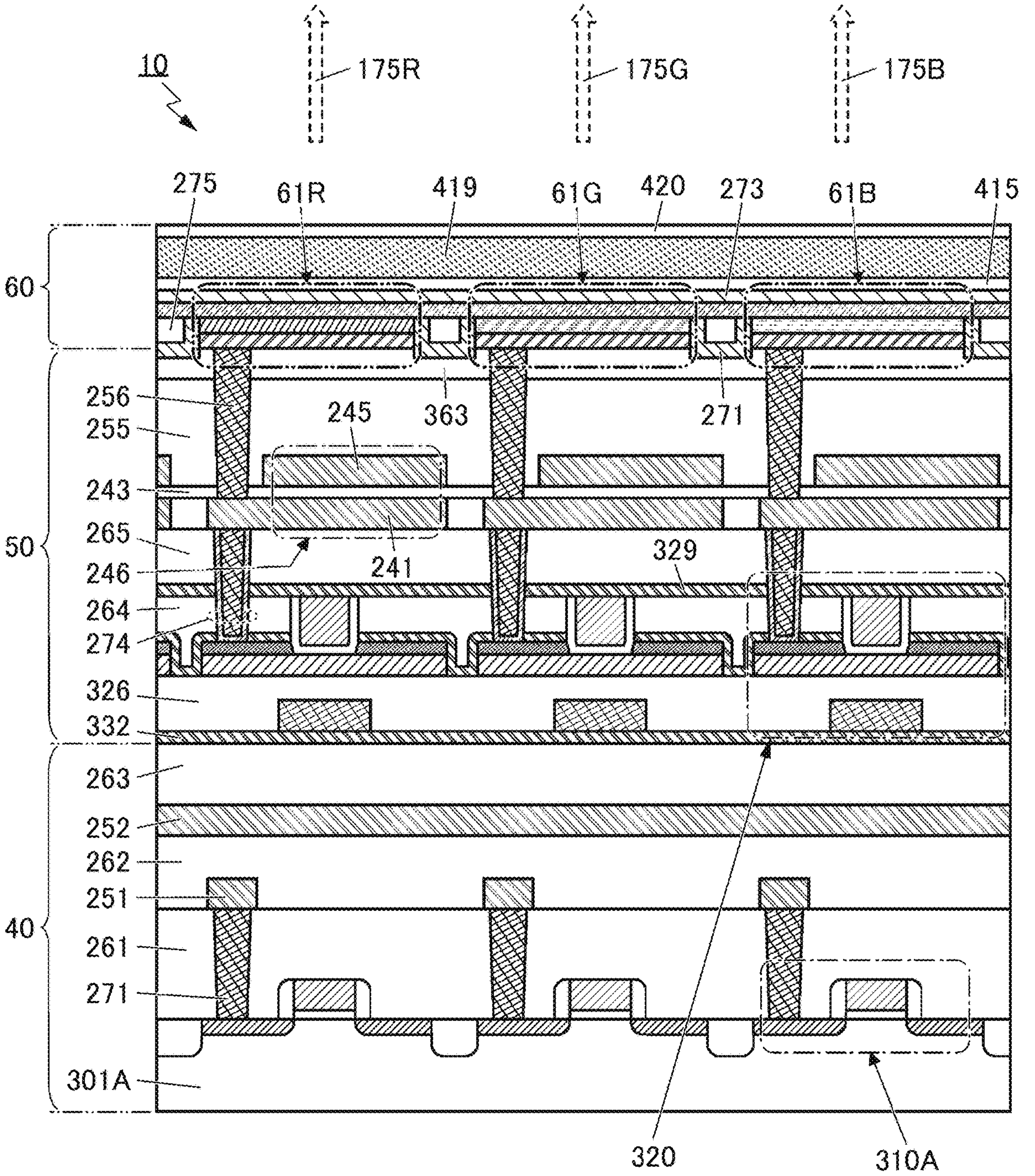
FIG. 36 is a cross-sectional view illustrating an example of the display apparatus.

FIG. 36 is also a modification example of the cross-sectional structure example illustrated in FIG. 35. In the cross-sectional structure example of the display apparatus 10 illustrated in FIG. 36, the transistor 310A whose channel is formed in the substrate 301A and the transistor 320 including a metal oxide in the semiconductor layer where the channel is formed are stacked. Note that portions similar to those in FIG. 33 to FIG. 35 are not described in some cases.

The layer 50 illustrated in FIG. 36 has a structure in which the substrate 331 is removed from the layer 50 illustrated in FIG. 34. In the layer 40 illustrated in FIG. 36, the insulating layer 261 is provided to cover the transistor 310A. A conductive layer 251 is provided over the insulating layer 261. An insulating layer 262 is provided to cover the conductive layer 251. A conductive layer 252 is provided over the insulating layer 262. The conductive layer 251 and the conductive layer 252 each function as a wiring. An insulating layer 263 and the insulating layer 332 are provided to cover the conductive layer 252. The transistor 320 is provided over the insulating layer 332. The insulating layer 265 is provided to cover the transistor 320, and the capacitor 246 is provided over the insulating layer 265. The capacitor 246 and the transistor 320 are electrically connected to each other through the plug 274. The layer 50 is provided to overlap with the insulating layer 263 included in the layer 40.

The transistor 320 can be used as transistors included in the pixel circuits 51. The transistor 310 can be used as the transistors included in the pixel circuits 51 or transistors included in the peripheral driver circuit. The transistor 310 and the transistor 320 can also be used as transistors included in a functional circuit such as an arithmetic circuit or a memory circuit, for example.

In the display apparatus 10 having such a structure illustrated in FIG. 36, not only the pixel circuits 51 but also the peripheral driver circuit or the like can be formed directly under the layer 60 including the light-emitting element 61, for example. Thus, the display apparatus can be downsized as compared with the case where a driver circuit is provided around a display region.

The structure described in this embodiment can be used in an appropriate combination with any of the structures described in the other embodiments and examples.

Embodiment 4

In this embodiment, a transistor that can be used in the semiconductor device of one embodiment of the present invention will be described.

<Structure Example of Transistor>

Figure 37A:
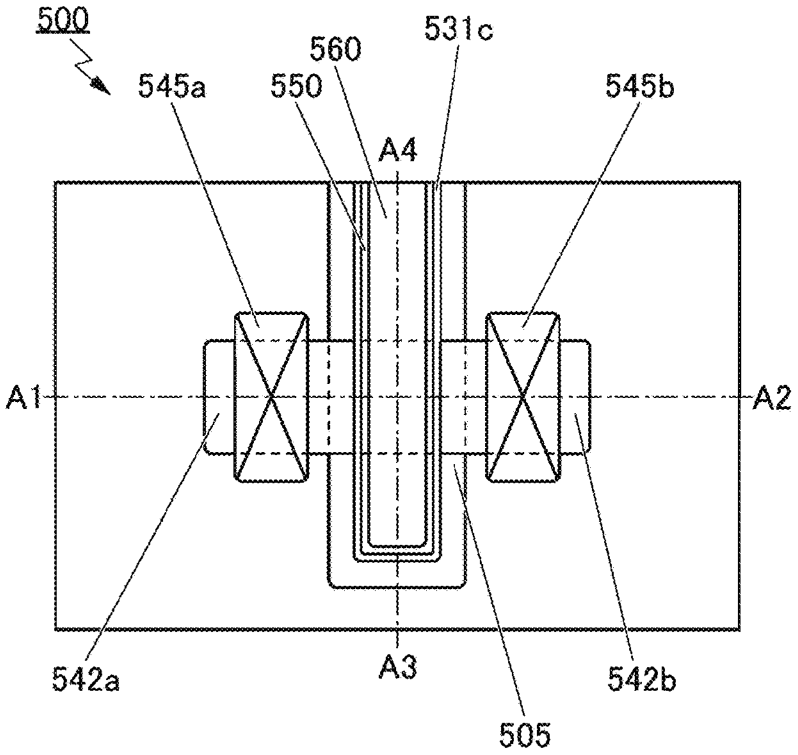
FIG. 37A is a top view illustrating a structure example of a transistor.
Figure 37C:
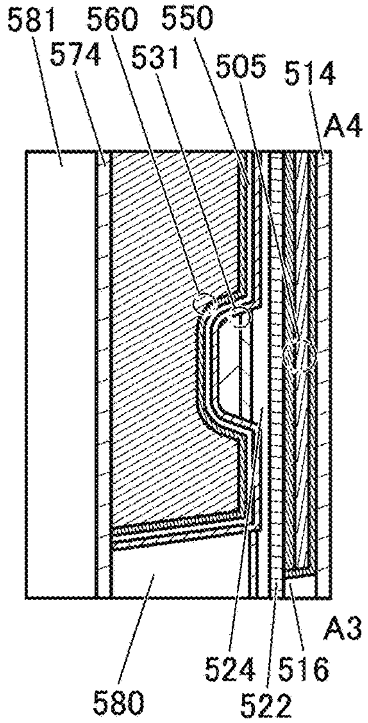
FIG. 37B and FIG. 37C are cross-sectional views illustrating the structure example of the transistor.
Figure 37B:
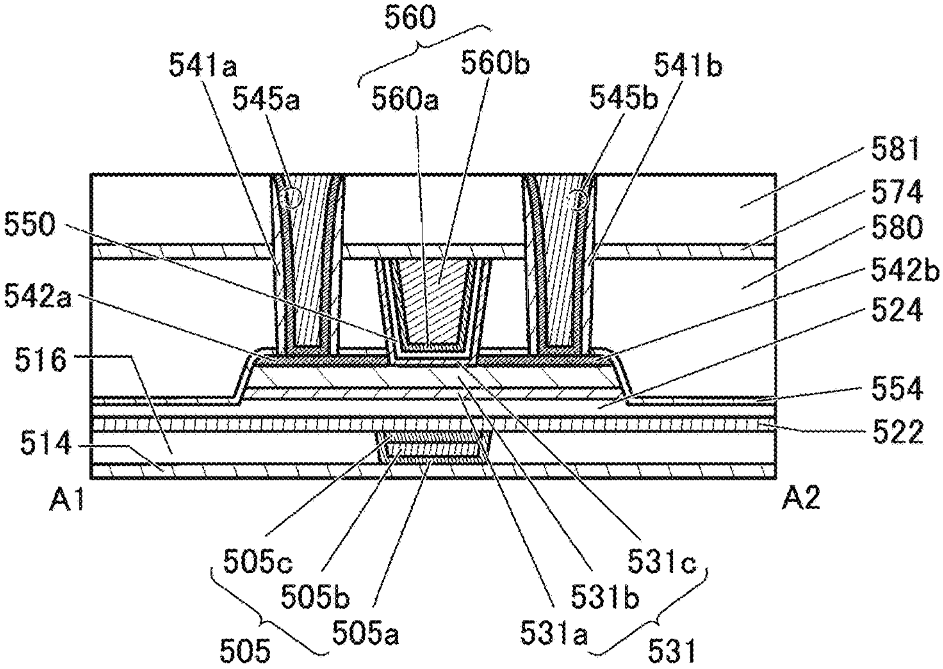

FIG. 37A, FIG. 37B, and FIG. 37C are a top view and cross-sectional views of a transistor 500 that can be used in the semiconductor device of one embodiment of the present invention. The transistor 500 can be used in the semiconductor device of one embodiment of the present invention.

FIG. 37A is the top view of the transistor 500. FIG. 37B and FIG. 37C are the cross-sectional views of the transistor 500. Here, FIG. 37B is a cross-sectional view of a portion indicated by the dashed-dotted line A1-A2 in FIG. 37A and is a cross-sectional view of the transistor 500 in the channel length direction. FIG. 37C is a cross-sectional view of a portion indicated by the dashed-dotted line A3-A4 in FIG. 37A and is a cross-sectional view of the transistor 500 in the channel width direction. Note that some components are omitted in the top view of FIG. 37A for clarity of the drawing.

As illustrated in FIG. 37, the transistor 500 includes a metal oxide 531*a* placed over a substrate (not illustrated); a metal oxide 531*b* placed over the metal oxide 531*a*; a conductor 542*a* and a conductor 542*b* that are placed apart from each other over the metal oxide 531*b*; an insulator 580 that is placed over the conductor 542*a* and the conductor 542*b* and has an opening between the conductor 542*a* and the conductor 542*b*; a conductor 560 placed in the opening; an insulator 550 placed between the conductor 560 and the metal oxide 531*b*, the conductor 542*a*, the conductor 542*b*, and the insulator 580; and a metal oxide 531*c* placed between the insulator 550 and the metal oxide 531*b*, the conductor 542*a*, the conductor 542*b*, and the insulator 580. Here, as illustrated in FIG. 37B and FIG. 37C, it is preferable that the top surface of the conductor 560 be substantially aligned with the top surfaces of the insulator 550, an insulator 554, the metal oxide 531*c*, and the insulator 580. Hereinafter, the metal oxide 531*a*, the metal oxide 531*b*, and the metal oxide 531*c* may be collectively referred to as a metal oxide 531. The conductor 542*a* and the conductor 542*b* may be collectively referred to as a conductor 542.

In the transistor 500 illustrated in FIG. 37, the side surfaces of the conductor 542*a* and the conductor 542*b* on the conductor 560 side are substantially perpendicular. Note that the transistor 500 is not limited thereto, and in the transistor 500, the angle formed between the side surfaces and the bottom surfaces of the conductor 542*a* and the conductor 542*b* may be greater than or equal to 10° and less than or equal to 80°, preferably greater than or equal to 30° and less than or equal to 60°. The side surfaces of the conductor 542*a* and the conductor 542*b* that face each other may have a plurality of faces.

As illustrated in FIG. 37, in the transistor 500, the insulator 554 is preferably placed between the insulator 580 and an insulator 524, the metal oxide 531*a*, the metal oxide 531*b*, the conductor 542*a*, the conductor 542*b*, and the metal oxide 531*c*. Here, as illustrated in FIG. 37B and FIG. 37C, the insulator 554 is preferably in contact with the side surface of the metal oxide 531*c*, the top surface and the side surface of the conductor 542*a*, the top surface and the side surface of the conductor 542*b*, the side surfaces of the metal oxide 531*a* and the metal oxide 531*b*, and the top surface of the insulator 524.

In the transistor 500 illustrated in FIG. 37, three layers of the metal oxide 531*a*, the metal oxide 531*b*, and the metal oxide 531*c* are stacked as the metal oxide 531 in and around a region where a channel is formed (hereinafter, also referred to as a channel formation region); however, one embodiment of the present invention is not limited thereto. For example, a two-layer structure of the metal oxide 531*b* and the metal oxide 531*c* or a stacked-layer structure of four or more layers may be employed as the metal oxide 531. Although the conductor 560 is illustrated to have a stacked-layer structure of two layers in the transistor 500 illustrated in FIG. 37, the present invention is not limited thereto. For example, the conductor 560 may have a single-layer structure or a stacked-layer structure of three or more layers. Furthermore, in the metal oxide 531, each of the metal oxide 531*a*, the metal oxide 531*b*, and the metal oxide 531*c* may have a stacked-layer structure of two or more layers.

For example, in the case where the metal oxide 531*c* has a stacked-layer structure including a first metal oxide and a second metal oxide provided over the first metal oxide, it is preferable that the first metal oxide have a composition similar to that of the metal oxide 531*b* and the second metal oxide have a composition similar to that of the metal oxide 531*a*.

Here, the conductor 560 functions as a gate electrode of the transistor, and the conductor 542*a* and the conductor 542*b* function as a source electrode and a drain electrode of a transistor. As described above, the conductor 560 is formed to be embedded in the opening of the insulator 580 and the region sandwiched between the conductor 542*a* and the conductor 542*b*. Here, the positions of the conductor 560, the conductor 542*a*, and the conductor 542*b* are selected in a self-aligned manner with respect to the opening of the insulator 580. That is, in accordance with one embodiment of the present invention, in the transistor 500, the gate electrode can be placed between the source electrode and the drain electrode in a self-aligned manner. Thus, the conductor 560 can be formed without an alignment margin, resulting in a reduction in the area occupied by the transistor 500. Accordingly, the display apparatus can have higher definition. In addition, the display apparatus can have a narrow bezel.

As illustrated in FIG. 37, the conductor 560 preferably includes a conductor 560*a* provided inside the insulator 550 and a conductor 560*b* provided to be embedded inside the conductor 560*a*.

The transistor 500 preferably includes an insulator 514 placed over the substrate (not illustrated); an insulator 516 placed over the insulator 514; a conductor 505 placed to be embedded in the insulator 516; an insulator 522 placed over the insulator 516 and the conductor 505; and the insulator 524 placed over the insulator 522. Moreover, the metal oxide 531*a* is preferably placed over the insulator 524.

An insulator 574 and an insulator 581 functioning as interlayer films are preferably placed over the transistor 500. Here, the insulator 574 is preferably placed in contact with the top surfaces of the conductor 560, the insulator 550, the insulator 554, the metal oxide 531*c*, and the insulator 580.

The insulator 522, the insulator 554, and the insulator 574 preferably have a function of inhibiting diffusion of hydrogen (e.g., at least one of a hydrogen atom, a hydrogen molecule, and the like). For example, the insulator 522, the insulator 554, and the insulator 574 preferably have a lower hydrogen permeability than the insulator 524, the insulator 550, and the insulator 580. Moreover, the insulator 522 and the insulator 554 preferably have a function of inhibiting diffusion of oxygen (e.g., at least one of an oxygen atom, an oxygen molecule, and the like). For example, the insulator 522 and the insulator 554 preferably have a lower oxygen permeability than the insulator 524, the insulator 550, and the insulator 580.

Here, the insulator 524, the metal oxide 531, and the insulator 550 are separated from the insulator 580 and the insulator 581 by the insulator 554 and the insulator 574. The insulator 554 and the insulator 574 can inhibit entry of, for example, impurities such as hydrogen contained in the insulator 580 and the insulator 581 and excess oxygen into the insulator 524, the metal oxide 531, and the insulator 550.

A conductor 545 (a conductor 545*a* and a conductor 545*b*) that is electrically connected to the transistor 500 and functions as a plug is preferably provided. Note that an insulator 541 (an insulator 541*a* and an insulator 541*b*) is provided in contact with the side surface of the conductor 545 functioning as a plug. That is, the insulator 541 is provided in contact with the inner wall of an opening in the insulator 554, the insulator 580, the insulator 574, and the insulator 581. In addition, a structure may be employed in which a first conductor of the conductor 545 is provided in contact with the side surface of the insulator 541 and a second conductor of the conductor 545 is provided on the inner side of the first conductor of the conductor 545. Here, the top surface of the conductor 545 and the top surface of the insulator 581 can be substantially level with each other. Although the transistor 500 illustrated in FIG. 37 has a structure in which the first conductor of the conductor 545 and the second conductor of the conductor 545 are stacked, one embodiment of the present invention is not limited thereto. For example, the conductor 545 may have a single-layer structure or a stacked-layer structure of three or more layers. In the case where a component has a stacked-layer structure, layers may be distinguished by ordinal numbers corresponding to the formation order.

In the transistor 500, a metal oxide functioning as an oxide semiconductor (hereinafter, also referred to as an oxide semiconductor) is preferably used as the metal oxide 531 including the channel formation region (the metal oxide 531*a*, the metal oxide 531*b*, and the metal oxide 531*c*). For example, it is preferable to use a metal oxide having a band gap of 2 eV or more, preferably 2.5 eV or more as the metal oxide to be the channel formation region of the metal oxide 531.

The metal oxide preferably contains at least indium (In) or zinc (Zn). In particular, indium (In) and zinc (Zn) are preferably contained. In addition to them, an element M is preferably contained. As the element M, one or more of aluminum (Al), gallium (Ga), yttrium (Y), tin (Sn), boron (B), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). The element M further preferably contains one or both of Ga and Sn.

As illustrated in FIG. 37B, the metal oxide 531*b* in a region that does not overlap with the conductor 542 sometimes has a smaller thickness than the metal oxide 531*b* in a region that overlaps with the conductor 542. The thin region is formed when part of the top surface of the metal oxide 531*b*, which does neither overlap with the conductor 542*a* nor the conductor 542*b*, is removed at the time of forming the conductor 542*a* and the conductor 542*b*. When a conductive film to be the conductor 542 is formed over the top surface of the metal oxide 531*b*, a low-resistance region is sometimes formed in the vicinity of the interface with the conductive film. Removing the low-resistance region positioned between the conductor 542*a* and the conductor 542*b* on the top surface of the metal oxide 531*b* can prevent formation of the channel in the region.

According to one embodiment of the present invention, a display apparatus that includes small-size transistors and thus has high definition can be provided. A display apparatus that includes a transistor with a high on-state current and thus has high luminance can be provided. A display apparatus that includes a transistor operating at high speed and thus operates at high speed can be provided. A display apparatus that includes a transistor having stable electrical characteristics and thus is highly reliable can be provided. A display apparatus that includes a transistor with a low off-state current and thus has low power consumption can be provided.

The structure of the transistor 500 that can be used in the display apparatus of one embodiment of the present invention will be described in detail.

The conductor 505 is placed to include a region overlapping with the metal oxide 531 and the conductor 560. Furthermore, the conductor 505 is preferably provided to be embedded in the insulator 516.

The conductor 505 includes a conductor 505*a*, a conductor 505*b*, and a conductor 505*c*. The conductor 505*a* is provided in contact with the bottom surface and the sidewall of the opening provided in the insulator 516. The conductor 505*b* is provided to be embedded in a depression portion formed in the conductor 505*a*. Here, the top surface of the conductor 505*b* is lower in level than the top surface of the conductor 505*a* and the top surface of the insulator 516. The conductor 505*c* is provided in contact with the top surface of the conductor 505*b* and the side surface of the conductor 505*a*. Here, the top surface of the conductor 505*c* is substantially level with the top surface of the conductor 505*a* and the top surface of the insulator 516. That is, the conductor 505*b* is surrounded by the conductor 505*a* and the conductor 505*c*.

Here, for the conductor 505*a* and the conductor 505*c*, for example, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 505*a* and the conductor 505*c* are formed using a conductive material having a function of inhibiting diffusion of hydrogen, impurities such as hydrogen, for example, contained in the conductor 505*b* can be inhibited from diffusing into the metal oxide 531 through the insulator 524 and the like. When the conductor 505*a* and the conductor 505*c* are formed using a conductive material having a function of inhibiting diffusion of oxygen, the conductivity of the conductor 505*b* can be inhibited from being lowered because of oxidation. As the conductive material having a function of inhibiting diffusion of oxygen, for example, titanium, titanium nitride, tantalum, tantalum nitride, ruthenium, ruthenium oxide, or the like is preferably used. Thus, the conductor 505*a* is a single layer or stacked layers of the above conductive materials. For example, titanium nitride is used for the conductor 505*a*.

For the conductor 505*b*, a conductive material containing tungsten, copper, or aluminum as its main component is preferably used. For example, tungsten is used for the conductor 505*b*.

The conductor 560 sometimes functions as a first gate (also referred to as top gate) electrode. The conductor 505 sometimes functions as a second gate (also referred to as bottom gate) electrode. In that case, by changing a potential applied to the conductor 505 independently of a potential applied to the conductor 560 in the transistor 500, Vth of the transistor 500 can be controlled. In particular, by applying a negative potential to the conductor 505, Vth of the transistor 500 can be higher than 0 V and the off-state current can be made low. Thus, a drain current at the time when a potential applied to the conductor 560 is 0 V can be lower in the case where a negative potential is applied to the conductor 505 than in the case where the negative potential is not applied to the conductor 505.

The conductor 505 is preferably provided to be larger than the channel formation region in the metal oxide 531. In particular, it is preferable that the conductor 505 extend beyond an end portion of the metal oxide 531 that intersects with the channel width direction, as illustrated in FIG. 37C. That is, the conductor 505 and the conductor 560 preferably overlap with each other with the insulator therebetween, in a region outside the side surface of the metal oxide 531 in the channel width direction.

With the above structure of the transistor 500, the channel formation region of the metal oxide 531 can be electrically surrounded by an electric field of the conductor 560 having a function of the first gate electrode and an electric field of the conductor 505 having a function of the second gate electrode.

As illustrated in FIG. 37C, the conductor 505 extends to function as a wiring as well. However, without limitation to this structure, a structure in which a conductor functioning as a wiring is provided below the conductor 505 may be employed for one embodiment of the present invention.

The insulator 514 preferably functions as a barrier insulating film that inhibits entry of impurities such as, for example, water or hydrogen into the transistor 500 from the substrate side. Accordingly, it is preferable to use, for the insulator 514, an insulating material having a function of inhibiting diffusion of impurities such as, for example, a hydrogen atom, a hydrogen molecule, a water molecule, a nitrogen atom, a nitrogen molecule, a nitrogen oxide molecule ($N_2O$, NO, $NO_2$, or the like), and a copper atom (an insulating material through which the impurities are less likely to pass). Alternatively, it is preferable to use an insulating material having a function of inhibiting diffusion of oxygen (e.g., at least one of an oxygen atom, an oxygen molecule, and the like) (an insulating material through which the oxygen is less likely to pass).

For example, aluminum oxide, silicon nitride, or the like is preferably used as the insulator 514. Accordingly, it is possible for the insulator 514 to inhibit diffusion of impurities such as water or hydrogen to the transistor 500 side from the substrate side through the insulator 514. Alternatively, it is possible for the insulator 514 to inhibit diffusion of oxygen contained in the insulator 524 and the like to the substrate side through the insulator 514.

The permittivity of each of the insulator 516, the insulator 580, and the insulator 581 functioning as an interlayer film is preferably lower than that of the insulator 514. In one embodiment of the present invention, when a material with a low permittivity is used for an interlayer film, the parasitic capacitance generated between wirings can be reduced. As the insulator 516, the insulator 580, and the insulator 581, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 522 and the insulator 524 have a function of a gate insulator.

Here, the insulator 524 in contact with the metal oxide 531 preferably releases oxygen by heating. In this specification, oxygen that is released by heating is referred to as excess oxygen in some cases. For example, silicon oxide, silicon oxynitride, or the like can be used as appropriate for the insulator 524. When the insulator 524 containing oxygen is provided in contact with the metal oxide 531 in the transistor 500, oxygen vacancies in the metal oxide 531 can be reduced, leading to improved reliability of the transistor 500.

Specifically, an oxide material that releases part of oxygen by heating is preferably used for the insulator 524. An oxide that releases oxygen by heating is an oxide film in which the amount of released oxygen converted into oxygen atoms is greater than or equal to $1.0\times10^{18}$ atoms/$cm^3$, preferably greater than or equal to $1.0\times10^{19}$ atoms/$cm^3$, further preferably greater than or equal to $2.0\times10^{19}$ atoms/$cm^3$ or greater than or equal to $3.0\times10^{20}$ atoms/$cm^3$ in TDS (Thermal Desorption Spectroscopy) analysis. Note that the temperature of the film surface in the TDS analysis is preferably in the range of 100° C. to 700° C., inclusive or 100° C. to 400° C., inclusive.

As illustrated in FIG. 37C, the insulator 524 is sometimes thinner in a region that overlaps with neither the insulator 554 nor the metal oxide 531*b* than in the other regions. In the insulator 524, the region that overlaps with neither the insulator 554 nor the metal oxide 531*b* preferably has a thickness with which the above oxygen can be adequately diffused.

For example, like the insulator 514 and the like, the insulator 522 preferably functions as a barrier insulating film that inhibits entry of impurities such as, for example, water or hydrogen into the transistor 500 from the substrate side. For example, the insulator 522 preferably has a lower hydrogen permeability than the insulator 524. In one embodiment of the present invention, when the insulator 524, the metal oxide 531, the insulator 550, and the like are surrounded by the insulator 522, the insulator 554, and the insulator 574, entry of impurities such as water or hydrogen into the transistor 500 from the outside can be inhibited.

Furthermore, it is preferable that the insulator 522 have a function of inhibiting diffusion of oxygen (e.g., at least one of an oxygen atom, an oxygen molecule, and the like) (the insulator through which the oxygen is less likely to pass). For example, the insulator 522 preferably has a lower oxygen permeability than the insulator 524. The insulator 522 preferably has a function of inhibiting diffusion of oxygen and impurities, in which case oxygen contained in the metal oxide 531 is less likely to diffuse to the substrate side. Moreover, the conductor 505 can be inhibited from reacting with oxygen contained in the insulator 524 and the metal oxide 531.

As the insulator 522, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used, for example. In the case where the insulator 522 is formed using such a material, the insulator 522 functions as a layer inhibiting release of oxygen from the metal oxide 531 and entry of impurities such as, for example, hydrogen into the metal oxide 531 from the periphery of the transistor 500.

Alternatively, in the insulator 522, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

The insulator 522 may be a single layer or a stacked layer using an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST), for example. With scaling down and higher integration of transistors, a problem such as leakage current may arise because of a thinned gate insulator. When a high-k material is used for the insulator functioning as a gate insulator in the transistor 500, a gate potential at the time of the operation of the transistor can be reduced while the physical thickness is maintained.

Note that the insulator 522 and the insulator 524 may each have a stacked-layer structure of two or more layers. In that case, without limitation to a stacked-layer structure formed of the same material, a stacked-layer structure formed of different materials may be employed. For example, an insulator similar to the insulator 524 may be provided below the insulator 522.

The metal oxide 531 includes the metal oxide 531*a*, the metal oxide 531*b* over the metal oxide 531*a*, and the metal oxide 531*c* over the metal oxide 531*b*. When the metal oxide 531 includes the metal oxide 531*a* under the metal oxide 531*b*, it is possible to inhibit diffusion of impurities into the metal oxide 531*b* from the components formed below the metal oxide 531*a*. Moreover, when the metal oxide 531 includes the metal oxide 531*c* over the metal oxide 531*b*, it is possible to inhibit diffusion of impurities into the metal oxide 531*b* from the components formed above the metal oxide 531*c*.

Note that the metal oxide 531 preferably has a stacked-layer structure of a plurality of oxide layers that differ in the atomic ratio of metal atoms. For example, in the case where the metal oxide 531 contains at least indium (In) and the element M, the proportion of the number of atoms of the element M contained in the metal oxide 531*a* to the number of atoms of all elements that constitute the metal oxide 531*a* is preferably higher than the proportion of the number of atoms of the element M contained in the metal oxide 531*b* to the number of atoms of all elements that constitute the metal oxide 531*b*. In addition, the atomic ratio of the element M to In in the metal oxide 531*a* is preferably greater than the atomic ratio of the element M to In in the metal oxide 531*b*. Here, a metal oxide that can be used as the metal oxide 531*a* or the metal oxide 531*b* can be used as the metal oxide 531*c*.

The energy of the conduction band minimum of each of the metal oxide 531*a* and the metal oxide 531*c* is preferably higher than the energy of the conduction band minimum of the metal oxide 531*b*. In other words, the electron affinity of each of the metal oxide 531*a* and the metal oxide 531*c* is preferably smaller than the electron affinity of the metal oxide 531*b*. In this case, a metal oxide that can be used as the metal oxide 531*a* is preferably used as the metal oxide 531*c*. Specifically, the proportion of the number of atoms of the element M contained in the metal oxide 531*c* to the number of atoms of all elements that constitute the metal oxide 531*c* is preferably higher than the proportion of the number of atoms of the element M contained in the metal oxide 531*b* to the number of atoms of all elements that constitute the metal oxide 531*b*. In addition, the atomic ratio of the element M to In in the metal oxide 531*c* is preferably greater than the atomic ratio of the element M to In in the metal oxide 531*b*.

Here, the energy level of the conduction band minimum gently changes at junction portions between the metal oxide 531*a*, the metal oxide 531*b*, and the metal oxide 531*c*. In other words, at the junction portions between the metal oxide 531*a*, the metal oxide 531*b*, and the metal oxide 531*c*, the energy level of the conduction band minimum continuously changes or the energy levels are continuously connected. This can be achieved by decreasing the density of defect states in a mixed layer formed at the interface between the metal oxide 531*a* and the metal oxide 531*b* and the interface between the metal oxide 531*b* and the metal oxide 531*c*.

Specifically, when the metal oxide 531*a* and the metal oxide 531*b*, and the metal oxide 531*b* and the metal oxide 531*c* contain the same element (as a main component) in addition to oxygen, a mixed layer with a low density of defect states can be formed. In the case where the metal oxide 531*b* is an In—Ga—Zn oxide, for example, an In—Ga—Zn oxide, a Ga—Zn oxide, gallium oxide, or the like may be used as the metal oxide 531*a* and the metal oxide 531*c*. The metal oxide 531*c* may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 531*c* may have a stacked-layer structure of an In—Ga—Zn oxide and an oxide that does not contain In.

Specifically, as the metal oxide 531*a*, a metal oxide with In:Ga:Zn=1:3:4 [atomic ratio] or 1:1:0.5 [atomic ratio] can be used. As the metal oxide 531*b*, a metal oxide with In:Ga:Zn=4:2:3 [atomic ratio] or 3:1:2 [atomic ratio] can be used. As the metal oxide 531*c*, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Specific examples of a stacked-layer structure of the metal oxide 531*c* include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and a layer of gallium oxide.

At this time, the metal oxide 531*b* serves as a main carrier path in the metal oxide 531. When the metal oxide 531*a* and the metal oxide 531*c* have the above structure, the density of defect states at the interface between the metal oxide 531*a* and the metal oxide 531*b* and the interface between the metal oxide 531*b* and the metal oxide 531*c* can be made low.

This reduces the influence of interface scattering on carrier conduction in the metal oxide 531*b*, and the transistor 500 can have a high on-state current and high frequency characteristics. Note that in the case where the metal oxide 531*c* has a stacked-layer structure, not only an effect of reducing the density of defect states at the interface between the metal oxide 531*b* and the metal oxide 531*c* is produced but also diffusion of the constituent element contained in the metal oxide 531*c* to the insulator 550 side can be inhibited. Specifically, in the case where an oxide not containing In is stacked in an upper portion of the metal oxide 531*c*, the metal oxide 531*c* can inhibit the diffusion of In to the insulator 550 side. The insulator 550 functions as a gate insulator. Thus, the transistor 500 might be defective in characteristics if In diffuses to the insulator 550. Thus, in accordance with one embodiment of the present invention, the metal oxide 531*c* having a stacked-layer structure allows a highly reliable display apparatus to be provided.

The conductor 542 (the conductor 542*a* and the conductor 542*b*) functioning as the source electrode and the drain electrode is provided over the metal oxide 531*b*. For the conductor 542, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen.

When the conductor 542 is provided in contact with the metal oxide 531, the oxygen concentration of the metal oxide 531 in the vicinity of the conductor 542 sometimes decreases. In addition, a metal compound layer that contains the metal contained in the conductor 542 and the component of the metal oxide 531 is sometimes formed in the metal oxide 531 in the vicinity of the conductor 542. In such cases, the carrier concentration of the region in the metal oxide 531 in the vicinity of the conductor 542 increases, and the region becomes a low-resistance region.

Here, the region between the conductor 542*a* and the conductor 542*b* is formed to overlap with the opening of the insulator 580. Accordingly, the conductor 560 can be placed in a self-aligned manner between the conductor 542*a* and the conductor 542*b* in the transistor 500.

The insulator 550 functions as a gate insulator. The insulator 550 is preferably placed in contact with the top surface of the metal oxide 531*c*. For the insulator 550, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 524, for example, the concentration of impurities such as water or hydrogen in the insulator 550 is preferably reduced. The thickness of the insulator 550 is preferably greater than or equal to 1 nm and less than or equal to 20 nm.

In the transistor 500, a metal oxide may be provided between the insulator 550 and the conductor 560. The metal oxide preferably inhibits oxygen diffusion from the insulator 550 to the conductor 560. Accordingly, oxidation of the conductor 560 due to oxygen in the insulator 550 can be inhibited by the metal oxide.

The metal oxide functions as part of the gate insulator in some cases. Thus, when silicon oxide, silicon oxynitride, or the like is used for the insulator 550, a metal oxide that is a high-k material with a high dielectric constant is preferably used as the metal oxide. When the gate insulator has a stacked-layer structure of the insulator 550 and the metal oxide, the stacked-layer structure can be thermally stable and have a high dielectric constant. Accordingly, in the transistor 500, a gate potential applied during the operation of the transistor can be reduced while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used for the metal oxide. It is particularly preferable to use an insulator containing an oxide of one or both of aluminum and hafnium, such as aluminum oxide, hafnium oxide, or an oxide containing aluminum and hafnium (hafnium aluminate).

Although the conductor 560 is illustrated to have a two-layer structure in FIG. 37, the conductor 560 may have a single-layer structure or a stacked-layer structure of three or more layers.

For example, the conductor 560*a* is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 560*a* has a function of inhibiting diffusion of oxygen, the conductivity of the conductor 560*b* can be inhibited from being lowered because of oxidation due to oxygen contained in the insulator 550. As a conductive material having a function of inhibiting oxygen diffusion, for example, tantalum, tantalum nitride, ruthenium, ruthenium oxide, or the like is preferably used.

A conductive material containing tungsten, copper, or aluminum as its main component is preferably used for the conductor 560*b*. The conductor 560 also functions as a wiring and thus is preferably formed using a conductor having high conductivity. For example, a conductive material containing tungsten, copper, or aluminum as its main component can be used. The conductor 560*b* may have a stacked-layer structure, for example, a stacked-layer structure of titanium or titanium nitride and the above conductive material.

As illustrated in FIG. 37A and FIG. 37C, the side surface of the metal oxide 531 is covered with the conductor 560 in a region of the metal oxide 531*b* not overlapping with the conductor 542, that is, the channel formation region of the metal oxide 531. Accordingly, an electric field of the conductor 560 functioning as the first gate electrode is likely to act on the side surface of the metal oxide 531. Thus, the on-state current of the transistor 500 can be increased and the frequency characteristics can be improved.

The insulator 554, like the insulator 514 and the like, for example, preferably functions as a barrier insulating film that inhibits entry of impurities such as, for example, water or hydrogen into the transistor 500 from the insulator 580 side. The insulator 554 preferably has a lower hydrogen permeability than the insulator 524, for example. Furthermore, as illustrated in FIG. 37B and FIG. 37C, the insulator 554 is preferably in contact with the side surface of the metal oxide 531*c*, the top and side surfaces of the conductor 542*a*, the top and side surfaces of the conductor 542*b*, the side surfaces of the metal oxide 531*a* and the metal oxide 531*b*, and the top surface of the insulator 524. Such a structure of the insulator 554 can inhibit entry of hydrogen contained in the insulator 580 into the metal oxide 531 through the top surfaces or side surfaces of the conductor 542*a*, the conductor 542*b*, the metal oxide 531*a*, the metal oxide 531*b*, and the insulator 524.

Furthermore, it is preferable that the insulator 554 have a function of inhibiting diffusion of oxygen (e.g., at least one of an oxygen atom, an oxygen molecule, and the like) (the insulator through which the oxygen is less likely to pass). For example, the insulator 554 preferably has a lower oxygen permeability than the insulator 580 or the insulator 524.

The insulator 554 is preferably formed by a sputtering method. When the insulator 554 is formed by a sputtering method in an oxygen-containing atmosphere, oxygen can be added to the vicinity of a region of the insulator 524 that is in contact with the insulator 554. Thus, the insulator 554 can supply oxygen from the region to the metal oxide 531 through the insulator 524. Here, with the insulator 554 having a function of inhibiting upward diffusion of oxygen, oxygen can be prevented from diffusing from the metal oxide 531 into the insulator 580. Moreover, with the insulator 522 having a function of inhibiting downward diffusion of oxygen, oxygen can be prevented from diffusing from the metal oxide 531 to the substrate side. In the above manner, oxygen is supplied to the channel formation region of the metal oxide 531. Accordingly, oxygen vacancies in the metal oxide 531 can be reduced, so that the transistor can be inhibited from having normally-on characteristics.

As the insulator 554, an insulator containing an oxide of one or both of aluminum and hafnium is preferably formed, for example. Note that as the insulator containing an oxide of one or both of aluminum and hafnium, aluminum oxide, hafnium oxide, an oxide containing aluminum and hafnium (hafnium aluminate), or the like is preferably used, for example.

The insulator 524, the insulator 550, and the metal oxide 531 are covered with the insulator 554 having a barrier property against hydrogen, whereby the insulator 580 is separated from the insulator 524, the metal oxide 531, and the insulator 550. Thus, the insulator 554 can inhibit entry of impurities such as, for example, hydrogen from the outside of the transistor 500. Therefore, excellent electrical characteristics and high reliability can be given to the transistor 500.

The insulator 580 is provided over the insulator 524, the metal oxide 531, and the conductor 542 with the insulator 554 therebetween. The insulator 580 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride, which are thermally stable, are preferable. In particular, for example, materials such as silicon oxide, silicon oxynitride, and porous silicon oxide are preferably used, in which case a region containing oxygen to be released by heating can be easily formed.

The concentration of impurities such as, for example, water or hydrogen in the film of the insulator 580 is preferably reduced. In addition, the top surface of the insulator 580 may be planarized.

Like the insulator 514 and the like, for example, the insulator 574 preferably functions as a barrier insulating film that inhibits entry of impurities such as, for example, water or hydrogen into the insulator 580 from the above. As the insulator 574, for example, the insulator that can be used as the insulator 514, the insulator 554, or the like can be used.

The insulator 581 functioning as an interlayer film is preferably provided over the insulator 574. For example, as in the insulator 524 or the like, the concentration of impurities such as, for example, water or hydrogen in the film of the insulator 581 is preferably reduced.

The conductor 545*a* and the conductor 545*b* are placed in openings formed in the insulator 581, the insulator 574, the insulator 580, and the insulator 554. The conductor 545*a* and the conductor 545*b* are provided to face each other with the conductor 560 therebetween. Note that the top surfaces of the conductor 545*a* and the conductor 545*b* may be on the same plane as the top surface of the insulator 581.

The insulator 541*a* is provided in contact with the inner wall of the opening in the insulator 581, the insulator 574, the insulator 580, and the insulator 554, and a first conductor of the conductor 545*a* is formed in contact with the side surface of the insulator 541*a*. The conductor 542*a* is positioned on at least part of the bottom portion of the opening, and is in contact with the conductor 545*a*. Similarly, the insulator 541*a* is provided in contact with the inner wall of the opening in the insulator 581, the insulator 574, the insulator 580, and the insulator 554. A first conductor of the conductor 545*b* is formed in contact with the side surface of the insulator 541*b*. The conductor 542*b* is positioned on at least part of the bottom portion of the opening, and is in contact with the conductor 545*b*.

The conductor 545*a* and the conductor 545*b* are preferably formed using a conductive material containing tungsten, copper, or aluminum as its main component. The conductor 545*a* and the conductor 545*b* may each have a stacked-layer structure.

In the case where the conductor 545 has a stacked-layer structure, the aforementioned conductor having a function of inhibiting diffusion of impurities such as, for example, water or hydrogen is preferably used as the conductor in contact with the metal oxide 531*a*, the metal oxide 531*b*, the conductor 542, the insulator 554, the insulator 580, the insulator 574, and the insulator 581. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material for the conductor 545*a* and the conductor 545*b* can inhibit oxygen added to the insulator 580 from being absorbed by the conductor 545*a* and the conductor 545*b*. Moreover, impurities such as water or hydrogen can be inhibited from entering the metal oxide 531 through the conductor 545*a* and the conductor 545*b* from a layer above the insulator 581.

As the insulator 541*a* and the insulator 541*b*, for example, the insulator that can be used as the insulator 554 or the like can be used. Since the insulator 541*a* and the insulator 541*b* are provided in contact with the insulator 554, for example, impurities such as water or hydrogen in the insulator 580 or the like can be inhibited from entering the metal oxide 531 through the conductor 545*a* and the conductor 545*b*. Furthermore, the insulator 541*a* and the insulator 541*b* can inhibit oxygen contained in the insulator 580 from being absorbed by the conductor 545*a* and the conductor 545*b*.

Although not illustrated, a conductor functioning as a wiring may be placed in contact with the top surface of the conductor 545*a* and the top surface of the conductor 545*b*. For the conductor functioning as a wiring, a conductive material containing tungsten, copper, or aluminum as its main component is preferably used. Furthermore, the conductor may have a stacked-layer structure. For example, a stacked layer of titanium or titanium nitride and the above conductive material may be employed. Note that the conductor may be formed to be embedded in an opening provided in an insulator.

<Materials for Transistor>

Materials that can be used for the transistor will be described.

[Substrate]

As a substrate where the transistor 500 is formed, an insulator substrate, a semiconductor substrate, or a conductor substrate may be used, for example. Examples of the insulator substrate used as the substrate include a glass substrate, a quartz substrate, a sapphire substrate, a stabilized zirconia substrate (e.g., an yttria-stabilized zirconia substrate), and a resin substrate. Examples of the semiconductor substrate used as the substrate include a semiconductor substrate of silicon, germanium, or the like and a compound semiconductor substrate of silicon carbide, silicon germanium, gallium arsenide, indium phosphide, zinc oxide, or gallium oxide. Another example of the substrate is a semiconductor substrate in which an insulator region is included in the semiconductor substrate, e.g., an SOI (Silicon On Insulator) substrate. Examples of the conductor substrate used as the substrate include a graphite substrate, a metal substrate, an alloy substrate, and a conductive resin substrate. Other examples of the substrate include a substrate including a metal nitride and a substrate including a metal oxide. Other examples of the substrate include an insulator substrate provided with a conductor or a semiconductor, a semiconductor substrate provided with a conductor or an insulator, and a conductor substrate provided with a semiconductor or an insulator. Moreover, any of these substrates provided with elements may be used for the substrate. Examples of the elements provided for the substrates include a capacitor, a resistor, a switching element, a light-emitting element, and a memory element.

[Insulator]

Examples of an insulator include an oxide, a nitride, an oxynitride, a nitride oxide, a metal oxide, a metal oxynitride, and a metal nitride oxide, each of which has an insulating property.

With scaling down and higher integration of transistors, for example, a problem of the transistors such as leakage current may arise because of a thinned gate insulator. When a high-k material is used for the insulator functioning as a gate insulator, the voltage at the time of the operation of the transistor can be reduced while the physical thickness is maintained. By contrast, when a material with a low dielectric constant is used for the insulator functioning as an interlayer film, the parasitic capacitance generated between wirings can be reduced. Thus, a material of the insulator is preferably selected depending on the function of an insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting passage of oxygen and impurities such as, for example, hydrogen (e.g., the insulator 514, the insulator 522, the insulator 554, and the insulator 574), the electrical characteristics of the transistor can be stable. An insulator having a function of inhibiting passage of oxygen and impurities such as, for example, hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting passage of oxygen and impurities such as, for example, hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator is preferably an insulator including a region containing oxygen to be released by heating. For example, when a structure is employed in which silicon oxide or silicon oxynitride that includes a region containing oxygen to be released by heating is in contact with the metal oxide 531, oxygen vacancies included in the metal oxide 531 can be filled.

[Conductor]

For a conductor, for example, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements as its component; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used as the conductor.

A plurality of conductors formed using any of the above materials may be stacked in the conductor. For example, a stacked-layer structure combining a material containing the above metal element and a conductive material containing oxygen may be employed. In addition, a stacked-layer structure combining a material containing the above metal element and a conductive material containing nitrogen may be employed. Furthermore, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably employs a stacked-layer structure combining a material containing the above metal element and a conductive material containing oxygen. In that case, in the conductor, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide where the channel is formed. A conductive material containing the above metal element and nitrogen may be used as the conductor. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material for the conductor, hydrogen contained in the metal oxide where the channel is formed can be captured in some cases. Alternatively, for example, hydrogen entering from an external insulator or the like can be captured in some cases.

At least part of this embodiment can be implemented in combination with any of the other embodiments described in this specification as appropriate.

The structure described in this embodiment can be used in an appropriate combination with any of the structures described in the other embodiments and examples.

Embodiment 5

In this embodiment, a metal oxide (hereinafter, also referred to as an oxide semiconductor) that can be used in an OS transistor described in the above embodiment will be described.

<Classification of Crystal Structure>

First, the classification of crystal structures of an oxide semiconductor will be described with reference to FIG. 38A. FIG. 38A is a diagram showing the classification of the crystal structures of an oxide semiconductor, typically IGZO (a metal oxide containing In, Ga, and Zn).

As shown in FIG. 38A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite) (excluding single crystal and poly crystal). Note that in the classification of "Crystalline", single crystal, poly crystal, and completely amorphous are excluded. The term "Crystal" includes single crystal and poly crystal.

Note that the structures in the thick frame in FIG. 38A are in an intermediate state between "Amorphous" and "Crystal", and belong to a new crystalline phase. That is, these structures are different from "Crystal" and "Amorphous", which is energetically unstable.

Note that a crystal structure of a film or a substrate can be evaluated with an X-ray diffraction (XRD) spectrum. Here, FIG. 38B shows an XRD spectrum, which is obtained by GIXD (Grazing-Incidence XRD) measurement, of a CAAC-IGZO film classified into "Crystalline" (the horizontal axis represents 2θ [deg.] and the vertical axis represents intensity in arbitrary unit [a.u.]). Note that a GIXD method is also referred to as a thin film method or a Seemann-Bohlin method. The XRD spectrum that is shown in FIG. 38B and obtained by GIXD measurement is hereinafter simply referred to as an XRD spectrum. The CAAC-IGZO film in FIG. 38B has a composition in the vicinity of In:Ga:Zn=4:2:3 [atomic ratio]. The CAAC-IGZO film in FIG. 38B has a thickness of 500 nm.

As shown in FIG. 38B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 38B, the peak at 2θ of around 31° is asymmetric with respect to the axis of the angle at which the peak intensity (Intensity) is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 38C shows a diffraction pattern of the CAAC-IGZO film. FIG. 38C shows a diffraction pattern observed by NBED in which an electron beam is incident in the direction parallel to the substrate. The CAAC-IGZO film in FIG. 38C has a composition in the vicinity of In:Ga:Zn=4:2:3 [atomic ratio]. In the nanobeam electron diffraction method, electron diffraction is performed with a probe diameter of 1 nm.

As shown in FIG. 38C, a plurality of spots indicating c-axis alignment are observed in the diffraction pattern of the CAAC-IGZO film.

[Structure of Oxide Semiconductor]

Oxide semiconductors may be classified in a manner different from that in FIG. 38A when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the CAAC-OS, the nc-OS, and the a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a plurality of fine crystals, the maximum diameter of the crystal region may be approximately several tens of nanometers.

In the case of an In-M-Zn oxide (the element M is, for example, one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Note that indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement. However, a unit lattice of the lattice arrangement is not always a regular hexagon and is a non-regular hexagon in some cases. A pentagonal lattice arrangement, a heptagonal lattice arrangement, and the like are, for example, included in the distortion in the CAAC-OS in some cases. Note that a clear crystal grain boundary (grain boundary) is difficult to observe even in the vicinity of the distortion in the CAAC-OS. That is, in the CAAC-OS, formation of a crystal grain boundary is inhibited by the distortion of a lattice arrangement. This is likely to be due to the factor that the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus causes, for example, a reduction in the on-state current of a transistor, a reduction in the field-effect mobility of the transistor, or the like. Thus, the CAAC-OS in which no clear crystal grain boundary is observed is one of crystalline oxides having a crystal structure suitable for a semiconductor layer of a transistor. Note that Zn is preferably contained in the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by, for example, one or more of entry of impurities, formation of defects, and the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of freedom of the manufacturing process of the OS transistor.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[A-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

[Structure of Oxide Semiconductor]

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal elements are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has [In] higher than [In] in the second region and has [Ga] lower than [Ga] in the second region. Moreover, the second region has [Ga] higher than [Ga] in the first region and has [In] lower than [In] in the first region.

Specifically, the first region contains, for example, indium oxide, indium zinc oxide, or the like as its main component. The second region contains, for example, gallium oxide, gallium zinc oxide, or the like as its main component. That is, the first region can be referred to as a region containing In as its main component. The second region can be referred to as a region containing Ga as its main component.

Note that a clear boundary between the first region and the second region is difficult to be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a transistor switching function (On/Off switching function) can be given to the CAC-OS owing to the complementary action of the conductivity derived from the CAC-OS's first region and the insulating property derived from the CAC-OS's second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, the transistor can achieve a high on-state current (Ion), high field-effect mobility (u), and excellent switching operation.

An oxide semiconductor has various structures with different properties. Two or more kinds of the amorphous oxide semiconductor, the polycrystalline oxide semiconductor, the a-like OS, the CAC-OS, the nc-OS, and the CAAC-OS may be included in the oxide semiconductor of one embodiment of the present invention.

<Transistor Including Oxide Semiconductor>

Next, the case where the above oxide semiconductor is used for a transistor will be described.

When the above oxide semiconductor is used for a transistor, the transistor can achieve high field-effect mobility. In addition, the transistor with high reliability can be achieved.

It is particularly preferable to use an oxide containing indium (In), gallium (Ga), and zinc (Zn) (also referred to as "IGZO") for a semiconductor layer where a channel of the transistor is formed. Alternatively, an oxide containing indium (In), aluminum (Al), and zinc (Zn) (also referred to as "IAZO") may be used for the semiconductor layer. Alternatively, an oxide containing indium (In), aluminum (Al), gallium (Ga), and zinc (Zn) (also referred to as "IAGZO") may be used for the semiconductor layer.

An oxide semiconductor with a low carrier concentration is preferably used for a transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to 1× 1011 $cm^{-3}$, yet further preferably lower than $1\times10^{10}$ $cm^{-3}$, and higher than or equal to $1\times10^{-9}$ $cm^{-3}$. In order to reduce the carrier concentration in an oxide semiconductor, the impurity concentration in the oxide semiconductor is reduced so that the density of defect states in the oxide semiconductor can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor has a low density of defect states and accordingly has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon in the oxide semiconductor (the concentration obtained by Secondary Ion Mass Spectrometry (SIMS)) is set lower than or equal to $2\times10^{18}$ atoms/$cm^3$, preferably lower than or equal to $2\times10^{17}$ atoms/$cm^3$.

When the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the oxide semiconductor, which is obtained by SIMS, is set lower than or equal to $1\times10^{18}$ atoms/$cm^3$, preferably lower than or equal to $2\times10^{16}$ atoms/$cm^3$.

When the oxide semiconductor contains nitrogen, the oxide semiconductor easily becomes n-type by generation of electrons serving as carriers and an increase in carrier concentration. As a result, a transistor including an oxide semiconductor containing nitrogen is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

Hydrogen contained in the oxide semiconductor reacts with oxygen bonded to a metal atom to be water, and thus forms an oxygen vacancy in the oxide semiconductor in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$.

When an oxide semiconductor with sufficiently reduced impurities is used for the channel formation region of the transistor, stable electrical characteristics can be given to the transistor.

The structure described in this embodiment can be used in an appropriate combination with any of the structures described in the other embodiments and examples.

Embodiment 6

In this embodiment, electronic devices in which the semiconductor device of one embodiment of the present invention can be used will be described.

The semiconductor device of one embodiment of the present invention can be used for a display portion of an electronic device. Thus, one embodiment of the present invention can achieve an electronic device having high display quality. Alternatively, one embodiment of the present invention can achieve an electronic device with extremely high definition. Alternatively, one embodiment of the present invention can achieve a highly reliable electronic device.

Examples of electronic devices using the semiconductor device or the like of one embodiment of the present invention include display apparatuses such as televisions and monitors, lighting devices, desktop or laptop personal computers, word processors, image reproduction devices that reproduce still images and moving images stored in recording media such as DVDs (Digital Versatile Discs), portable CD players, radios, tape recorders, headphone stereos, stereos, table clocks, wall clocks, cordless phone handsets, transceivers, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as chain saws, smoke detectors, and medical equipment such as dialyzers. Other examples include industrial equipment such as guide lights, traffic lights, belt conveyors, elevators, escalators, industrial robots, power storage systems, and power storage devices for leveling the amount of power supply and smart grid. In addition, moving objects and the like driven by fuel engines and electric motors using power from power storage units may also be included in the category of electronic devices. Examples of the moving objects include electric vehicles (EVs), hybrid electric vehicles (HVs) that include both an internal-combustion engine and a motor, plug-in hybrid electric vehicles (PHVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The electronic device of one embodiment of the present invention may include a secondary battery (battery), and furthermore, it is preferable that the secondary battery be capable of being charged by contactless power transmission.

Examples of the secondary battery include a lithium-ion secondary battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. With the antenna receiving a signal, the electronic device can display images, information, and the like on a display portion. When the electronic device includes an antenna and a secondary battery, the antenna may be used for contactless power transmission.

The electronic device of one embodiment of the present invention may include a sensor (e.g., a sensor having a function of measuring force, displacement, position, speed, acceleration, angular velocity, rotational frequency, distance, light, liquid, magnetism, temperature, a chemical substance, sound, time, hardness, an electric field, current, voltage, power, radiation, a flow rate, humidity, gradient, oscillation, a smell, infrared rays, or the like).

The electronic device of one embodiment of the present invention can have a variety of functions. For example, the electronic device can have a function of displaying a variety of information (e.g., a still image, a moving image, a text image, and the like) on the display portion, a touch panel function, a function of displaying a calendar, date, time, and the like, a function of executing a variety of software (programs), a wireless communication function, and a function of reading a program or data stored in a recording medium.

Furthermore, an electronic device including a plurality of display portions can have a function of displaying image information mainly on one display portion while displaying text information mainly on another display portion, a function of displaying a three-dimensional image by displaying images on the plurality of display portions with a parallax taken into account, or the like. Furthermore, an electronic device including an image receiving portion can have a function of taking a still image or a moving image, a function of automatically or manually correcting a taken image, a function of storing a taken image in a recording medium (an external recording medium or a recording medium incorporated in the electronic device), a function of displaying a taken image on a display portion, or the like. Note that the functions of the electronic device of one embodiment of the present invention are not limited to these. The electronic device of one embodiment of the present invention can have a variety of functions.

The semiconductor device of one embodiment of the present invention can display a high-definition image. Thus, the semiconductor device can be suitably used especially for a portable electronic device, a wearable electronic device (wearable device), an e-book reader, or the like. For example, the semiconductor device can be suitably used for xR devices such as a VR device and an AR device.

Figure 39A:
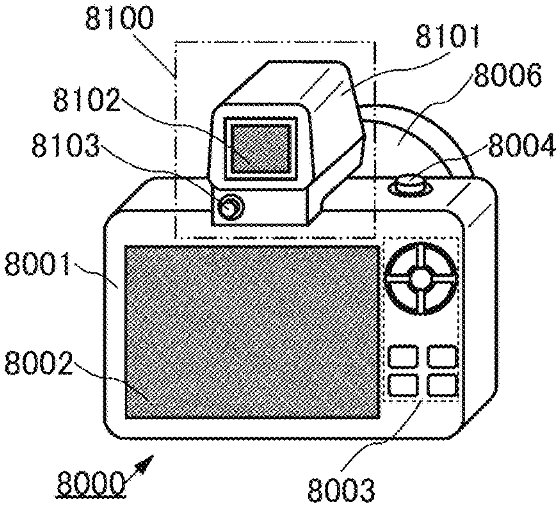
FIG. 39A to FIG. 39F are diagrams illustrating examples of electronic devices.

FIG. 39A is an external view of a camera 8000 to which a finder 8100 is attached.

The camera 8000 includes a housing 8001, a display portion 8002, operation buttons 8003, a shutter button 8004, and the like. Furthermore, a detachable lens 8006 is attached to the camera 8000. Note that the lens 8006 and the housing may be integrated with each other in the camera 8000.

Images can be taken with the camera 8000 at the press of the shutter button 8004 or the touch of the display portion 8002 serving as a touch panel.

The housing 8001 includes a mount including an electrode, so that the finder 8100, a stroboscope, or the like can be connected to the housing, for example.

The finder 8100 includes a housing 8101, a display portion 8102, a button 8103, and the like.

The housing 8101 is attached to the camera 8000 by a mount for engagement with the mount of the camera 8000. The finder 8100 can display an image and the like received from the camera 8000 on the display portion 8102, for example.

The button 8103 functions as a power button or the like, for example.

The semiconductor device of one embodiment of the present invention can be used in the display portion 8002 of the camera 8000 and the display portion 8102 of the finder 8100. Note that the finder 8100 may be incorporated in the camera 8000.

Figure 39B:
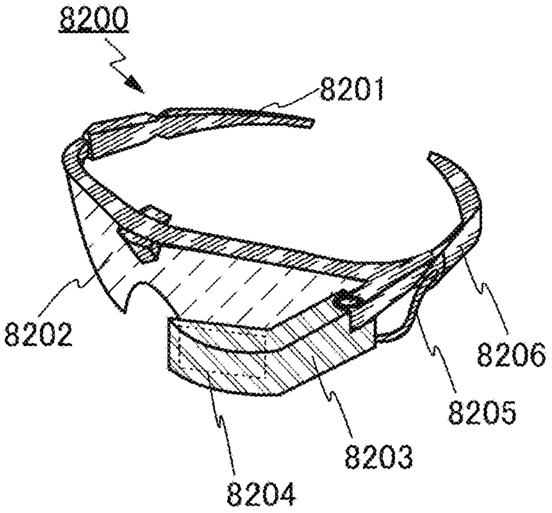

FIG. 39B is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 has a function of supplying power from the battery 8206 to the main body 8203. The main body 8203 includes a wireless receiver or the like to receive image information and display it on the display portion 8204, for example. The main body 8203 includes a camera, and information on the movement of the eyeballs or the eyelids of the user can be used as an input means, for example.

The mounting portion 8201 may include a plurality of electrodes capable of sensing current flowing in response to the movement of the user's eyeball at a position in contact with the user to recognize the user's sight line. The mounting portion 8201 may also have a function of monitoring the user's pulse with the use of current flowing through the electrodes. The mounting portion 8201 may include a variety of sensors such as a temperature sensor, a pressure sensor, and an acceleration sensor. The head-mounted display 8200 may have a function of displaying the user's biological information on the display portion 8204, a function of changing an image displayed on the display portion 8204 in response to the movement of the user's head, or the like.

The semiconductor device of one embodiment of the present invention can be used in the display portion 8204.

Figure 39C:
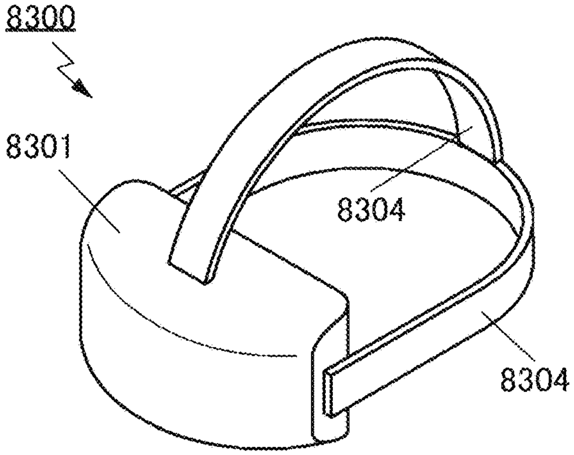
Figure 39D:
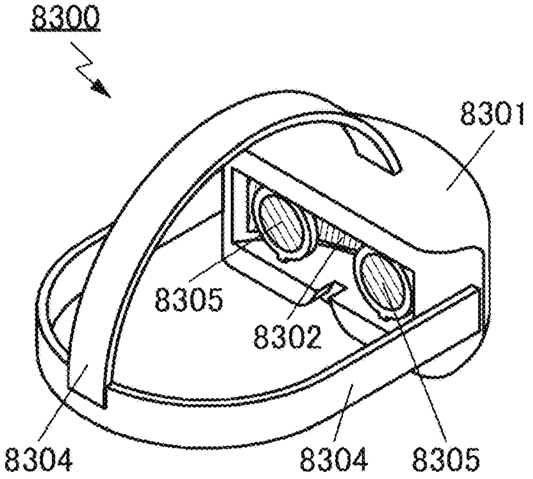
Figure 39E:
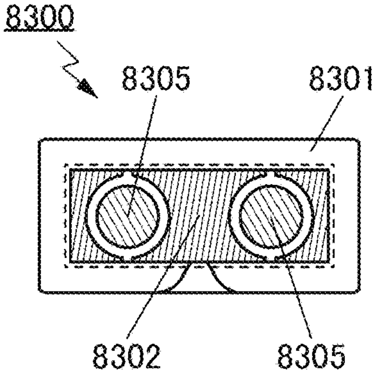

FIG. 39C to FIG. 39E are external views of a head-mounted display 8300. The head-mounted display 8300 includes a housing 8301, a display portion 8302, a band-like fixing member 8304, and a pair of lenses 8305.

A user can see display on the display portion 8302 through the lenses 8305. In the head-mounted display 8300, the display portion 8302 is preferably curved because the user can feel a high realistic sensation. For example, another image displayed on another region of the display portion 8302 is viewed through the lenses 8305, so that three-dimensional display using parallax or the like can be performed. Note that the number of display portions 8302 is not limited to one; for example, two display portions 8302 may be provided for the user's respective eyes.

The semiconductor device of one embodiment of the present invention can be used for the display portion 8302. The semiconductor device of one embodiment of the present invention can achieve extremely high definition. For example, a pixel is not easily seen by the user even when the user sees display that is magnified by the lenses 8305 as illustrated in FIG. 39E. That is, an image with a strong sense of reality can be seen by the user with the use of the display portion 8302.

Figure 39F:
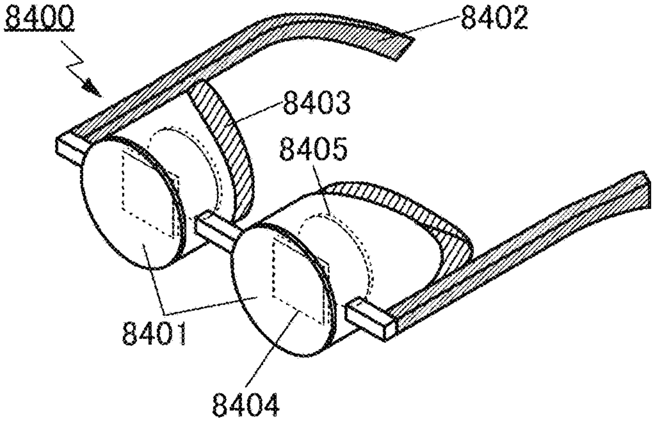

FIG. 39F is an external view of a goggle-type head-mounted display 8400. The head-mounted display 8400 includes a pair of housings 8401, a mounting portion 8402, and a cushion 8403. A display portion 8404 and a lens 8405 are provided in the pair of housings 8401 each. Furthermore, when the pair of display portions 8404 display different images, three-dimensional display using parallax can be performed.

A user can see display on the display portion 8404 through the lens 8405. The lens 8405 has a focus adjustment mechanism and can adjust the position according to the user's eyesight. The display portion 8404 is preferably a square or a horizontal rectangle. This can improve a realistic sensation.

The mounting portion 8402 preferably has plasticity and elasticity so as to be adjusted to fit the size of the user's face and not to slide down. In addition, part of the mounting portion 8402 preferably has a vibration mechanism functioning as a bone conduction earphone, for example. Thus, a separate audio device such as an earphone or a speaker is not needed, and the user can enjoy images and sounds only by wearing the head-mounted display. Note that the housing 8401 may have a function of outputting sound data by wireless communication, for example.

The mounting portion 8402 and the cushion 8403 are portions in contact with the user's face (forehead, cheek, or the like). The cushion 8403 is in close contact with the user's face, so that light leakage can be prevented, which increases the sense of immersion. The cushion 8403 is preferably formed using a soft material so that the head-mounted display 8400 is in close contact with the user's face when being worn by the user. For example, a material such as rubber, silicone rubber, urethane, or sponge can be used. Furthermore, when a sponge or the like whose surface is covered with cloth, leather (natural leather or synthetic leather), or the like is used for example, a gap is unlikely to be generated between the user's face and the cushion 8403, whereby light leakage can be suitably prevented. Furthermore, using such a material is preferable because it has a soft texture and the user does not feel cold when wearing the device in a cold season, for example. The member in contact with user's skin, such as the cushion 8403 or the mounting portion 8402, is preferably detachable because cleaning or replacement can be easily performed.

Figure 40A:
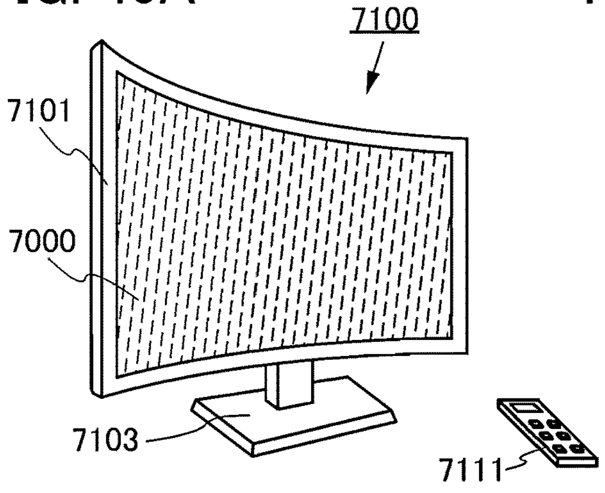
FIG. 40A to FIG. 40F are diagrams illustrating examples of electronic devices.

FIG. 40A illustrates an example of a television device. In a television device 7100, a display portion 7000 is incorporated in a housing 7101. Here, the housing 7101 is supported by a stand 7103.

The semiconductor device of one embodiment of the present invention can be used for the display portion 7000 in FIG. 40A.

Operation of the television device 7100 illustrated in FIG. 40A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be operated and images displayed on the display portion 7000 can be operated in the television device 7100.

Note that the television device 7100 has a structure in which a receiver, a modem, and the like are provided, for example. A general television broadcast can be received with the receiver. When the television device is connected to a communication network with or without wires via the modem, one-way (e.g., from a transmitter to a receiver) or two-way (between a transmitter and a receiver or between receivers, for example) information communication can be performed.

Figure 40B:
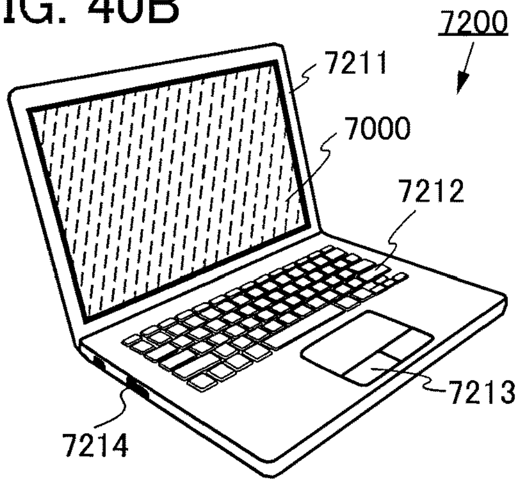

FIG. 40B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The semiconductor device of one embodiment of the present invention can be used for the display portion 7000 in FIG. 40B.

Figure 40C:
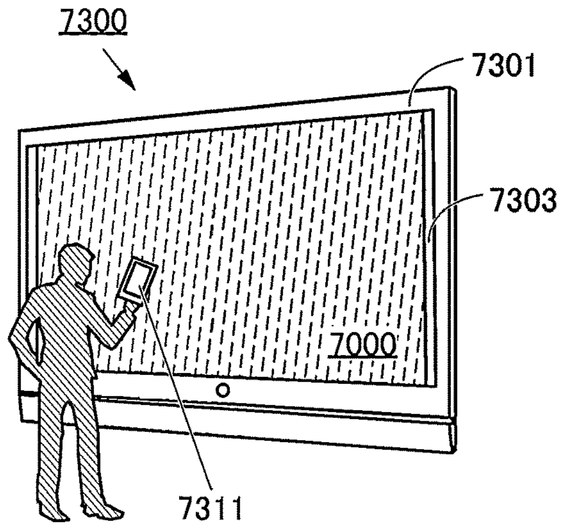
Figure 40D:
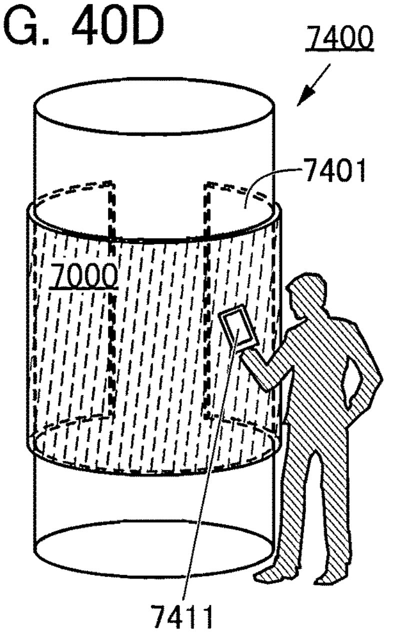

FIG. 40C and FIG. 40D illustrate examples of digital signage.

Digital signage 7300 illustrated in FIG. 40C includes a housing 7301, the display portion 7000, a speaker 7303, and the like. The digital signage 7300 can also include an LED lamp, an operation key (including a power switch or an operation switch), a connection terminal, a variety of sensors, a microphone, or the like.

FIG. 40D illustrates digital signage 7400 attached to a cylindrical pillar. The digital signage 7400 includes the display portion 7000 provided along a curved surface of the pillar 7401.

In FIG. 40C and FIG. 40D, the semiconductor device of one embodiment of the present invention can be used for the display portion 7000.

The digital signage 7300 or the digital signage 7400 including a larger area of the display portion 7000 can increase the amount of information that can be provided at a time. The larger display portion 7000 attracts more attentions, so that the effectiveness of the advertisement can be increased, for example.

The digital signage 7300 or the digital signage 7400 preferably includes a touch panel in the display portion 7000. This enables intuitive operation by a user, in addition to display of a still image or a moving image on the display portion 7000. Moreover, for an application that provides information such as route information or traffic information, usability can be enhanced by intuitive operation.

As illustrated in FIG. 40C and FIG. 40D, it is preferable that the digital signage 7300 or the digital signage 7400 be capable of working with an information terminal 7311 or an information terminal 7411 such as a smartphone a user has through wireless communication, for example. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Figure 40E:
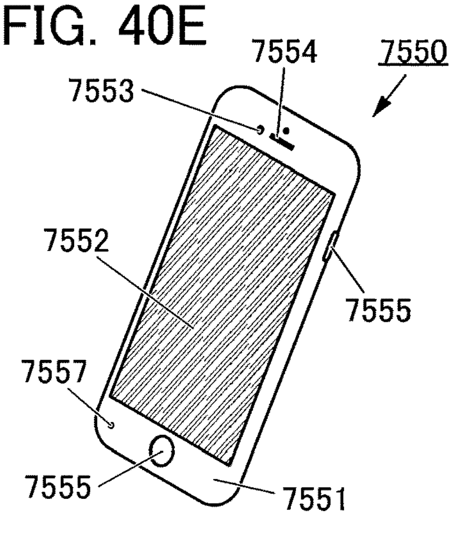

FIG. 40E illustrates an example of an information terminal. An information terminal 7550 includes a housing 7551, a display portion 7552, a microphone 7557, a speaker portion 7554, a camera 7553, operation switches 7555, and the like. The semiconductor device of one embodiment of the present invention can be used for the display portion 7552. The display portion 7552 has a touch panel function. The information terminal 7550 also includes an antenna, a battery, and the like inside the housing 7551. The information terminal 7550 can be used as, for example, a smartphone, a mobile phone, a tablet information terminal, a tablet personal computer, an e-book reader, or the like.

Figure 40F:
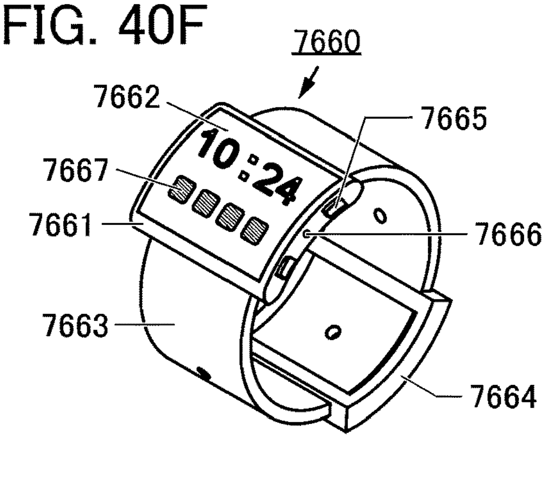

FIG. 40F illustrates an example of a watch-type information terminal. An information terminal 7660 includes a housing 7661, a display portion 7662, a band 7663, a buckle 7664, an operation switch 7665, an input/output terminal 7666, and the like. The information terminal 7660 also includes, for example, an antenna, a battery, and the like inside the housing 7661. The information terminal 7660 is capable of executing a variety of applications such as mobile phone calls, e-mailing, text viewing and editing, music reproduction, Internet communication, and computer games, for example.

The information terminal 7660 includes a touch sensor in the display portion 7662, and can be operated by touching the screen with a finger, a stylus, or the like. For example, by touching an icon 7667 displayed on the display portion 7662, an application can be started. With the operation switch 7665, for example, a variety of functions such as time setting, power on/off, on/off of wireless communication, setting or cancellation of a silent mode, and setting or cancellation of a power saving mode can be performed. For example, the functions of the operation switch 7665 can be set by the operating system incorporated in the information terminal 7660.

The information terminal 7660 can execute near field communication conformable to a communication standard. For example, mutual communication between the information terminal 7660 and a headset capable of wireless communication enables hands-free calling. The information terminal 7660 can perform data transmission and reception with another information terminal through the input/output terminal 7666. Charging through the input/output terminal 7666 is also possible. Note that the charging operation may be performed by wireless power feeding without using the input/output terminal 7666.

Figure 41A:
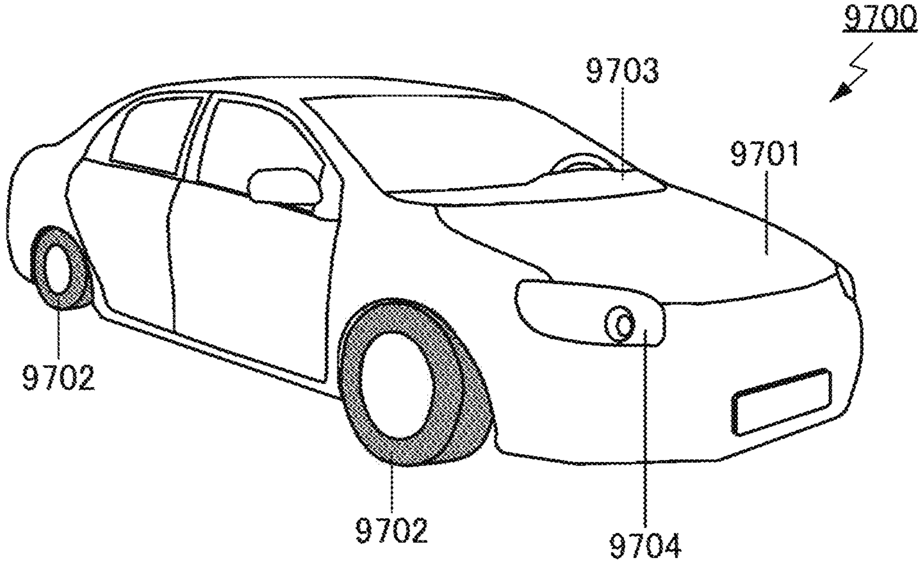
FIG. 41A and FIG. 41B are diagrams illustrating an example of an electronic device.
Figure 41B:
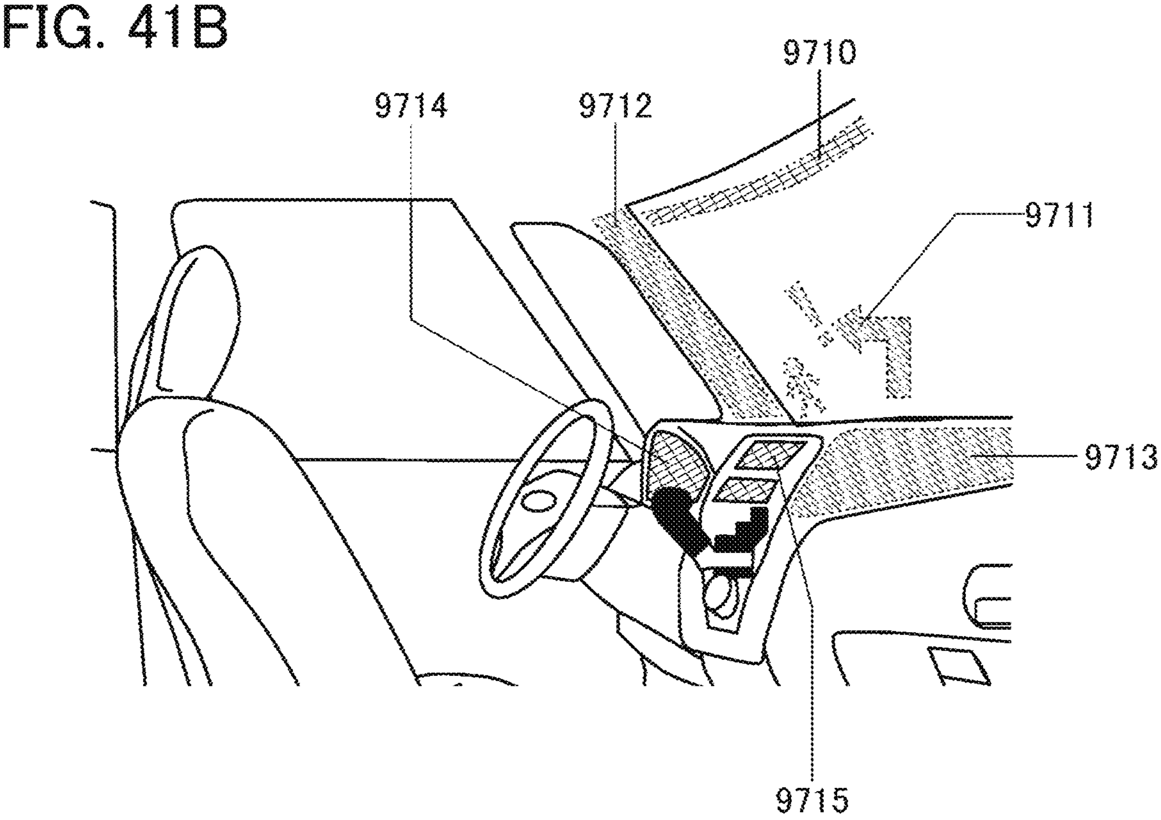

FIG. 41A is an external view of an automobile 9700. FIG. 41B illustrates a driver's seat of the automobile 9700. The automobile 9700 includes a car body 9701, wheels 9702, a dashboard 9703, lights 9704, and the like. The display apparatus of one embodiment of the present invention can be used in a display portion of the automobile 9700 or the like. For example, the display apparatus of one embodiment of the present invention can be provided for a display portion 9710 to a display portion 9715 illustrated in FIG. 41B.

The display portion 9710 and the display portion 9711 are display apparatuses provided in an automobile windshield. The display apparatus of one embodiment of the present invention can be what is called a see-through display apparatus, through which the opposite side can be seen, by using a light-transmitting conductive material for electrodes of the display apparatus. Such a see-through display apparatus does not hinder driver's vision during the driving of the automobile 9700. Thus, the display apparatus of one embodiment of the present invention can be provided in the windshield of the automobile 9700. Note that in the case where a transistor or the like for driving the display apparatus is provided in the display apparatus, for example, a transistor having a light-transmitting property, such as an organic transistor using an organic semiconductor material or a transistor using an oxide semiconductor, is preferably used as the transistor.

The display portion 9712 is a display apparatus provided on a pillar portion. For example, the display portion 9712 can compensate for the view hindered by the pillar by displaying an image taken by an imaging means provided on the car body 9701. The display portion 9713 is a display apparatus provided on a dashboard 9703. For example, the display portion 9713 can compensate for the view hindered by the dashboard 9703 by displaying an image taken by the imaging means provided on the car body 9701. That is, in the automobile 9700, an image taken by the imaging means provided on the car body 9701 is displayed on the display portion 9712 and the display portion 9713, which can compensate for blind areas and enhance safety. Display of an image that complements for a portion that cannot be seen makes it possible to confirm safety more naturally and comfortably.

Figure 42:
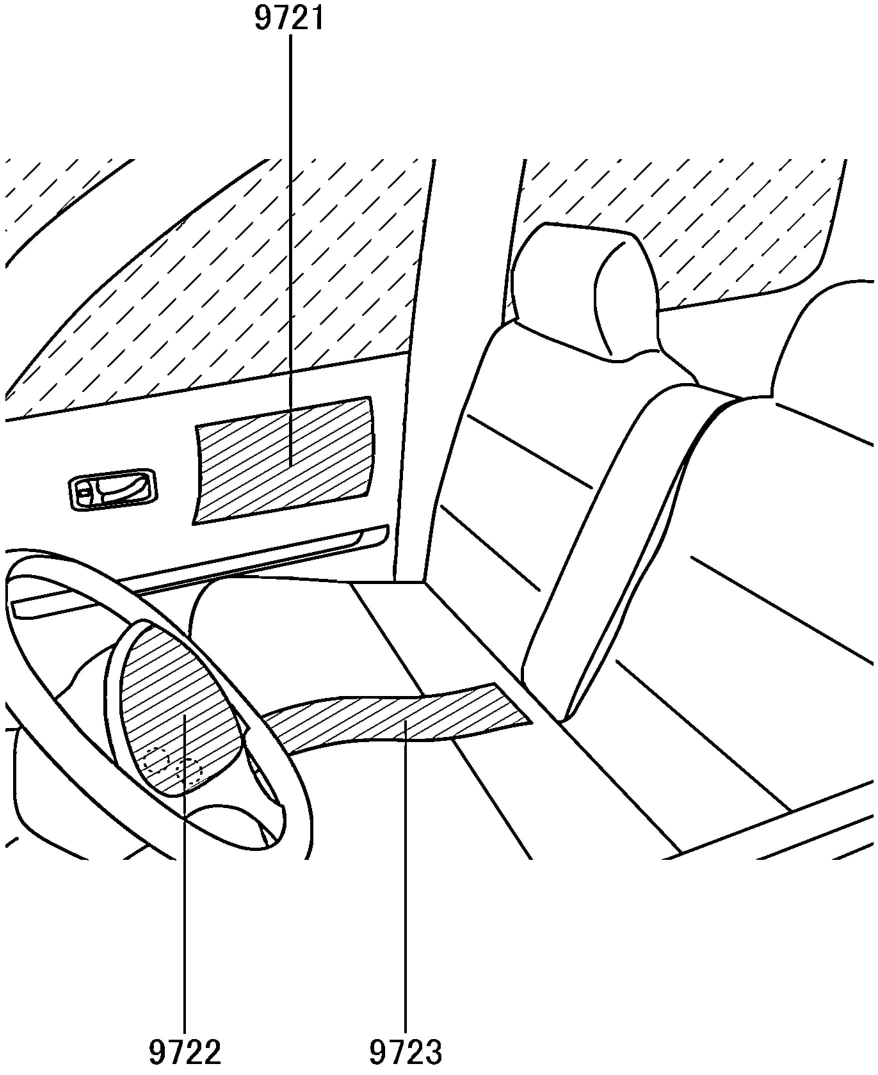
FIG. 42 is a diagram illustrating an example of an electronic device.

FIG. 42 illustrates the inside of an automobile 9700 in which a bench seat is used as a driver's seat and a front passenger's seat. A display portion 9721 is a display apparatus provided in a door portion. For example, the display portion 9721 can compensate for the view hindered by the door by displaying an image taken by an imaging means provided on the car body 9701. A display portion 9722 is a display apparatus provided in a steering wheel. A display portion 9723 is a display apparatus provided in the middle of a seating face of the bench seat.

The display portion 9714, the display portion 9715, and the display portion 9722 can provide a variety of kinds of information to a user by displaying navigation information, speed, the number of engine revolutions, a mileage, the remaining amount of fuel, a gearshift state, air-condition setting, or the like. The content, layout, and the like of the display on the display portions can be changed freely by a user as appropriate. The above information can also be displayed on one or more of the display portion 9710 to the display portion 9713, the display portion 9721, and the display portion 9723. One or more of the display portion 9710 to the display portion 9715 and the display portion 9721 to the display portion 9723 can also be used as lighting devices.

The structure described in this embodiment can be used in an appropriate combination with any of the structures described in the other embodiments and examples.

<Example>

In this example, an actually fabricated display apparatus is described. The display apparatus is provided with a high-resolution OLED display (also referred to as an organic EL display) with a resolution of 3207 ppi using oxide semiconductor FETs with a channel length of 200 nm. The display apparatus is suitably used for xR devices such as a VR device and an AR device, for example. The semiconductor device of one embodiment of the present invention is suitably used in the display apparatus described in this example.

In this example or the like, an OS transistor (a transistor including an oxide semiconductor in a semiconductor layer where a channel is formed) is referred to as an oxide semiconductor FET or an OSFET in some cases. A Si transistor (a transistor including silicon in a semiconductor layer where a channel is formed) is referred to as a SiFET in some cases.

In this example, the other embodiments can be appropriately referred to for the detailed description of the display apparatus, the pixel, the oxide semiconductor FET, and the like, for example. Thus, the description is sometimes omitted as appropriate in this example.

<Structure of Oxide Semiconductor FET>

Figure 44:
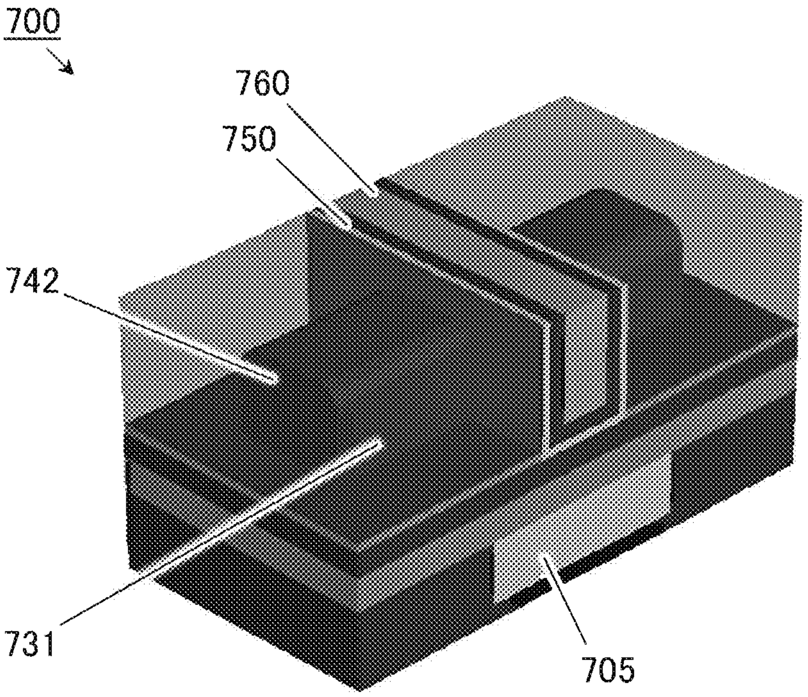
FIG. 44 is a schematic perspective view of the transistor.
Figure 45A:
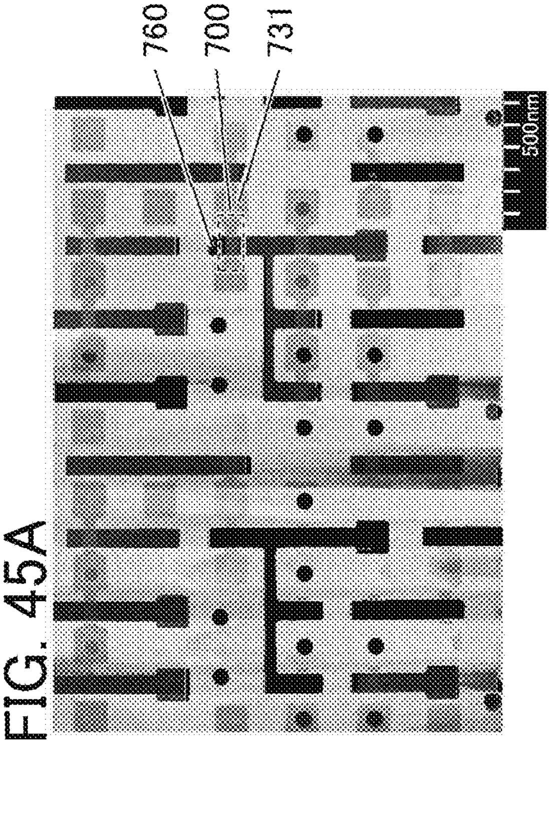
FIG. 45A to FIG. 45D are STEM images of the transistors and the periphery thereof.
Figure 45B:
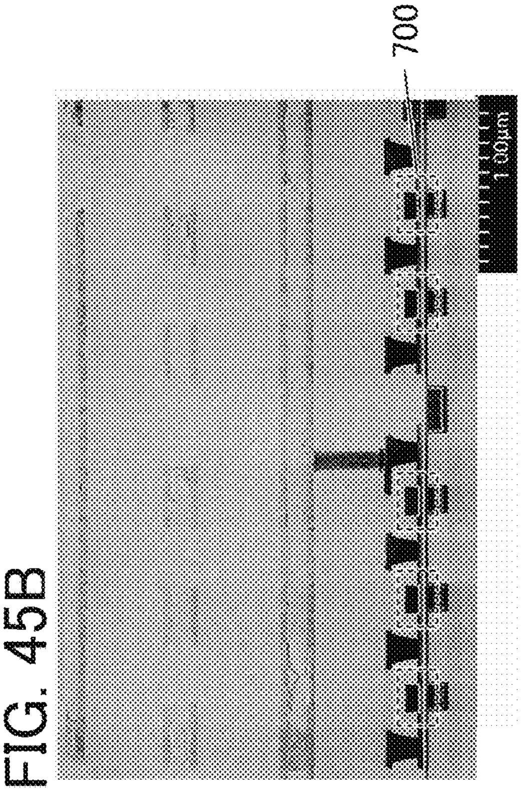
Figure 45C:
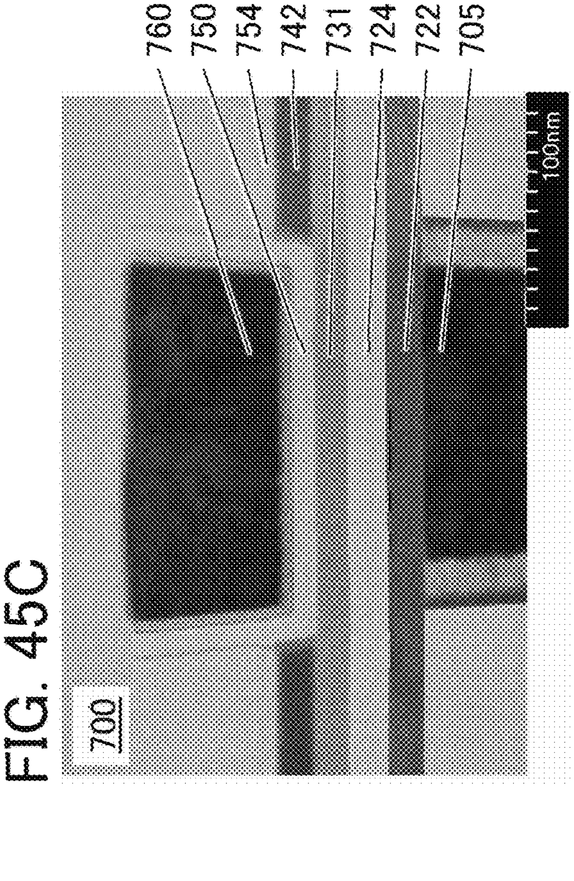
Figure 45D:
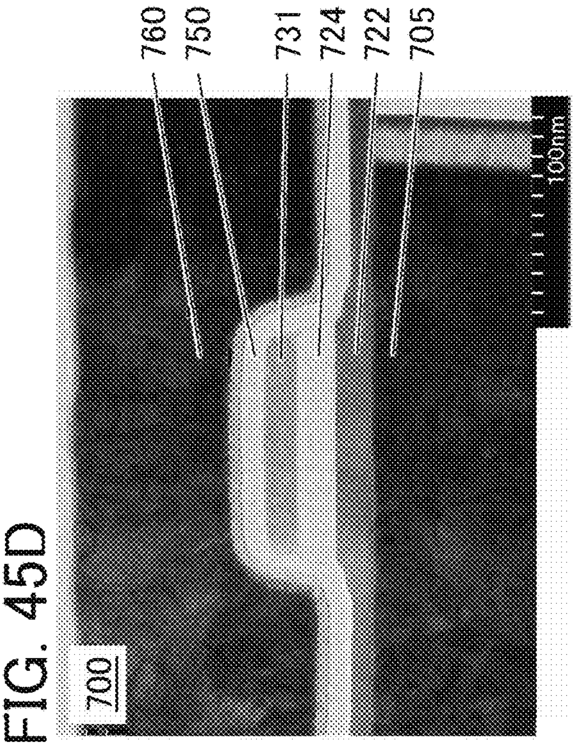

The oxide semiconductor FETs used in the fabricated display apparatus (OSFETs 700) are described. FIG. 43 is a process flow chart of the OSFET 700. FIG. 44 is a schematic perspective view of the OSFET 700. FIG. 45A to FIG. 45D are STEM (Scanning Transmission Electron Microscope) images of the OSFET 700 included in the pixel of the fabricated display apparatus and the periphery of the OSFET 700. FIG. 45A is a planar STEM image of the periphery of the OSFET 700. FIG. 45B and FIG. 45C are cross-sectional STEM images of the OSFET 700 in the channel length direction. FIG. 45D is a cross-sectional STEM image of the OSFET 700 in the channel width direction.

First, a conductor 705 was formed through a process P01 and a process P02 (corresponding to the conductor 505 in FIG. 37). The conductor 705 functions as a back gate electrode (BGE) of the OSFET 700. Next, an insulator 722 and an insulator 724 were formed through a process P03 (corresponding to the insulator 522 and the insulator 524 in FIG. 37). Next, a metal oxide 731 and a conductor 742 were formed through a process P04 (corresponding to the metal oxide 531 and the conductor 542 in FIG. 37). The metal oxide 731 functions as an active layer of the OSFET 700. Furthermore, the conductor 742 functions as a source and drain electrodes (S/D metal) of the OSFET 700. Next, an insulator 754 was formed through a process P05 (corresponding to the insulator 554 and the insulator 580 in FIG.

37). Next, an insulator 750 was formed through a process P06 and a process P07 (corresponding to the insulator 550 in FIG. 37). The insulator 750 functions as a gate insulating film (GI) of the OSFET 700. Next, a conductor 760 was formed through a process P08 (corresponding to the conductor 560 in FIG. 37). The conductor 760 functions as a gate electrode (TGE) of the OSFET 700. Next, a passivation film, an interlayer film, a via (also referred to as a contact in some cases), a wiring, and the like were formed through a process P09 (not illustrated).

IGZO having a CAAC structure (also referred to as CAAC-IGZO) was used as the active layer (the metal oxide 731) of the OSFET 700. In addition, tantalum nitride was used as the S/D metal (the conductor 742). Note that the OSFET 700 is of a self-aligned type in which a channel is formed at the same time as the TGE (the conductor 760). By the provision of the BGE (the conductor 705), the channel controllability is increased.

The fabricated display apparatus uses the oxide semiconductor for the back plane and has a structure in which a layer including an OSFET, a layer including a capacitor, two layers of lead wirings, a layer including a pixel electrode, and a layer including an OLED are stacked in order over a Si substrate (also expressed as the structure of OSFET\capacitor\two layers of lead wirings\pixel electrode\OLED).

The semiconductor device 100B of one embodiment of the present invention described in Embodiment 2 (see FIG. 16) was used in the pixels of the fabricated display apparatus. The pixel has a structure including seven oxide semiconductor FETs and three capacitors (also referred to as a 7Tr3C structure).

The OSFETs 700 included in the pixels of the fabricated display apparatus each have a channel length of 200 nm and a channel width of 130 nm. Furthermore, the OSFETs 700 each have a trigate structure in which a top surface and a side surface of the active layer (the metal oxide 731) are covered with the TGE (the conductor 760).

<Electrical Characteristics of Oxide Semiconductor FET>

Results of evaluation of electrical characteristics of the fabricated oxide semiconductor FET (the OSFET 700) will be described.

[Id-Vg Characteristics]

Figure 46:
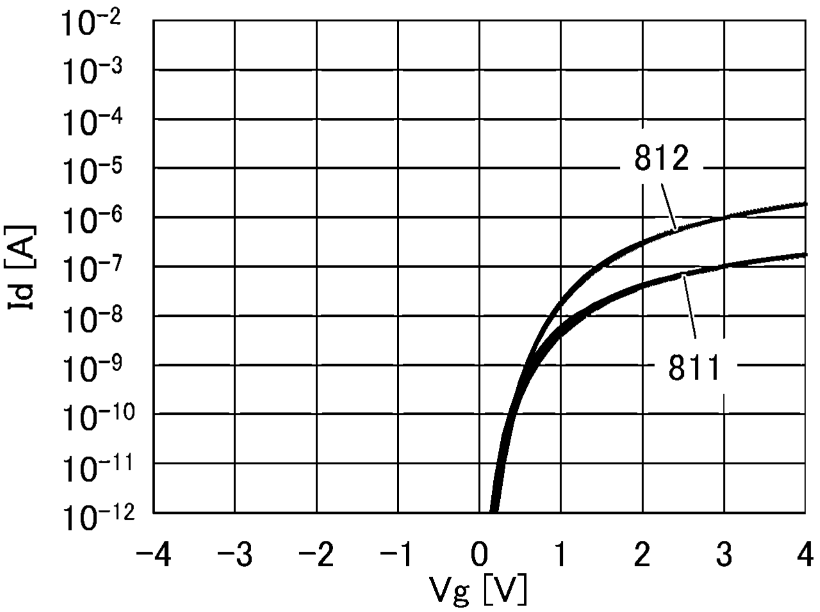
FIG. 46 is a graph showing evaluation results of Id-Vg characteristics of the transistor.

FIG. 46 is a graph showing results of evaluation of Id-Vg characteristics of the OSFET 700. The evaluated OSFET 700 has a channel length of 200 nm and a channel width of 130 nm. The evaluation of Id-Vg characteristics was performed under conditions where the potential applied to the back gate of the OSFET 700 was set at the same potential as the potential applied to the gate. In FIG. 46, the horizontal axis shows the voltage between the source and the gate (also referred to as the voltage Vg), and the vertical axis shows the current flowing between the source and the drain (also referred to as the current Id). In FIG. 46, the current Id in a voltage Vg range from −4 V to 4 V is shown. FIG. 46 shows Id-Vg characteristics of the cases where the voltage between the source and the drain (also referred to as the voltage Vd) is 0.1 V and 1.2 V. A curve 811 represents Id-Vg characteristics of the case where the voltage Vd is 0.1 V. A curve 812 represents Id-Vg characteristics of the case where the voltage Vd is 1.2 V.

The Id-Vg characteristics in FIG. 46 shows that the OSFET 700 is of a normally-off type and has a sufficient on/off ratio. The S value of the OSFET 700 was 101 mV/decade. The off-state current of the OSFET 700 was low enough to reach the lower measurement limit.

In the operation of the display apparatus, a high voltage is applied to the OSFET 700 included in the pixel. Therefore, the OSFET 700 was designed to have an equivalent oxide thickness (EOT) of the GI (the insulator 750) of 11 nm.

[Vth Variation]

Figure 47:
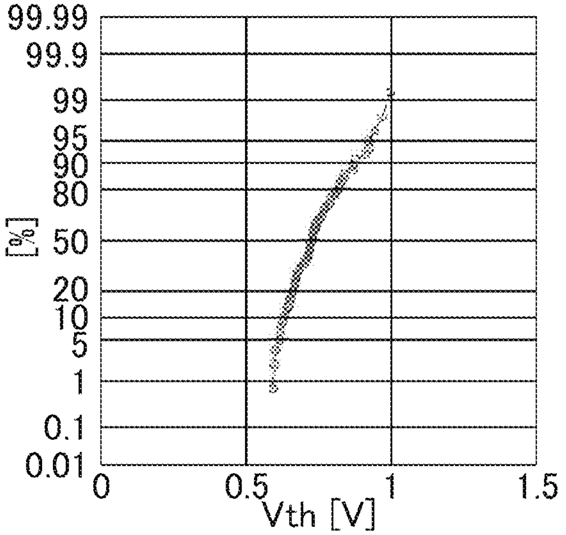
FIG. 47 is a graph showing evaluation results of Vth variation of the transistor.

FIG. 47 is an ogive showing results of evaluation of Vth variations of the OSFETs 700. In FIG. 47, Vth distribution of 72 OSFETs 700 is shown. The structures (e.g., channel length and channel width) of the evaluated OSFETs 700 are each similar to that of the OSFET 700 whose Id-Vg characteristics were evaluated in FIG. 46. The evaluation of Vth variations was performed under conditions where the potential applied to the back gate of the OSFET 700 was set at the same potential as the potential applied to the gate. In this example, Vth was defined as the voltage Vg at the current $Id=6\times10^{-8}$ A in the Id-Vg characteristics shown in FIG. 46. In FIG. 47, the horizontal axis shows Vth, and the vertical axis shows the cumulative frequency.

From the ogive shown in FIG. 47, the standard deviation σ that is an index of the Vth variation was 93 mV.

[Id-Vd Characteristics]

Figure 48A:
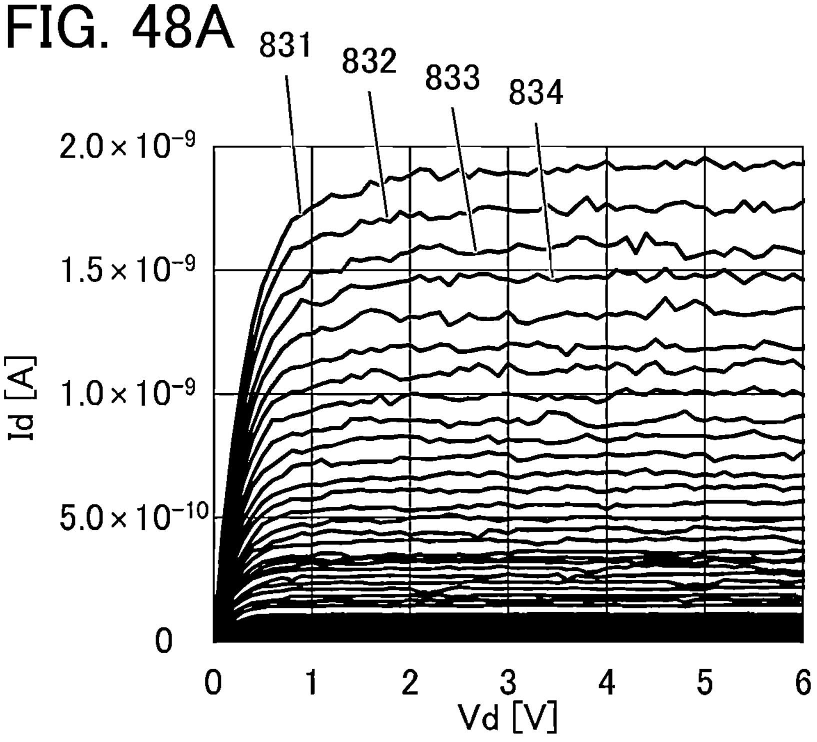
FIG. 48A and FIG. 48B are graphs showing evaluation results of Id-Vd characteristics of transistors.
Figure 48B:
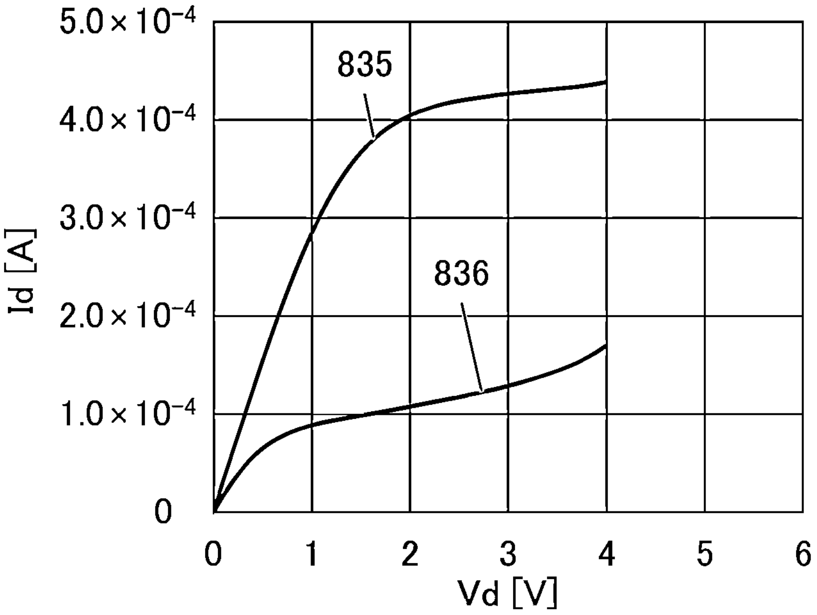

FIG. 48A is a graph showing results of evaluation of Id-Vd characteristics of the OSFET 700. The structure of the evaluated OSFET 700 has a triple gate structure in which three FETs each having a structure similar to that of the OSFET 700 whose Id-Vg characteristics were evaluated in FIG. 46 are connected in series as illustrated in FIG. 6B. The evaluation of the Id-Vd characteristics was performed under conditions where the potential applied to the back gate of the OSFET 700 was set at the same potential as the potential applied to the source. In FIG. 48A, the horizontal axis shows the voltage Vd, and the vertical axis shows the current Id. In FIG. 48A, the current Id in a voltage Vd range from 0 V to 6 V is shown. FIG. 48A shows the Id-Vd characteristics evaluated at various voltages Vg. A curve 831 represents the Id-Vd characteristics of the case where the voltage Vg is 2.000 V. A curve 832 represents the Id-Vd characteristics of the case where the voltage Vg is 1.975 V. A curve 833 represents the Id-Vd characteristics of the case where the voltage Vg is 1.950 V. A curve 834 represents the Id-Vd characteristics of the case where the voltage Vg is 1.925 V. The other Id-Vd characteristics measured at voltage Vg intervals of 0.025 V are also shown. FIG. 48B shows Id-Vd characteristics of a SiFET evaluated for reference. The evaluated SiFET has a channel length of 230 nm and a channel width of 1600 nm. A curve 835 represents the Id-Vd characteristics of the case where the voltage Vg is 3.3 V. A curve 836 represents the Id-Vd characteristics of the case where the voltage Vg is 1.8 V.

According to the Id-Vd characteristics shown in FIG. 48A and FIG. 48B, the OSFET exhibited enough saturation characteristics at any of the voltages Vg compared with the SiFET. Moreover, the Id-Vd characteristics shown in FIG. 48A has revealed that the current Id of the OSFET fluctuates in accordance with small fluctuations in the voltage Vg and fine control of the current at the time of OLED light emission is possible.

[Vd Withstand Voltage]

Figure 49:
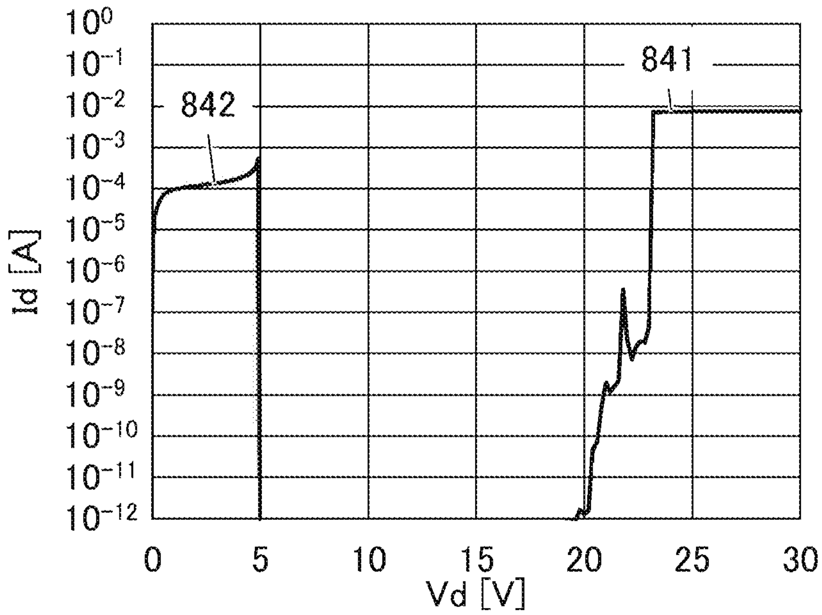
FIG. 49 is a graph showing evaluation results of Vd withstand voltage of the transistor.

FIG. 49 is a graph showing results of evaluation of the Vd withstand voltage of the OSFET 700. The structure of the evaluated OSFET 700 is similar to that of the OSFET 700 whose Id-Vg characteristics were evaluated in FIG. 46. The evaluation of the Vd withstand voltage was performed under conditions where the potential applied to the back gate of the OSFET 700 was set at the same potential as the potential applied to the gate. In FIG. 49, the horizontal axis shows the voltage Vd, and the vertical axis shows the current Id. FIG. 49 shows the current Id at the time when the voltage Vg is 0 V in a voltage Vd range from 0 V to 30 V. A curve 841 shows OSFET characteristics. A curve 842 shows SiFET characteristics evaluated for reference. The structure of the evaluated SiFET is similar to that of the SiFET whose Id-Vd characteristics were evaluated in FIG. 48B.

In the curve 841, the value of the voltage Vd at which the current Id abruptly increases is the Vd withstand voltage. The Vd withstand voltage of the OSFET 700 was approximately 20 V, which was higher than that of the SiFET.

[Off-State Current]

Figure 50:
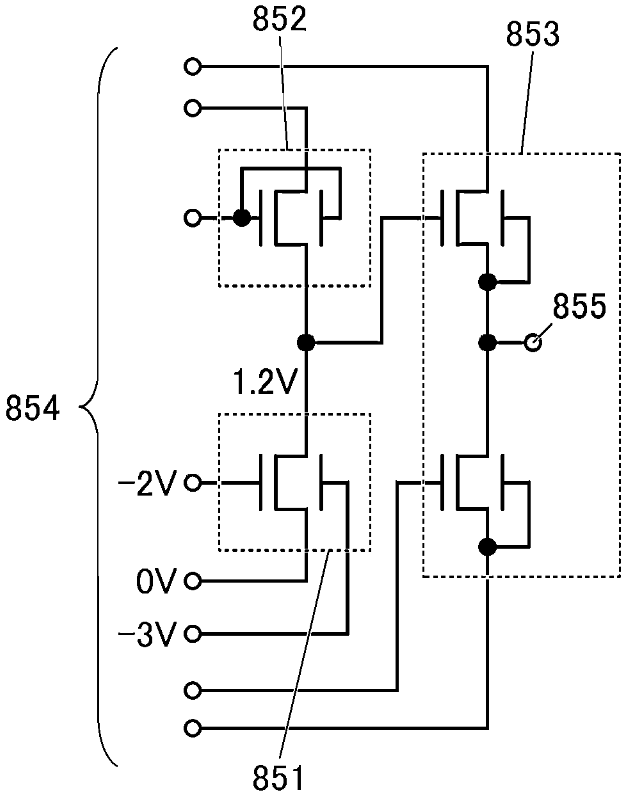
FIG. 50 is a diagram illustrating a method for evaluating the off-state current of the transistor.

As is seen from the Id-Vg characteristics shown in FIG. 46, the off-state current of the oxide semiconductor FET is too low to measure by a normal measurement method. Therefore, a circuit illustrated in FIG. 50 was used to quantitatively evaluate the off-state current of the oxide semiconductor FET. In FIG. 50, an oxide semiconductor FET that is an evaluation target is connected to a circuit portion 851. The oxide semiconductor FET used for the off-state current evaluation includes parallel connected 20,000 OSFETs 700 each having a channel length of 200 nm and a channel width of 130 nm. Thus, the oxide semiconductor FET has a pseudo channel width of 2.6 mm. In a circuit portion 852, the circuit is controlled to evaluate the off-state current. In a circuit portion 853, a signal for off-state current evaluation is output to an output terminal 855. In an input terminal group 854, a signal that controls the circuit to evaluate the off-state current is input. The potentials as shown in FIG. 50 were applied to terminals of the circuit portion 851 to evaluate the off-state current.

Figure 51:
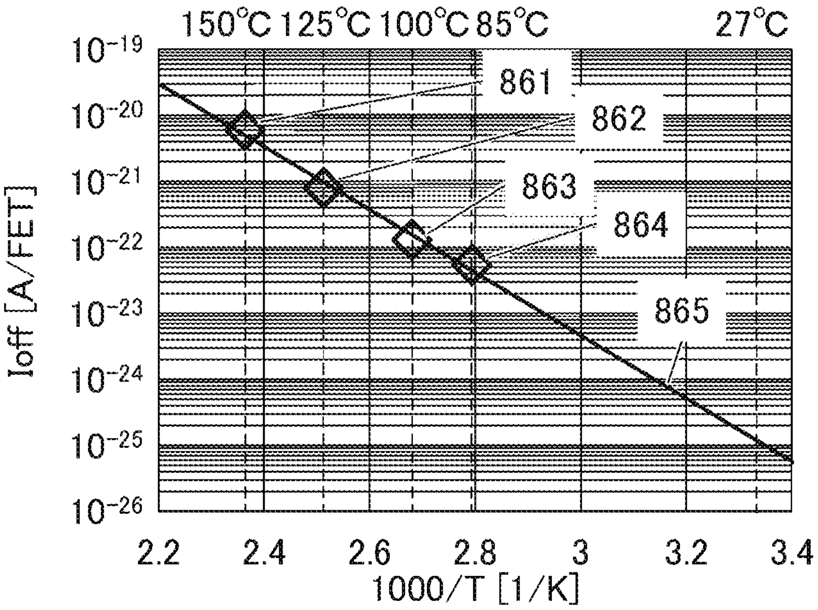
FIG. 51 is a graph showing evaluation results of the off-state current of the transistor.

FIG. 51 is a graph showing results of evaluation of the off-state current of the oxide semiconductor FET. In FIG. 51, the horizontal axis shows the reciprocal of the temperature T, and the vertical axis shows the off-state current (also referred to as the current Ioff). Note that the off-state current on the vertical axis is the value obtained by conversion to the channel width of the OSFET 700 of 130 nm. The plots of a point 861 to a point 864 show the results of measurement of the off-state current at temperatures of 150° C., 125° C., 100° C., and 85° C., respectively. A straight line 865 is a regression straight line obtained with the point 861 to the point 864. The off-state current at room temperature of 27° C. expected from the straight line 865 is lower than $1\times10^{-24}$ A. This shows the off-state current of the oxide semiconductor FET has an extremely low value.

<Display Result of Display Apparatus>

The display apparatus fabricated in this example includes the high-resolution OLED display (a display 871) with a resolution of 3207 ppi. Table 1 shows specifications of the display 871. As the transistors included in the pixels and the gate driver of the display 871, the oxide semiconductor FETs (the OSFETs 700) were used.

TABLE 1

| | Specifications |
|---|---|
| Display area | 30.41 mm (H) × 22.81 mm (V) (1.50 inch) |
| Number of effective pixels | 3840 (H) × RGB × 2880 (V) |
| Pixel size | 7.92 μm (H) × 7.92 μm (V) |
| Resolution | 3207 ppi |
| Coloring method | RGB SBS pattering in OLED |
| Aperture ratio | 60% |
| Frame frequency | ≤120 Hz |
| Video signal format | Analog line sequential video signal format |
| Source driver | External IC |
| Gate driver | Incorporated |

Figure 52:
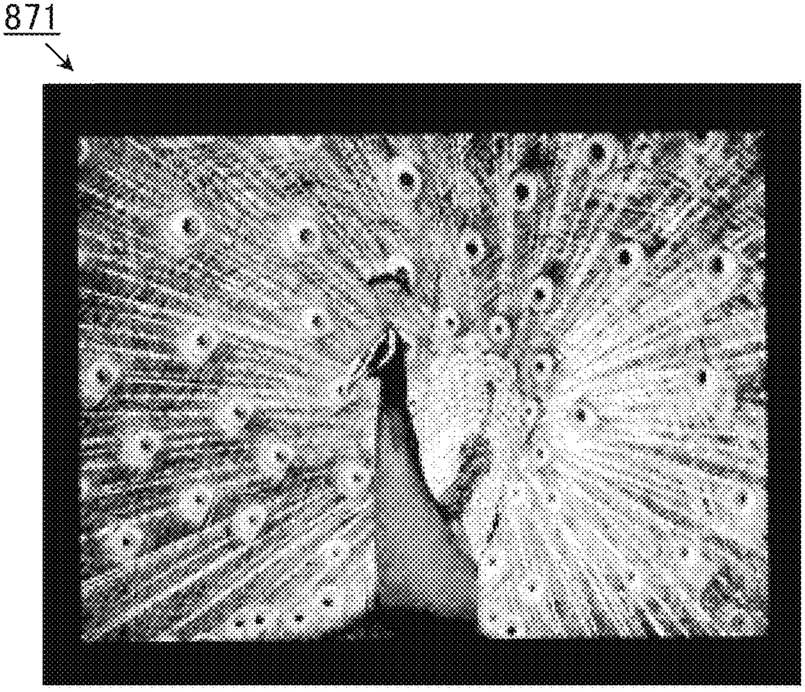
FIG. 52 is an image (evaluation results) of a display apparatus.

FIG. 52 shows display results of the display 871. As shown in FIG. 52, a dense and clear image was obtained. Furthermore, a realistic moving image as well as a still image was obtained.

Figure 53:
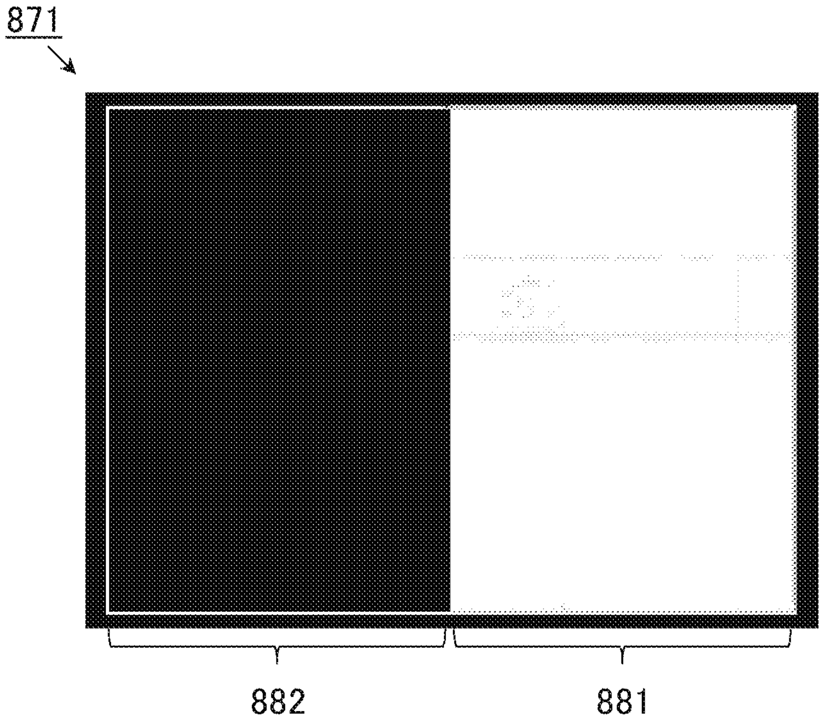
FIG. 53 is an image (evaluation results) of the display apparatus.

FIG. 53 shows the display results of white display on only the right side (a display surface 881) of the display 871. The luminance of a non-light-emitting region (black area) on the left half side (a display surface 882) of the display 871 was 0.002 cd/m$^2$, and the luminance of a light-emitting region (white area) on the right half side (the display surface 881) of the display 871 was 5062 cd/m$^2$. In other words, the contrast ratio of the display 871 was black:white=1:2,531,000. Owing to the high contrast ratio of the display 871, the black area looks deep black; the display made full use of the OLED's characteristics.

The OLEDs included in the fabricated display apparatus were formed by an SBS method in which red (R), green (G), and blue (B) OLEDs were separately patterned. The OLEDs formed by an SBS method is referred to as an SBS structure in some cases. When the OELDs are formed by an SBS method, the OLEDs are not connected between pixels, reducing power consumption of the display apparatus.

The OLEDs included in the fabricated display apparatus each have an MML (metal maskless) structure that is formed without using a metal mask. The MML structure was formed by a photolithography method. Thus, the display 871 had as high an aperture ratio as 60%.

Figure 54A:
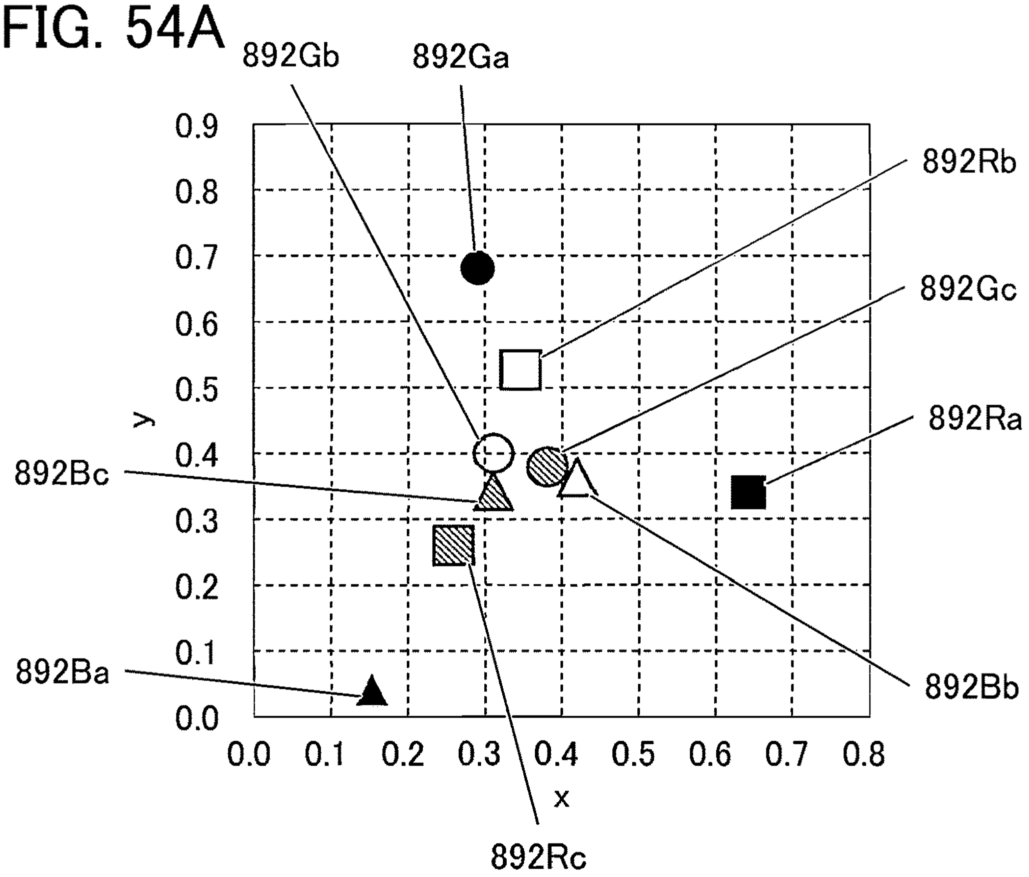
FIG. 54A and FIG. 54B are graphs showing evaluation results of chromaticity of display apparatuses.
Figure 54B:
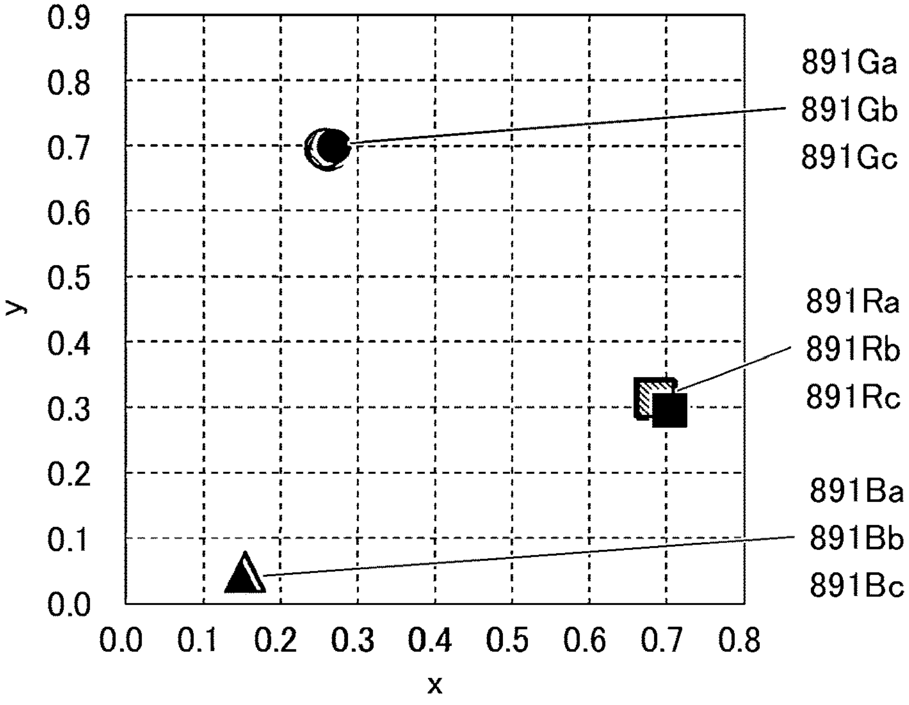

FIG. 54 is chromaticity diagrams showing chromaticities of R, G, and B when fabricated display apparatuses were seen from the front or an oblique direction. FIG. 54A shows the chromaticities of the display apparatus fabricated using white OLEDs and color filters. The plots of a point 892Ra, a point 892Ga, and a point 892Ba show the chromaticities of R, G, and B, respectively, when the display apparatus is seen from the front. The plots of a point 892Rb, a point 892Gb, and a point 82Bb show the chromaticities of R, G, and B, respectively, when the display apparatus is seen from a 60° oblique direction. The plots of a point 892Rc, a point 892Gc, and a point 82Bc show the chromaticities of R, G, and B, respectively, when the display apparatus is seen from a 60° oblique direction opposite to the above-mentioned direction. FIG. 54B shows the chromaticities of the display apparatus fabricated using OLEDs with an SBS method. The plots of a point 891Ra, a point 891Ga, and a point 891Ba show the chromaticities of R, G, and B, respectively, when the display apparatus is seen from the front. The plots of a point 891Rb, a point 891Gb, and a point 891Bb show the chromaticities of R, G, and B, respectively, when the display apparatus is seen from a 60° oblique direction. The plots of a point 891Rc, a point 891Gc, and a point 891Bc show the chromaticities of R, G, and B, respectively, when the display apparatus is seen from a 60° oblique direction opposite to the above-mentioned direction. The use of the OLEDs with an SBS method dramatically improved the viewing-angle-dependent chromaticity change compared with the use of the white OLEDs.

According to the above-described display results, display quality is increased owing to the display apparatus using the semiconductor device of one embodiment of the present invention.

Note that a thin client, foveated rendering, or the like may be applied to an electronic device (e.g., an xR device such as a VR device or an AR device) using the display apparatus described in this example or the like. The application of the thin client, foveated rendering, or the like reduces power consumption of the electronic device using the display apparatus described in this example or the like.

Table 2 shows the results, which are the number of masks, the off-state current, and Vd withstand voltage, of the oxide semiconductor FET included in the fabricated display apparatus in comparison with those of the SiFET.

TABLE 2

| | SiFET | OSFET |
|---|---|---|
| Number of masks | Large (doping needed) | Small (no doping needed) |
| Conductance [mS] | >40 | 1 |
| Off-state current [A] | $2.8 \times 10^{-12}$ | $<1 \times 10^{-24}$ |
| Drain breakdown voltage [V] | 5 | 20 |

The OSFET is fabricated with a smaller number of masks than that of the SiFET since a doping step with an impurity is unnecessary for the OSFET. Therefore, owing to the display apparatus described in this example or the like, the manufacturing cost is reduced. Furthermore, the off-state current of the OSFET is too low to measure by normal electric measurement and is much lower than that of the SiFET. The Vd withstand voltage of the OSFET has a larger value than the SiFET. Thus, owing to the display apparatus described in this example or the like, display quality is increased.

The display apparatus described in this example or the like may, for example, have a structure in which the SiFET and the OSFET are stacked by piling up a plurality of layers as illustrated in FIG. 32B. For example, functional circuits (e.g., a peripheral driver circuit, a CPU, a GPU, and a memory circuit) of the display apparatus may be formed using the SiFETs and the pixels of the display apparatus may be formed using the OSFETs. By stacking the OSFET layer over the SiFET layer, miniaturization of the display apparatus is achieved.

REFERENCE NUMERALS

51A: pixel circuit, 51B: pixel circuit, 61: light-emitting element, 100A: semiconductor device, 100B: semiconductor device, 101: wiring, 102: wiring, 103: wiring, 104: wiring, M1: transistor, M2: transistor, M3: transistor, M4: transistor, M5: transistor, M6: transistor, M7: transistor, C1: capacitor, C2: capacitor, C3: capacitor, DL: wiring, GLa: wiring, GLb: wiring, GLc: wiring, GLd: wiring, ND1: node, ND2: node, ND3: node, ND4: node, V0: potential, V1: potential, Va: potential, Vc: potential, Va1: potential, Va2: potential, T11: period, T12: period, T13: period, T14: period, T15: period, T16: period, T21: period, T22: period, T23: period, T24: period, T25: period, T26: period, F11: frame, F12_1: frame, F12_2: frame, F14_1: frame, F14_2: frame, F21: frame, F22_1: frame, F22_2: frame, F24_1: frame, F24_2: frame, S01: step, S02: step, S03: step, S04: step, S05: step

The invention claimed is:

1. A semiconductor device comprising a pixel, the pixel comprising:

first to seventh transistors; and a display element, wherein one of a source and a drain of the first transistor is electrically connected to a gate of the second transistor, and one of a source and a drain of the third transistor, wherein one of a source and a drain of the second transistor is electrically connected to the other of the source and the drain of the third transistor, one of a source and a drain of the fifth transistor, and one of a source and a drain of the sixth transistor, wherein a back gate of the second transistor is electrically connected to one of a source and a drain of the fourth transistor, wherein the other of the source and the drain of the fifth transistor is electrically connected to the display element, wherein a gate of the fifth transistor is electrically connected to one of a source and a drain of the seventh transistor, and wherein a gate of the sixth transistor and a gate of the seventh transistor are electrically connected to a first wiring.

2. The semiconductor device according to claim 1, wherein a gate of the third transistor and a gate of the fourth transistor are electrically connected to a second wiring.

3. The semiconductor device according to claim 1, wherein each of the first to seventh transistors comprises a metal oxide in an oxide semiconductor layer.

4. The semiconductor device according to claim 3, wherein the metal oxide comprises indium.

5. The semiconductor device according to claim 1, wherein the display element comprises an organic EL element having a tandem structure.

6. A semiconductor device comprising a pixel, the pixel comprising:

first to seventh transistors;

first to third capacitors; and a display element, wherein one of a source and a drain of the first transistor is electrically connected to a gate of the second transistor, one of a source and a drain of the third transistor, and one electrode of the first capacitor, wherein one of a source and a drain of the second transistor is electrically connected to the other of the source and the drain of the third transistor, one of a source and a drain of the fifth transistor, one of a source and a drain of the sixth transistor, the other electrode of the first capacitor, and one electrode of the second capacitor, wherein the other of the source and the drain of the fifth transistor is electrically connected to the display element and one electrode of the third capacitor, and wherein a gate of the fifth transistor is electrically connected to one of a source and a drain of the seventh transistor and the other electrode of the third capacitor.

7. The semiconductor device according to claim 6, wherein a gate of the sixth transistor and a gate of the seventh electrically connected to a first wiring.

8. The semiconductor device according to claim 6, wherein a gate of the third transistor and a gate of the fourth transistor are electrically connected to a second wiring.

9. The semiconductor device according to claim 6, wherein each of the first to seventh transistors comprises a metal oxide in an oxide semiconductor layer.

10. The semiconductor device according to claim 9, wherein the metal oxide comprises indium.

11. The semiconductor device according to claim 6, wherein the display element comprises an organic EL element having a tandem structure.

12. A semiconductor device comprising a pixel, the pixel comprising:

first to seventh transistors;

first to third capacitors; and a display element, wherein one of a source and a drain of the first transistor is electrically connected to a gate of the second transistor, one of a source and a drain of the third transistor, and one electrode of the first capacitor, wherein one of a source and a drain of the second transistor is electrically connected to the other of the source and the drain of the third transistor, one of a source and a drain of the fifth transistor, one of a source and a drain of the sixth transistor, the other electrode of the first capacitor, and one electrode of the second capacitor, wherein a back gate of the second transistor is electrically connected to one of a source and a drain of the fourth transistor, and the other electrode of the second capacitor, wherein the other of the source and the drain of the fifth transistor is electrically connected to the display element and one electrode of the third capacitor, and wherein a gate of the fifth transistor is electrically connected to one of a source and a drain of the seventh transistor and the other electrode of the third capacitor.

13. The semiconductor device according to claim 12, wherein a gate of the sixth transistor and a gate of the seventh are electrically connected to a first wiring.

14. The semiconductor device according to claim 12, wherein a gate of the third transistor and a gate of the fourth transistor are electrically connected to a second wiring.

15. The semiconductor device according to claim 12, wherein each of the first to seventh transistors comprises a metal oxide in an oxide semiconductor layer.

16. The semiconductor device according to claim 15, wherein the metal oxide comprises indium.

17. The semiconductor device according to claim 12, wherein the display element comprises an organic EL element having a tandem structure.

* * * * *